(12) United States Patent
Sturcken et al.

(10) Patent No.: US 10,893,609 B2
(45) Date of Patent: Jan. 12, 2021

(54) INTEGRATED CIRCUIT WITH LAMINATED MAGNETIC CORE INDUCTOR INCLUDING A FERROMAGNETIC ALLOY

(71) Applicant: Ferric Inc., New York, NY (US)

(72) Inventors: Noah Sturcken, New York, NY (US); Ryan Davies, New York, NY (US); Michael Lekas, New York, NY (US)

(73) Assignee: Ferric Inc., New York, NY (US)

( * ) Notice: Subject to any disclaimer, the term of this patent is extended or adjusted under 35 U.S.C. 154(b) by 346 days.

(21) Appl. No.: 16/007,158

(22) Filed: Jun. 13, 2018

(65) Prior Publication Data

US 2018/0295725 A1    Oct. 11, 2018

Related U.S. Application Data

(60) Continuation-in-part of application No. 14/991,111, filed on Jan. 8, 2016, now Pat. No. 10,028,385, which (Continued)

(51) Int. Cl.
*H01F 27/28* (2006.01)
*H05K 1/18* (2006.01)
(Continued)

(52) U.S. Cl.
CPC ......... *H05K 1/181* (2013.01); *H01F 17/0033* (2013.01); *H01F 27/24* (2013.01);
(Continued)

(58) Field of Classification Search
CPC ...... H01F 27/2804; H01F 27/24; H01F 27/28; H01F 5/00
(Continued)

(56) References Cited

U.S. PATENT DOCUMENTS

| 1,553,983 A | 9/1925 | Casper |
| 2,931,966 A * | 4/1960 | Rockey .................. H01F 27/40 363/140 |

(Continued)

FOREIGN PATENT DOCUMENTS

| FR | 2817622 A1 | 6/2002 |
| JP | S5821810 A | 2/1983 |

(Continued)

OTHER PUBLICATIONS

N. Sturcken et al., "Design of Coupled Power Inductors with Crossed Anisotropy Magnetic Core for Integrated Power Conversion", IEEE-APEC 2012, p. 417-423, doi: 10.1109/APEC.2012.6165853.

(Continued)

*Primary Examiner* — Tszfung J Chan
(74) *Attorney, Agent, or Firm* — Intrinsic Law Corp.

(57) ABSTRACT

A structure includes a semiconductor integrated circuit comprising a multilevel wiring network and an inductor integrated into the multilevel wiring network. The inductor includes a planar laminated magnetic core and a conductive winding that turns around in a generally spiral manner on the outside of the planar laminated magnetic core. The planar laminated magnetic core includes an alternating sequence of a magnetic layer and a non-magnetic layer. The magnetic layer comprises a ferromagnetic alloy having an iron composition of about 10 atomic percent to about 90 atomic percent.

22 Claims, 25 Drawing Sheets

Related U.S. Application Data is a continuation of application No. 14/517,370, filed on Oct. 17, 2014, now Pat. No. 9,357,651, which is a division of application No. 13/609,391, filed on Sep. 11, 2012, now Pat. No. 9,844,141.

(51) Int. Cl.

| | | |
|---|---|---|
| *H01F 41/04* | (2006.01) | |
| *H01F 41/02* | (2006.01) | |
| *H01F 27/24* | (2006.01) | |
| *H05K 1/02* | (2006.01) | |
| *H05K 1/11* | (2006.01) | |
| *H01F 17/00* | (2006.01) | |
| *H01F 41/32* | (2006.01) | |
| *H05K 1/16* | (2006.01) | |
| *H05K 1/03* | (2006.01) | |

(52) U.S. Cl.
CPC ......... *H01F 27/2804* (2013.01); *H01F 41/02* (2013.01); *H01F 41/041* (2013.01); *H01F 41/046* (2013.01); *H01F 41/32* (2013.01); *H05K 1/0298* (2013.01); *H05K 1/115* (2013.01); *H01F 2017/0066* (2013.01); *H05K 1/0233* (2013.01); *H05K 1/0306* (2013.01); *H05K 1/165* (2013.01); *H05K 2201/086* (2013.01); *H05K 2201/0929* (2013.01); *H05K 2201/1003* (2013.01); *Y02P 70/50* (2015.11); *Y10T 29/4913* (2015.01)

(58) Field of Classification Search
USPC .................. 336/200, 232; 257/531
See application file for complete search history.

(56) References Cited

U.S. PATENT DOCUMENTS

| | | | |
|---|---|---|---|
| 3,110,613 A * | 11/1963 | Bean .................. | H01F 10/10 336/234 |
| 3,573,760 A | 4/1971 | Chang et al. | |
| 3,614,554 A | 10/1971 | Shield et al. | |
| 4,025,379 A | 5/1977 | Whetstone | |
| 4,103,315 A | 7/1978 | Hempstead et al. | |
| 4,236,946 A | 12/1980 | Aboaf et al. | |
| 5,070,317 A * | 12/1991 | Bhagat .................. | B81B 7/0077 257/531 |
| 5,079,534 A | 1/1992 | Steingroever et al. | |
| 5,225,971 A * | 7/1993 | Spreen .................. | H01F 30/10 336/184 |
| 5,319,343 A | 6/1994 | Jeffries | |
| 5,583,474 A | 12/1996 | Mizoguchi | |
| 5,635,892 A | 6/1997 | Ashby | |
| 5,831,431 A | 11/1998 | Gottfried-Gottfried et al. | |
| 5,912,553 A | 6/1999 | Mengelkoch | |
| 6,118,351 A | 9/2000 | Kossives et al. | |
| 6,362,986 B1 | 3/2002 | Schultz | |
| 6,542,060 B2 | 4/2003 | Fedeli | |
| 6,542,379 B1 | 4/2003 | Lauffer | |
| 6,856,226 B2 | 2/2005 | Gardner | |
| 6,940,384 B2 | 9/2005 | Hooey et al. | |
| 7,230,408 B1 | 6/2007 | Vinn et al. | |
| 7,554,399 B1 | 6/2009 | Gaboriau et al. | |
| 7,636,242 B2 | 12/2009 | Hazucha | |
| 7,719,084 B2 | 5/2010 | Gardner | |
| 7,867,787 B2 * | 1/2011 | Gardner .............. | H01L 23/5227 257/E21.22 |
| 7,868,431 B2 * | 1/2011 | Feng .................. | H01F 17/0033 257/673 |
| 7,875,955 B1 | 1/2011 | Hopper et al. | |
| 8,108,984 B2 | 2/2012 | Gardner et al. | |
| 8,288,277 B2 * | 10/2012 | Takahashi .......... | H05K 3/0011 438/660 |
| 8,432,144 B2 | 4/2013 | Notani | |
| 8,558,344 B2 | 10/2013 | Chen | |
| 2002/0060621 A1 | 5/2002 | Duffy et al. | |
| 2002/0136929 A1 | 9/2002 | Oikawa et al. | |
| 2003/0005569 A1 | 1/2003 | Hiatt et al. | |
| 2003/0070282 A1 * | 4/2003 | Hiatt .................. | H01F 41/34 29/602.1 |
| 2003/0160677 A1 * | 8/2003 | Fujiwara .............. | H01F 41/0246 336/229 |
| 2004/0009614 A1 | 1/2004 | Ahn et al. | |
| 2004/0135661 A1 | 7/2004 | Haugs et al. | |
| 2005/0088269 A1 | 4/2005 | Hatano et al. | |
| 2005/0156704 A1 * | 7/2005 | Gardner .............. | H01F 10/265 336/232 |
| 2006/0197510 A1 | 9/2006 | Chandrasekaran | |
| 2006/0263727 A1 | 11/2006 | Lee et al. | |
| 2006/0273418 A1 | 12/2006 | Chung et al. | |
| 2007/0037414 A1 | 2/2007 | Yamauchi et al. | |
| 2007/0290362 A1 * | 12/2007 | Hsu .................... | H01L 23/645 257/774 |
| 2008/0003699 A1 * | 1/2008 | Gardner .............. | H01L 28/10 438/3 |
| 2008/0023791 A1 * | 1/2008 | Muthukumar ........ | H01F 41/046 257/531 |
| 2008/0172861 A1 | 7/2008 | Holmes | |
| 2008/0316647 A1 | 12/2008 | Joisten | |
| 2009/0007418 A1 | 1/2009 | Edo et al. | |
| 2009/0068762 A1 | 3/2009 | Takahashi et al. | |
| 2009/0128274 A1 * | 5/2009 | Park .................. | H01F 17/04 336/82 |
| 2009/0175014 A1 | 7/2009 | Zeng et al. | |
| 2009/0188104 A1 | 7/2009 | Ching et al. | |
| 2011/0208019 A1 | 8/2011 | Sato et al. | |
| 2011/0279214 A1 | 11/2011 | Lee et al. | |
| 2012/0154966 A1 | 6/2012 | Wolfus et al. | |
| 2013/0027170 A1 * | 1/2013 | Chen .................. | H02M 3/335 336/200 |
| 2013/0056847 A1 * | 3/2013 | Chen .................. | H01F 17/0013 257/531 |
| 2013/0099334 A1 | 4/2013 | Mohan | |
| 2013/0099762 A1 | 4/2013 | Terrovitis | |
| 2013/0234821 A1 | 9/2013 | Shim | |
| 2014/0027879 A1 | 1/2014 | Weyers et al. | |
| 2014/9927879 | 1/2014 | Weyers et al. | |
| 2014/0062646 A1 | 3/2014 | Morrissey et al. | |
| 2014/0068932 A1 | 3/2014 | Sturcken | |
| 2014/0071636 A1 | 3/2014 | Sturcken | |
| 2014/0240074 A1 | 8/2014 | Qui et al. | |
| 2015/0036308 A1 | 2/2015 | Sturcken | |
| 2016/0126008 A1 | 5/2016 | Sturcken | |
| 2016/0196908 A1 * | 7/2016 | Ohta .................. | C21D 9/52 336/213 |

FOREIGN PATENT DOCUMENTS

| | | | |
|---|---|---|---|
| JP | 60124859 A | | 7/1985 |
| JP | 01028957 A | * | 1/1989 |
| JP | 01028957 A | | 1/1989 |
| JP | 05082736 | | 4/1993 |
| JP | 05291063 | | 11/1993 |
| JP | H09162354 A | | 6/1997 |
| JP | H10284314 A | | 10/1998 |
| JP | 2000068133 A | | 3/2000 |
| JP | 2006228824 A | | 8/2006 |
| WO | WO2012166877 A1 | | 12/2012 |

OTHER PUBLICATIONS

D. W. Lee et al., "Design and Fabrication of Integrated Solenoid Inductors with Magnetic Cores", Electronic Components and Technology Conference, 2008, p. 701-705, IEEE.

N. Sturcken et al., "A 2.5D Integrated Voltage Regulator Using Coupled Magnetic-Core Inductors on Silicon Interposer Delivering 10.8A/mm", IEEE International Solid-State Circuits Conference, Feb. 22, 2012, p. 3-5, Session 23, IEEE.

N. A. Sturcken, "Integrated Voltage Regulators with Thin-Film Magnetic Power Inductors", 2013, pp. 1-166, Columbia University.

(56) References Cited

OTHER PUBLICATIONS

ISA, "International Search Report", PCT/US2018/036832, dated Aug. 28, 2018.

* cited by examiner

INTEGRATED CIRCUIT WITH LAMINATED MAGNETIC CORE INDUCTOR INCLUDING A FERROMAGNETIC ALLOY

CROSS REFERENCE TO RELATED APPLICATIONS

This application is a continuation-in-part of U.S. patent application Ser. No. 14/991,111, filed on Jan. 8, 2016, titled "Magnetic Core Inductor Integrated with Multilevel Wiring Network," which is a continuation of U.S. patent application Ser. No. 14/517,370, filed on Oct. 17, 2014, now U.S. Pat. No. 9,357,651, titled "Magnetic Core Inductor Integrated with Multilevel Wiring Network," which is a divisional application of U.S. application Ser. No. 13/609,391, filed on Sep. 11, 2012, now U.S. Pat. No. 9,844,141, titled "Magnetic Core Inductor Integrated with Multilevel Wiring Network." This application is also related to U.S. patent application Ser. No. 13/613,011, filed on Sep. 13, 2012, now U.S. Pat. No. 9,357,650, titled "Magnetic Core Inductor Integrated with Multilevel Wiring Network." The foregoing applications are hereby incorporated by reference.

BACKGROUND

The present invention relates to electronic devices of very large scale integration circuits. In particular, it relates to devices that deliver power supply voltages for the circuits.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

An aspect of the invention is directed to a structure comprising: a semiconductor integrated circuit comprising a multilevel wiring network; and an inductor integrated into said multilevel wiring network, said inductor comprising a planar laminated magnetic core and a conductive winding that turns around in a generally spiral manner on the outside of said planar laminated magnetic core, said planar laminated magnetic core comprising an alternating sequence of a magnetic layer and a non-magnetic layer, wherein the magnetic layer comprises a ferromagnetic alloy having an iron composition of about 10 atomic percent to about 90 atomic percent.

In one or more embodiments, the inductor core has a saturation magnetization of at least 1.5 T. In one or more embodiments, the inductor has a coercivity of less than or equal to 1.0 Oe. In one or more embodiments, the ferromagnetic alloy comprises CoFeB, CoFe, or a combination thereof. In one or more embodiments, the magnetic layer further comprises at least one additional ferromagnetic material that does not include iron. In one or more embodiments, the at least one additional ferromagnetic material includes cobalt, nickel, or a combination thereof.

In one or more embodiments, the magnetic layer further comprises boron, tantalum, chromium, cobalt, titanium, zirconium, or a combination of two or more of the foregoing. In one or more embodiments, the non-magnetic layer comprises an electrical insulator layer and a first interface layer, wherein the non-magnetic layer is disposed between a first magnetic layer and a second magnetic layer. In one or more embodiments, the interface layer comprises tantalum, aluminum, chromium, cobalt, titanium, zirconium, silicon, or a combination of two or more of the foregoing. In one or more embodiments, the electrical insulator comprises silicon dioxide ($SiO_2$), aluminum oxide ($Al_xO_y$), chromium oxide ($Cr_xO_y$), cobalt oxide ($Co_xO_y$), tantalum oxide ($Ta_xO_y$), titanium oxide ($Ti_xO_y$), silicon nitride ($Si_xN_y$), aluminum nitride ($Al_xN_y$), tantalum nitride ($Ta_xN_y$), or a combination of two or more of the foregoing. In one or more embodiments, the electrical insulator comprises an oxide of at least a portion of the material that forms the magnetic layer.

In one or more embodiments, the magnetic layer comprises an anisotropic magnetic material having a hard axis of magnetization that is at least partially aligned with an axis of the conductive winding, the conductive winding extending along the axis of the conductive winding.

Another aspect of the invention is directed to a microelectronic device comprising: a semiconductor integrated circuit, wherein said semiconductor integrated circuit comprises a multilevel wiring network, wherein said semiconductor integrated circuit operates with a plurality of DC supply voltages; and a DC to DC voltage converter which delivers at least one of said DC supply voltages for said semiconductor integrated circuit, said DC to DC voltage converter comprising an inductor, and wherein said inductor is integrated thereinto said multilevel wiring network, wherein said inductor comprises a planar magnetic core and a conductive winding, wherein said conductive winding turns around in generally spiral manner on the outside of said planar magnetic core, said planar magnetic core having a laminated configuration comprising at least one magnetic layer and at least one current rectifying layer, wherein the magnetic layer comprises a ferromagnetic alloy having an iron composition of about 10 atomic percent to about 90 atomic percent.

In one or more embodiments, the current rectifying layer comprises a p-type semiconductor, the p-type semiconductor having a first work function less than a second work function of the magnetic material. In one or more embodiments, the laminated configuration further comprises an interface metal layer disposed on said p-type semiconductor, the interface layer having a work function less than said first work function of said p-type semiconductor. In one or more embodiments, the microelectronic device further comprises a second magnetic layer disposed on said interface metal layer, the second magnetic layer comprising the ferromagnetic alloy.

In one or more embodiments, the current rectifying layer comprises a n-type semiconductor, the n-type semiconductor having a first work function greater than a second work function of the magnetic material. In one or more embodiments, the laminated configuration further comprises an interface metal layer disposed on said n-type semiconductor, the interface layer having a work function greater than said first work function of said n-type semiconductor. In one or more embodiments, the microelectronic device further comprises a second magnetic layer disposed on said interface metal layer, the second magnetic layer comprising the ferromagnetic alloy.

In one or more embodiments, the magnetic layer further comprises at least one additional ferromagnetic material that does not include iron. In one or more embodiments, the at least one additional ferromagnetic material includes cobalt, nickel, or a combination thereof. In one or more embodiments, the inductor and at least a portion of the semiconductor integrated circuit form a transformer. In one or more embodiments, the inductor and at least a portion of the semiconductor integrated circuit form a power converter. In one or more embodiments, the inductor and at least a portion of the semiconductor integrated circuit form a microprocessor.

In one or more embodiments, the magnetic layer comprises an anisotropic magnetic material having a hard axis of magnetization that is at least partially aligned with an axis of the conductive winding, the conductive winding extending along the axis of the conductive winding.

IN THE DRAWINGS

These and other features of the present invention will become apparent from the accompanying detailed description and drawings, wherein.

Figure 4A:
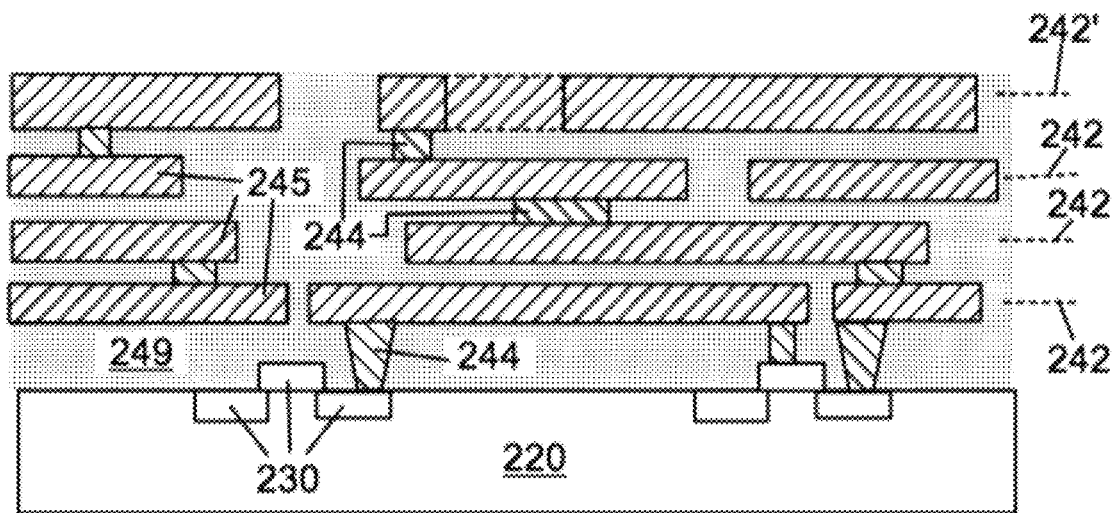
Figure 4B:
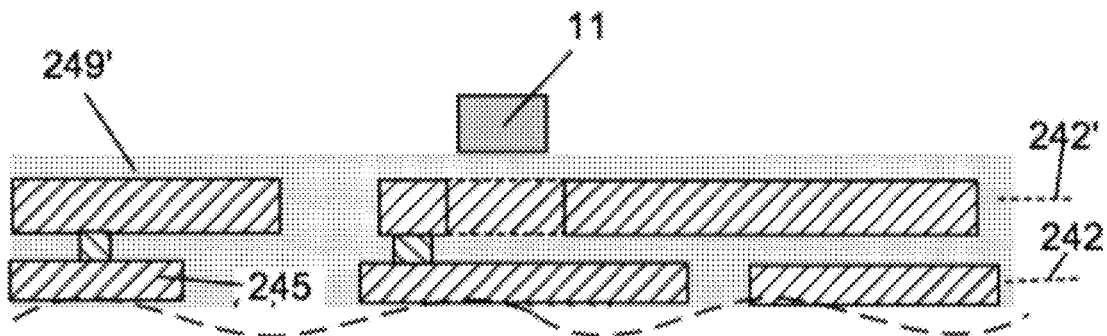
Figure 4C:
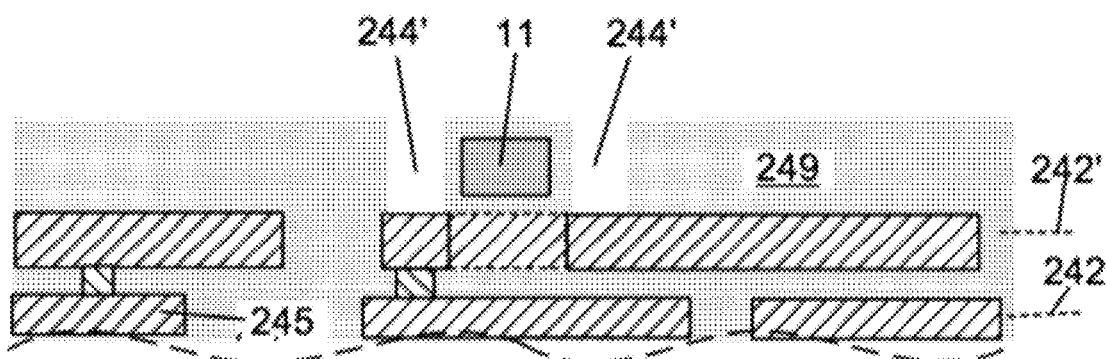
Figure 5:
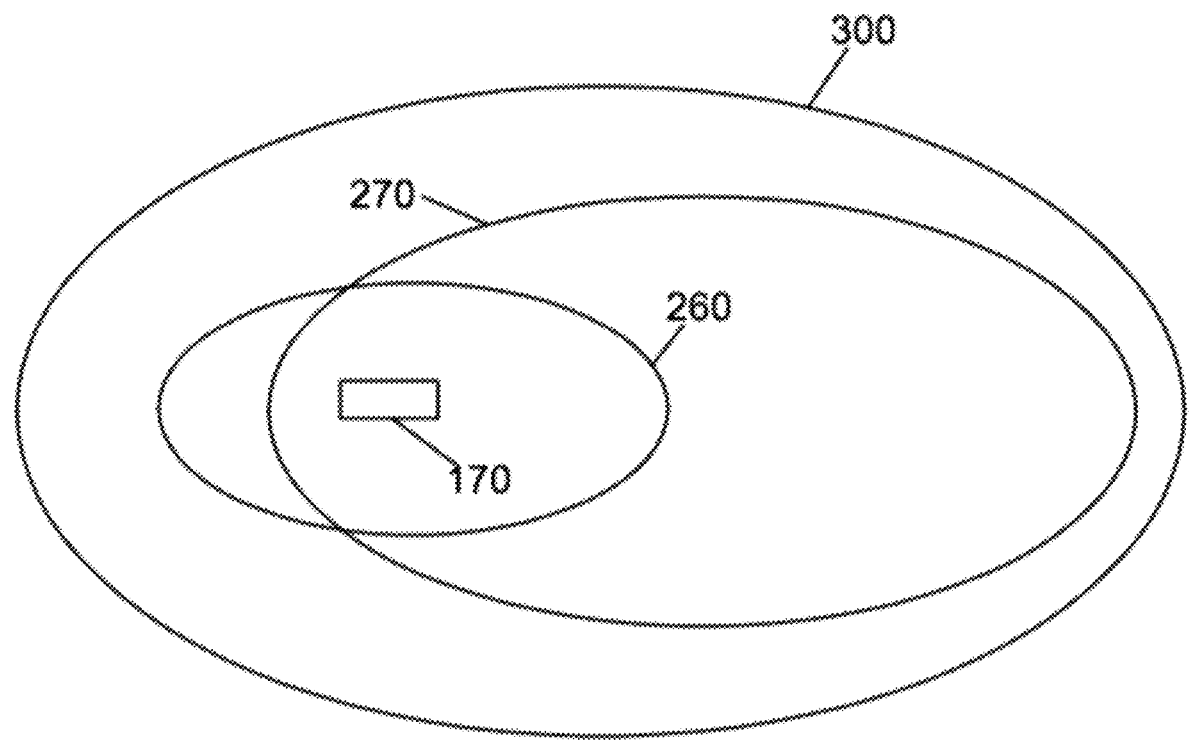
Figure 6:
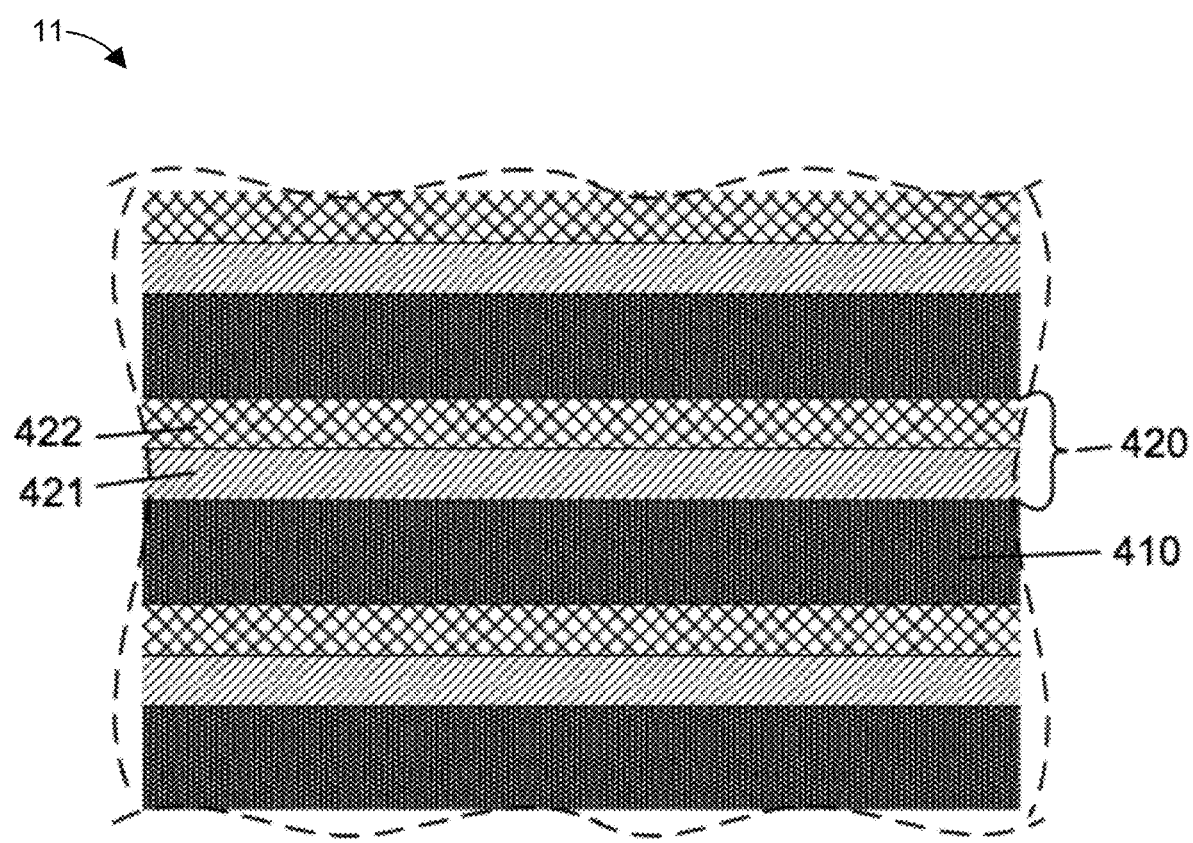
Figure 7:
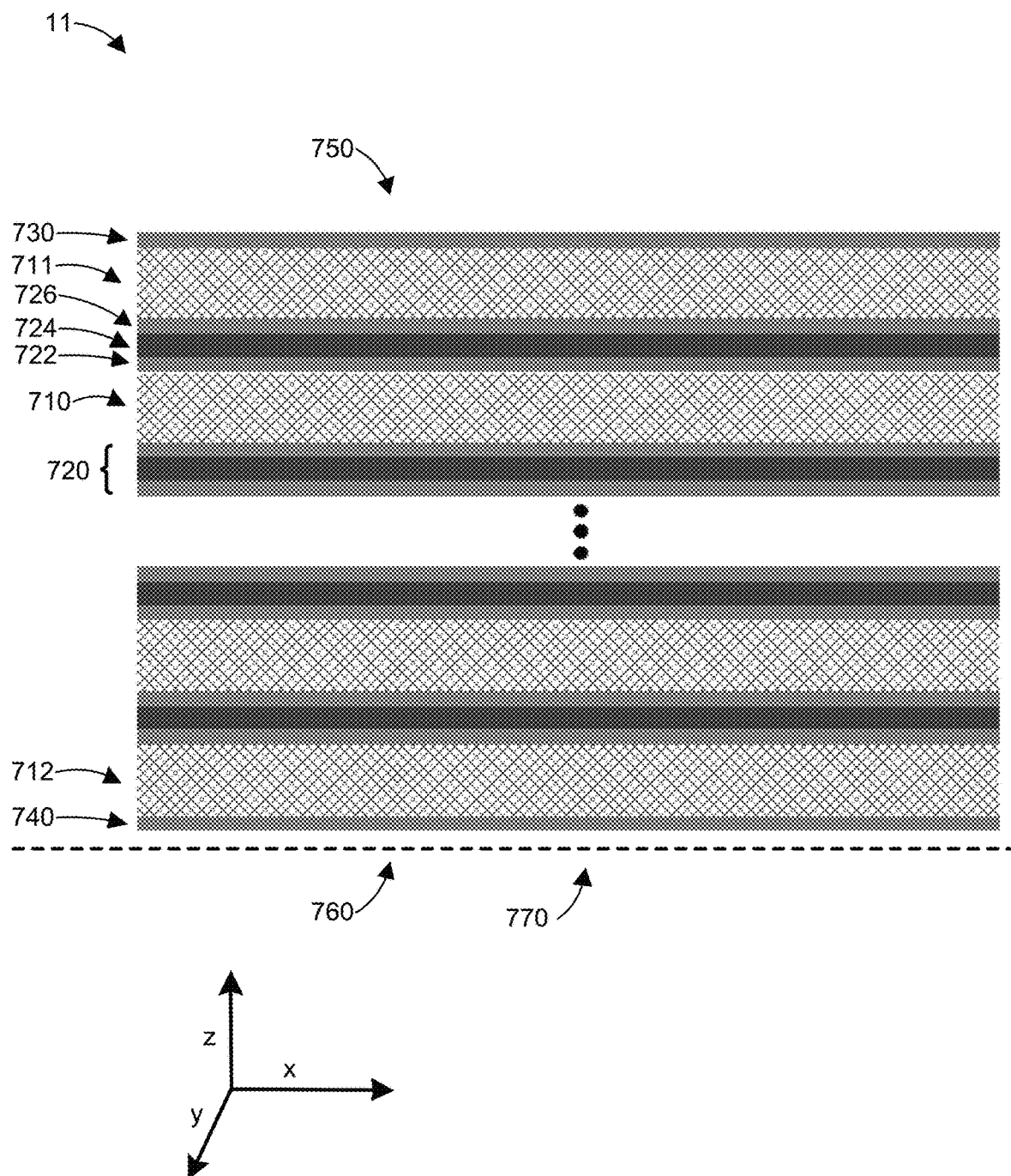
Figure 8A:
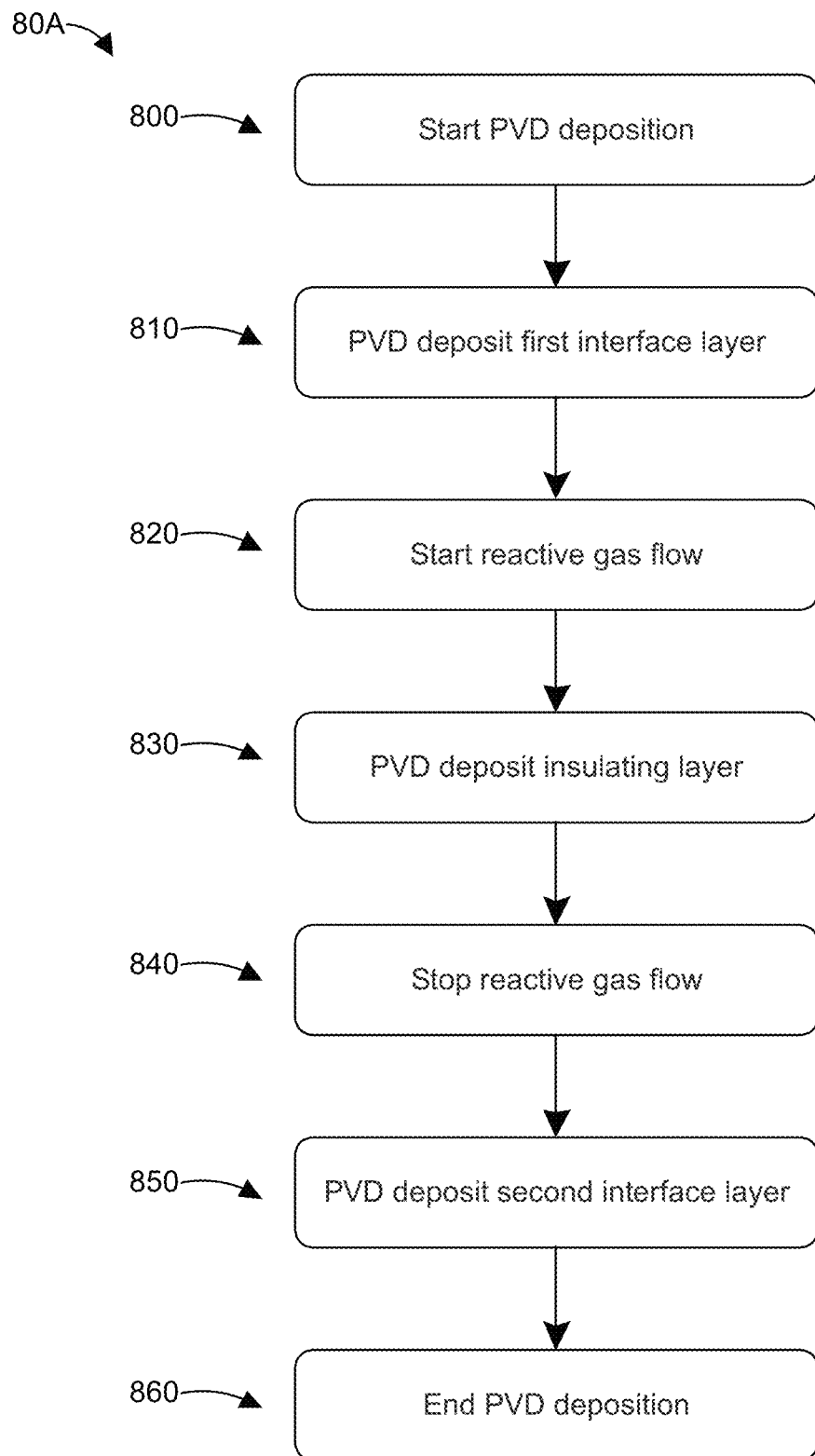
Figure 8B:
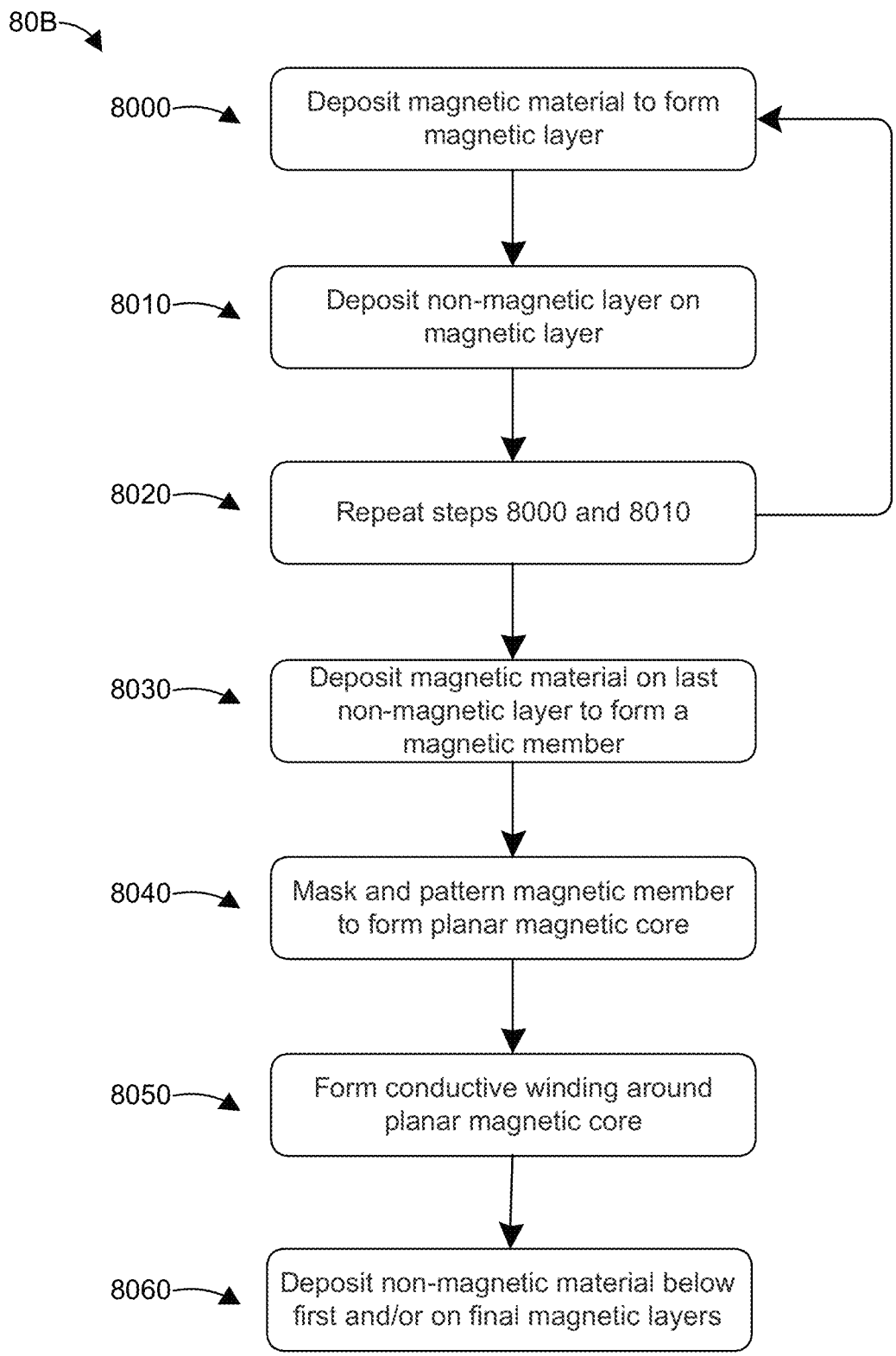

FIGS. 3A, 3B, 3C, and 3D show schematic cross-sectional views of planar magnetic core inductors integrated into multilevel wiring networks according to various embodiments of the disclosure;

FIGS. 4A, 4B, and 4C show schematic cross-sectional views of steps in the integration of a planar magnetic core into a multilevel wiring networks according to an embodiment of the disclosure;

FIG. 5 symbolically depicts a processor with a device that uses a planar magnetic core inductor according to an embodiment of the disclosure;

FIG. 6 is a cross-sectional view of the laminated composition of a planar magnetic core according to an embodiment of the disclosure;

FIG. 7 is a cross-sectional view of the laminated composition of a planar magnetic core according to another embodiment of the disclosure;

FIG. 8A is a flow chart of a method for sputter depositing the non-magnetic layers of a planar magnetic core according to an embodiment of the disclosure;

FIG. 8B is a flow chart of a method for manufacturing an inductor according to an embodiment of the disclosure.

Figure 9A:
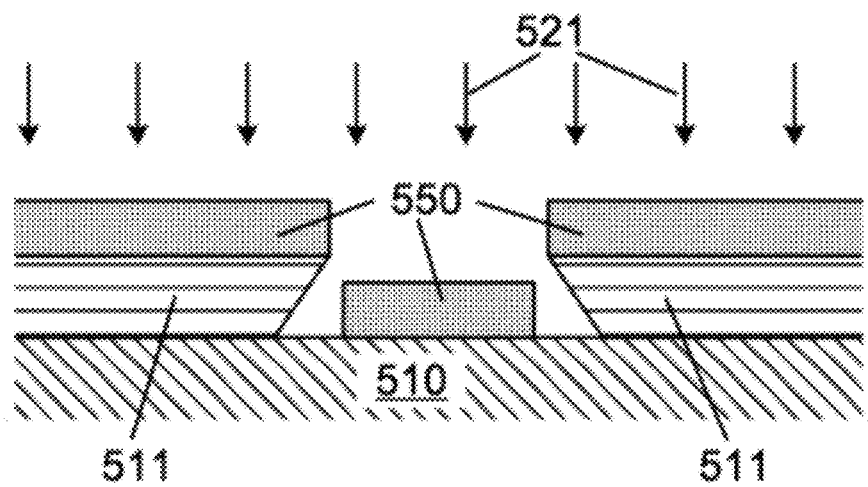
Figure 9B:
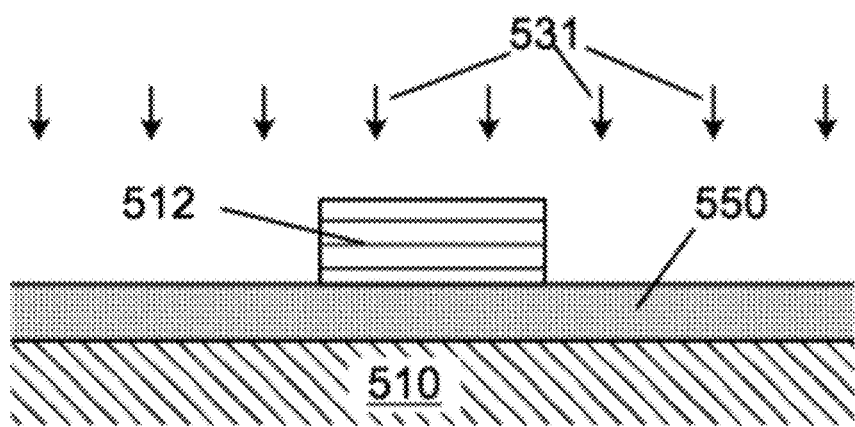
Figure 10:
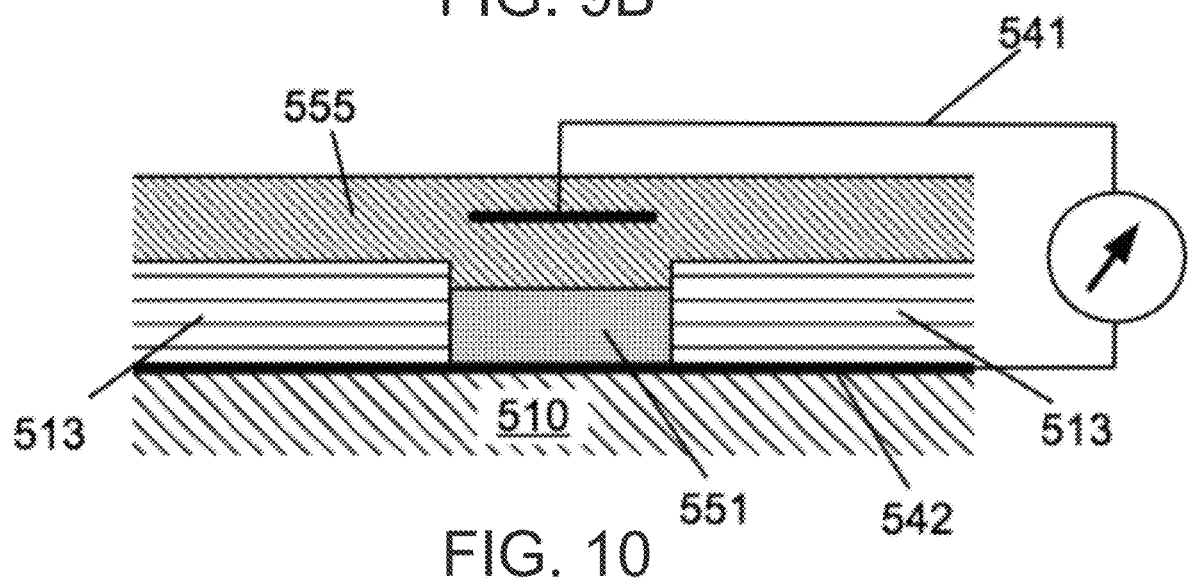
Figure 11:
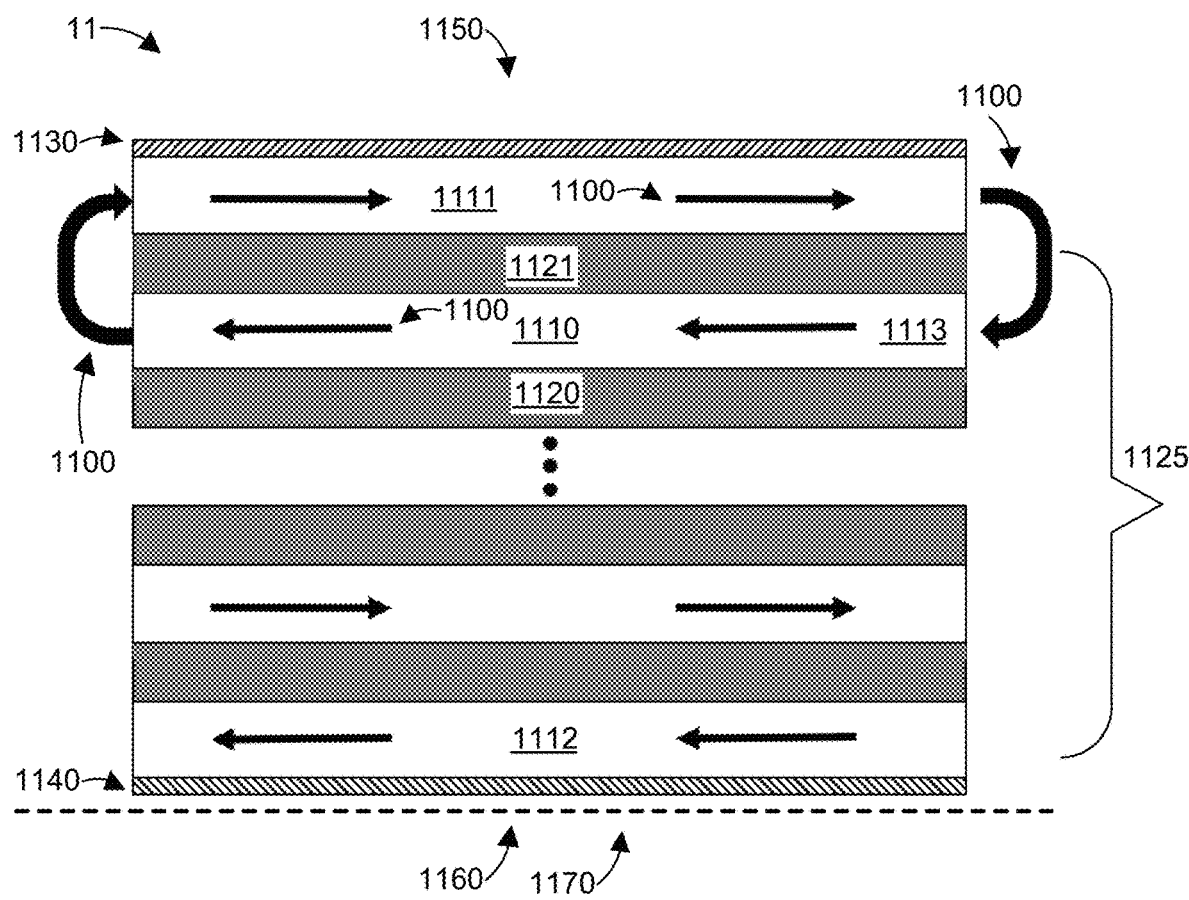
Figure 12:
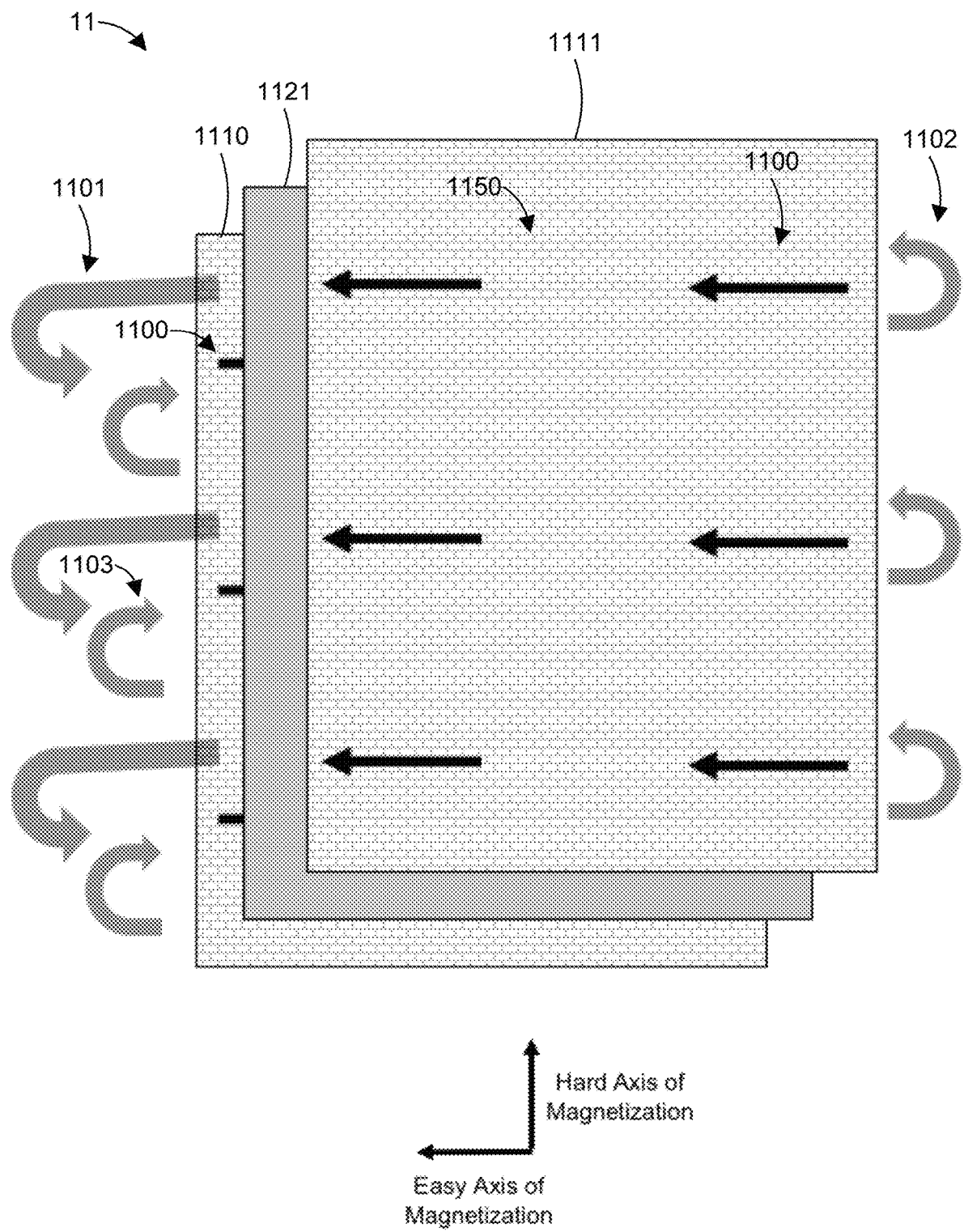
Figure 13:
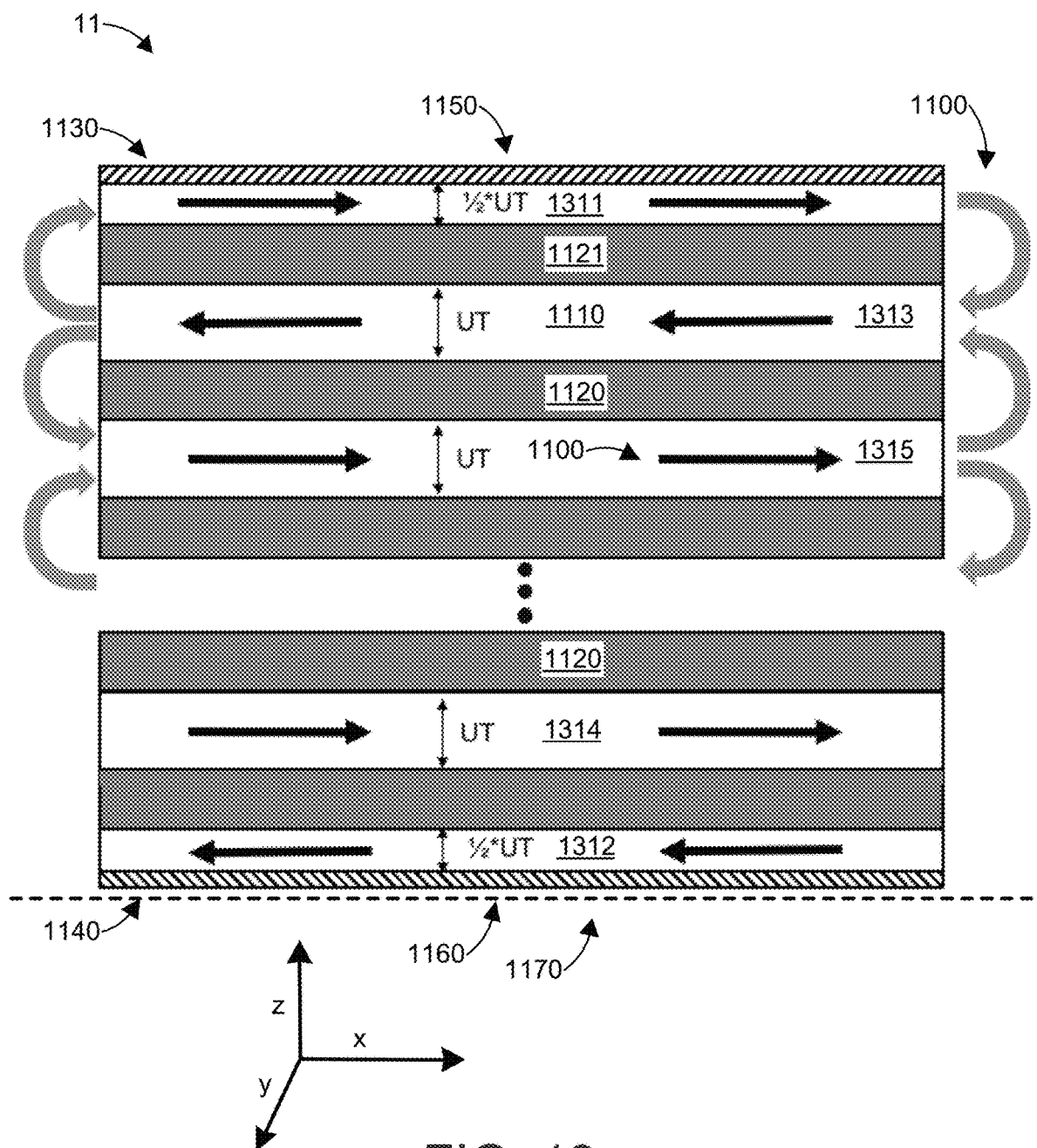
Figure 14:
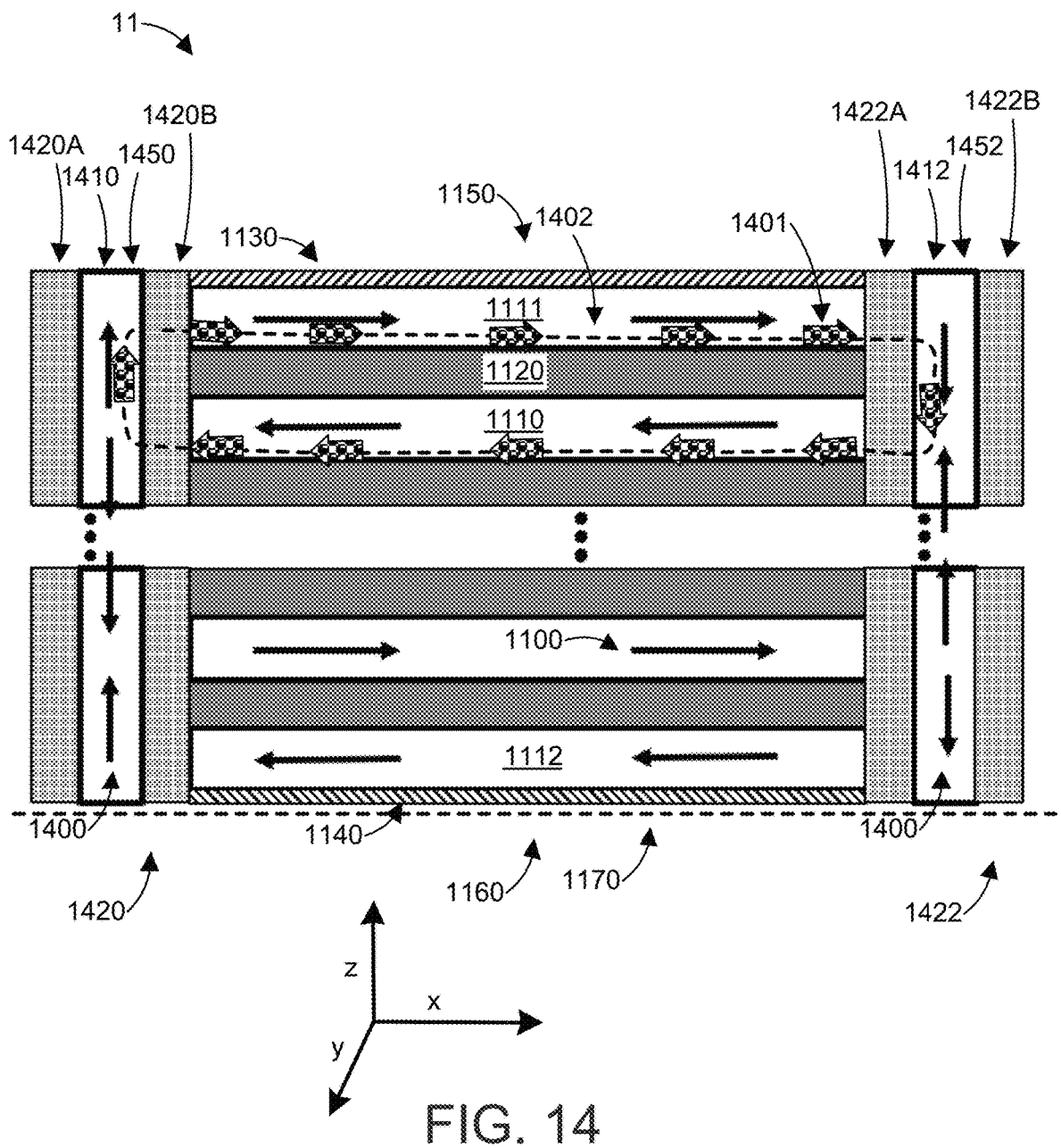
Figure 15:
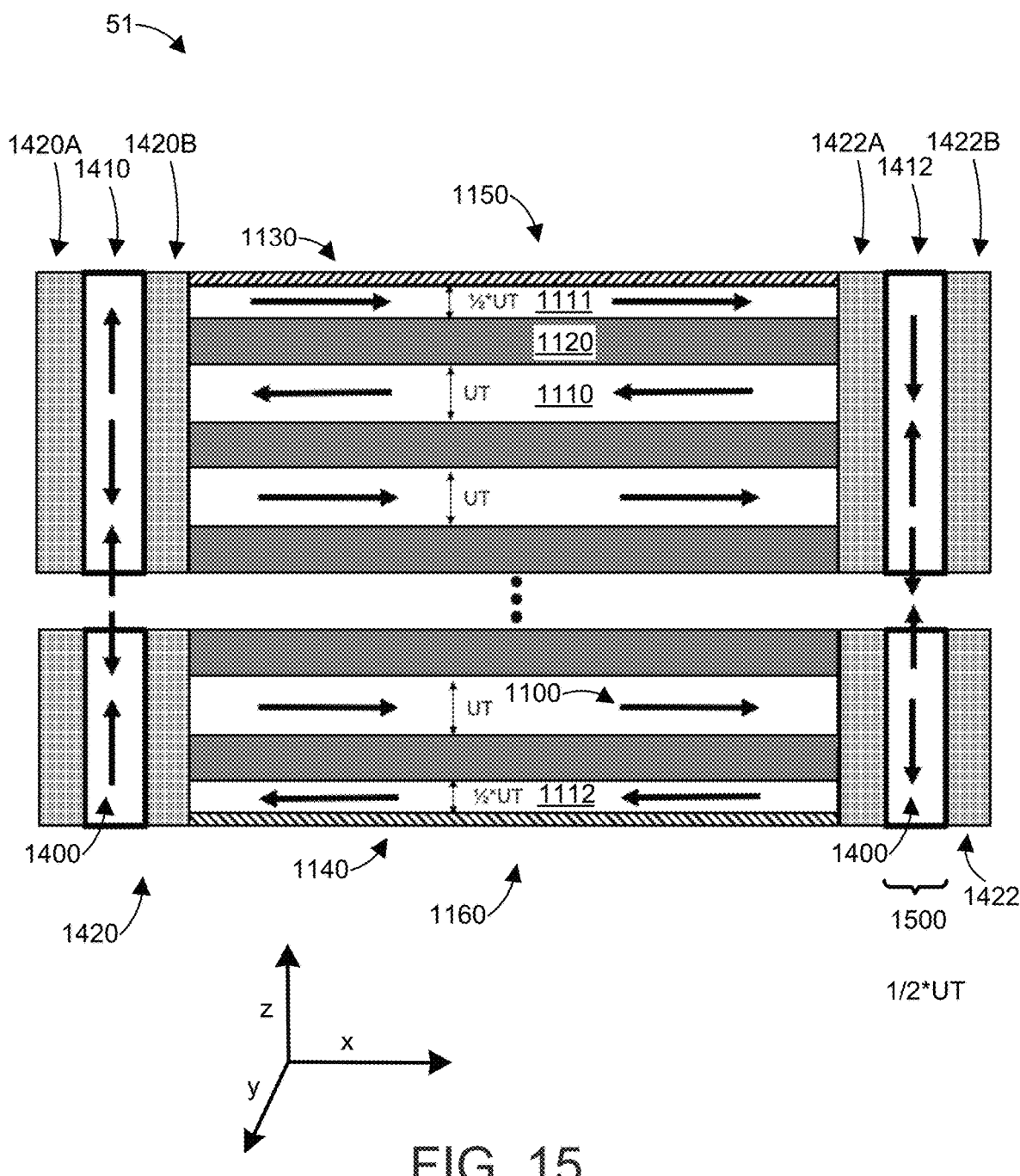
Figure 16:
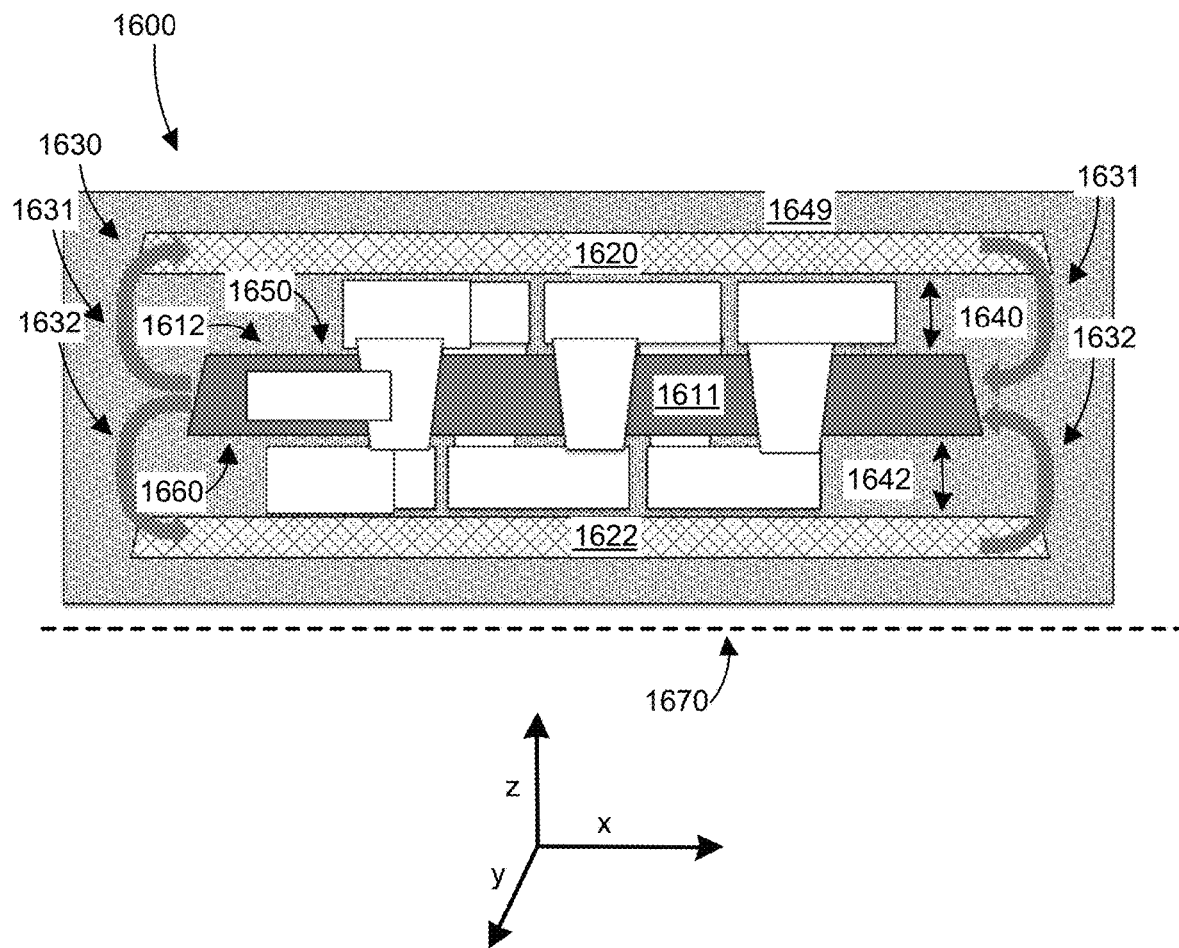
Figure 17:
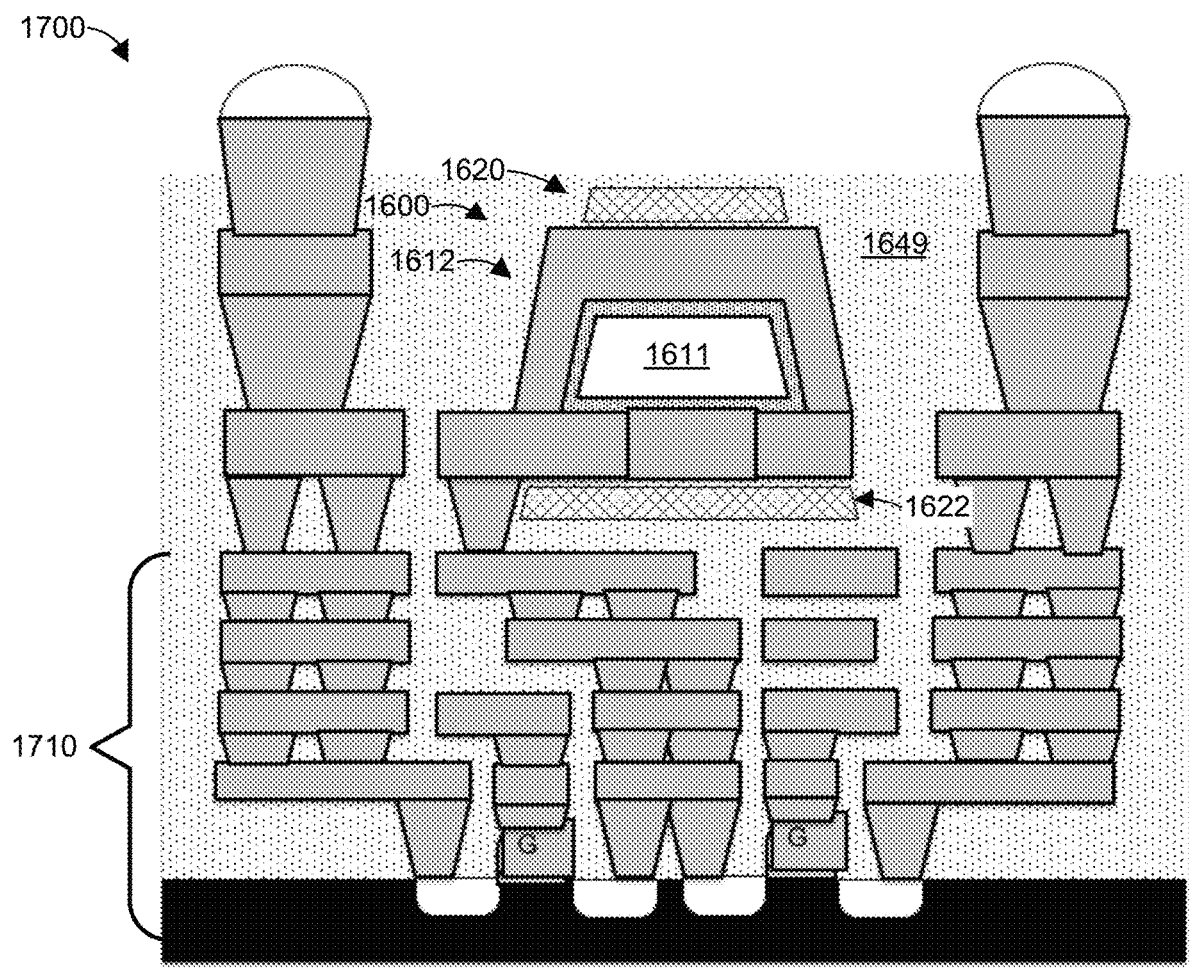
Figure 18:
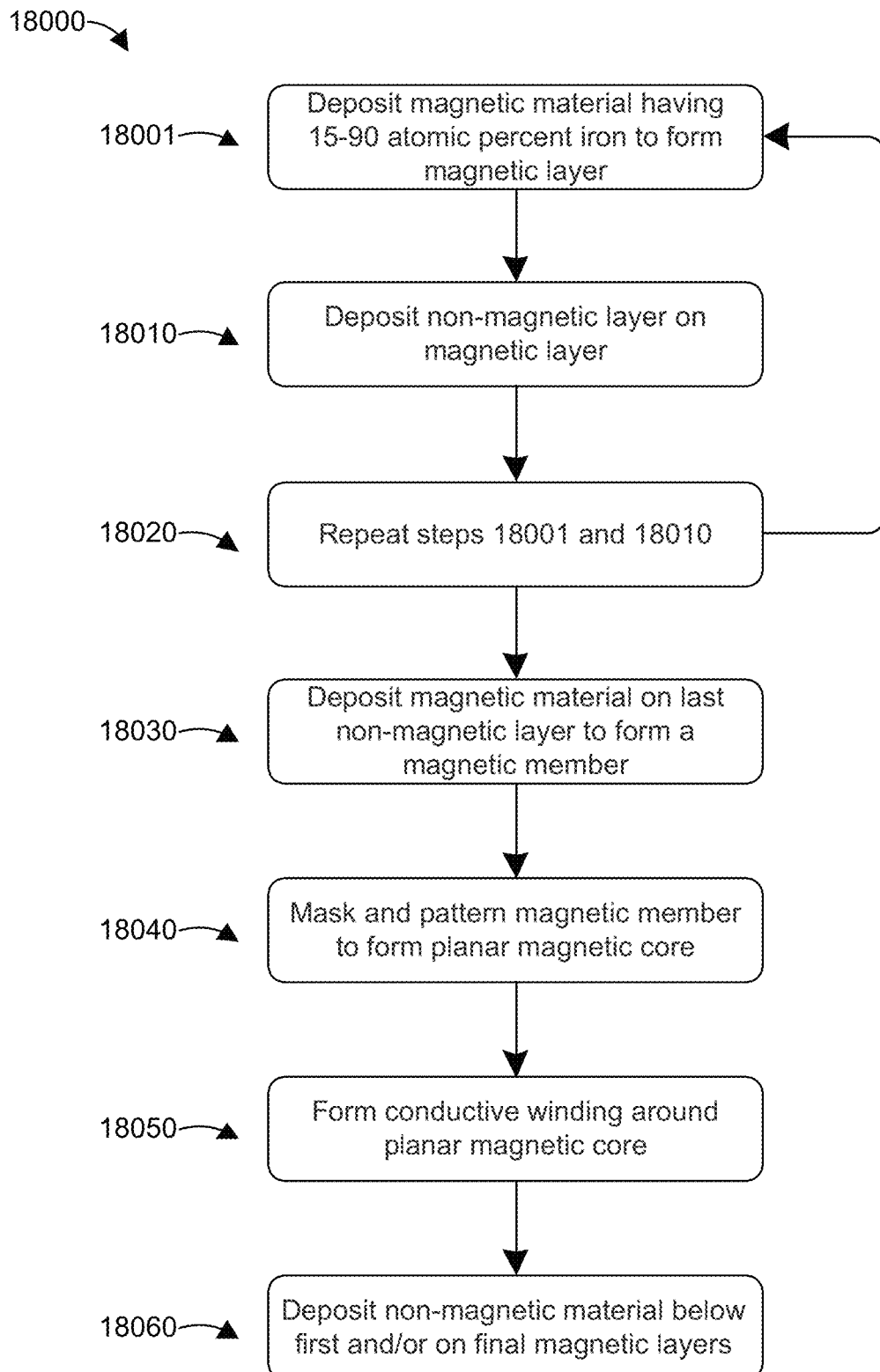
Figure 19:
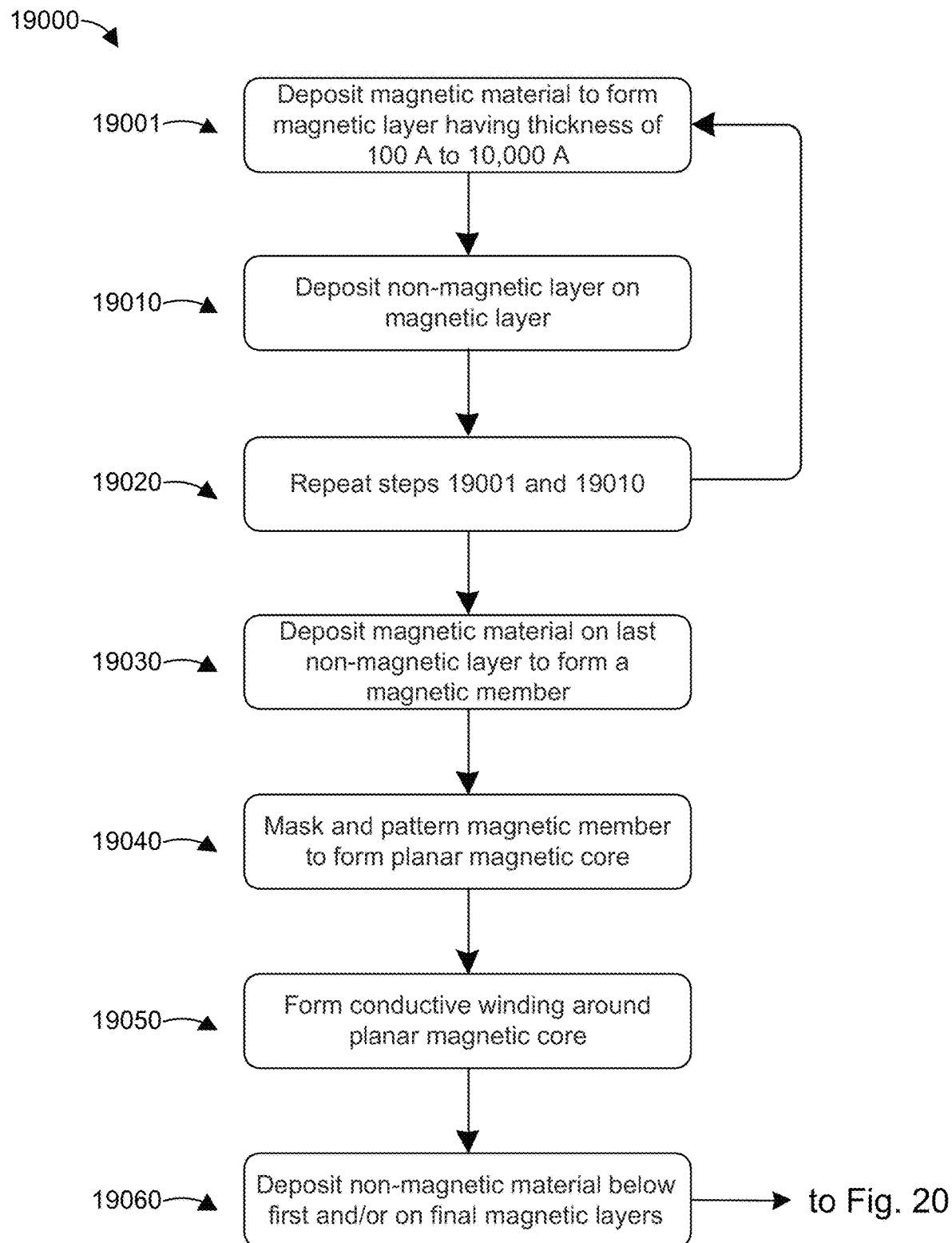
Figure 20:
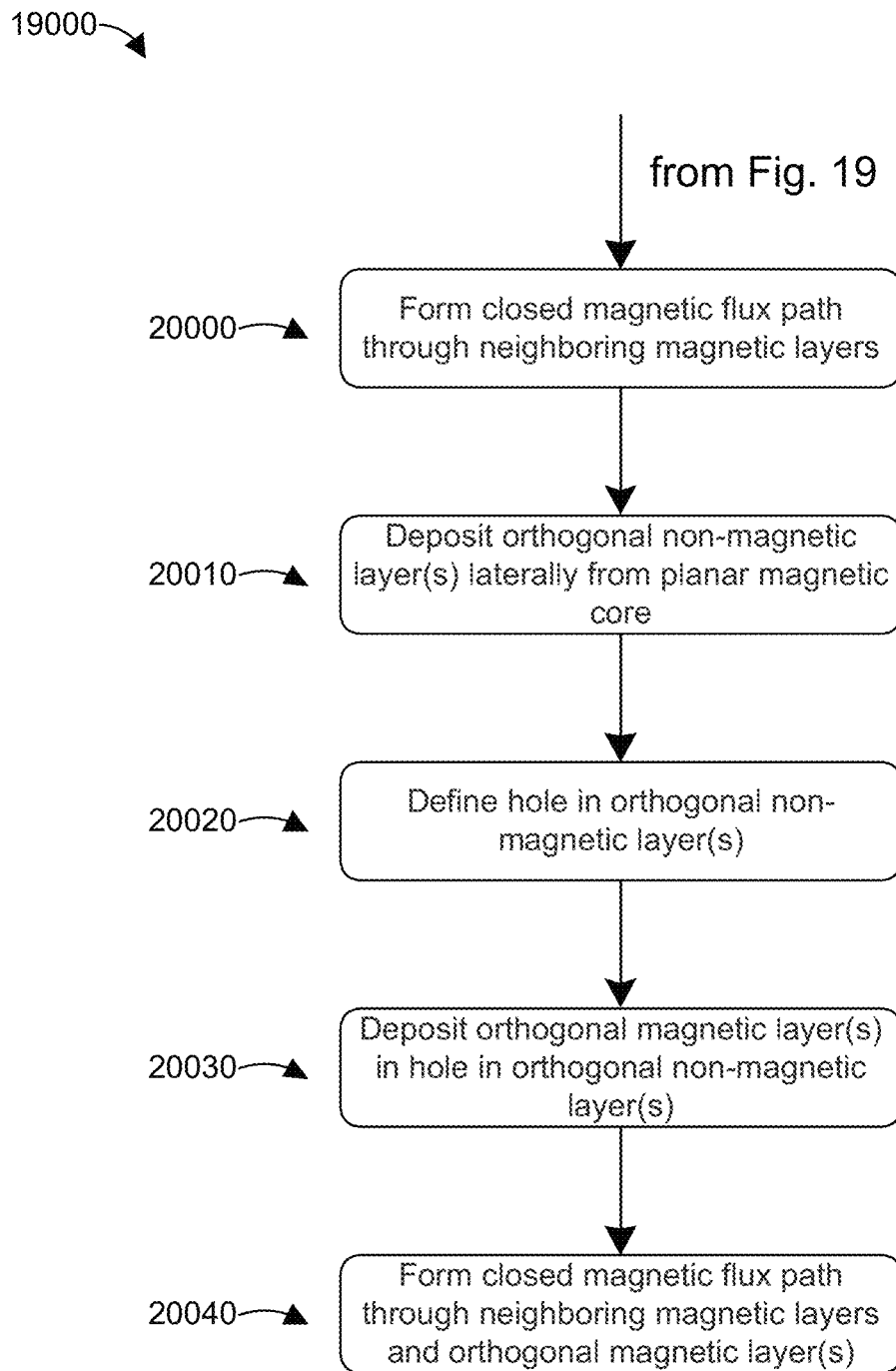
Figure 21:
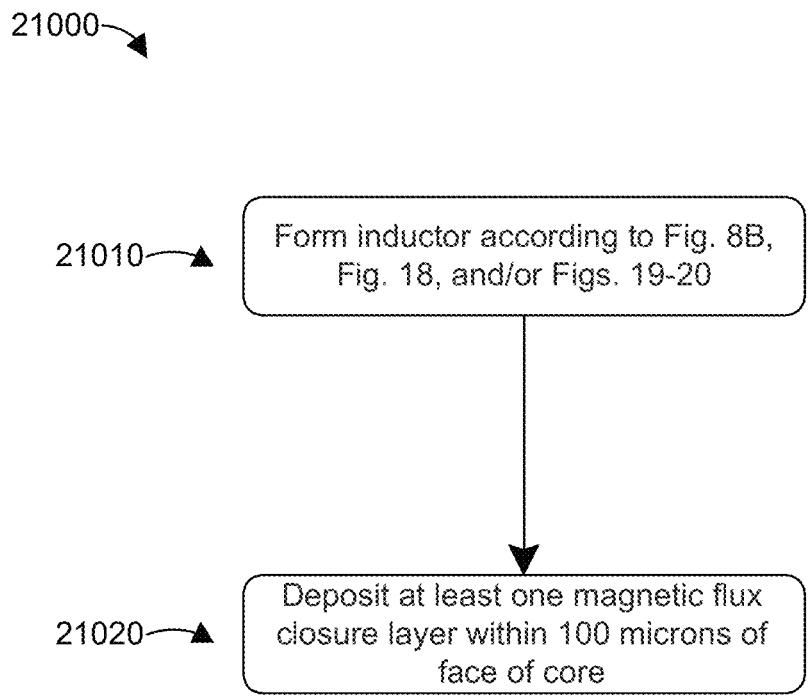

FIGS. 9A and 9B show schematic views of embodiments for fabricating laminated planar magnetic cores and couplers by sputtering;

FIG. 10 shows a schematic view of fabricating laminated planar magnetic cores and couplers by electroplating;

FIG. 11 is a cross-sectional view of a planar magnetic core in which the thicknesses of the magnetic and non-magnetic layers are co-optimized for layer-to-layer magnetic flux closure, according to an embodiment of the disclosure;

FIG. 12 is an exploded perspective view of the top surface of the planar magnetic core illustrated in FIG. 11;

FIG. 13 is a cross-sectional view of a planar magnetic core that is further co-optimized for layer-to-layer magnetic flux closure, according to another embodiment of the disclosure;

FIG. 14 is a cross-sectional view of a planar magnetic core that is further configured for layer-to-layer magnetic flux closure, according to another embodiment of the disclosure;

FIG. 15 is a cross-sectional view of a planar magnetic core that is further configured for layer-to-layer magnetic flux closure, according to another embodiment of the disclosure;

FIG. 16 is a cross-sectional view of an inductor and magnetic flux closure layers according to one or more embodiments;

FIG. 17 is a cross-sectional view of an integrated circuit that includes the inductor and magnetic flux closure layers illustrated in FIG. 16;

FIG. 18 illustrates a flow chart for a method of manufacturing an inductor according to an embodiment of the disclosure;

FIGS. 19 and 20 illustrate a flow chart for a method of manufacturing an inductor according to an embodiment of the disclosure; and FIG. 21 illustrates a flow chart for a method of manufacturing an inductor according to an embodiment of the disclosure.

DETAILED DESCRIPTION

Microelectronics progress has been synonymous with decreasing feature sizes. Decreased feature sizes allow for ever higher circuit counts and increased circuit densities for semiconductor integrated circuits (ICs). In today's very large scale integration (VLSI) technical art complete processors, even with multiple computing cores, are integrated onto a single die, or chip. The terms "die" and "chip" are regarded as interchangeable in the present disclosure. It is commonly understood that the vast number of devices in the ICs are in need of elaborate wiring networks for interconnecting devices, distributing power, and other functions known in the art. Such wiring networks are also typically integrated onto the same chips as the electronic components, such as the transistors. The wiring network is often referred to in the art as the back end of the line (BEOL) since its fabrication is typically done late in the processing sequences of a VLSI die.

As known in the art, the wiring network of a VLSI IC is usually of multiple levels, typically arranged into multiple discrete wiring planes. Modern VLSI circuits are often in need of quite a few of such wiring planes, typically in the range of 4 to 8, but with further integration the number of wiring planes may increase to 10 and beyond. It is usual that the higher the planes are, that is the higher away from the semiconductor components, the bulkier and coarser the wires become. Wire segments on differing wiring planes may be interconnected by so called Vertical Interconnect Accesses (VIAs). VIAs carry the electric current in the direction perpendicular to that of the wiring planes.

Manufacturing of BEOL is well established in the VLSI arts. It is understood that there are a large number of steps involved in such processing, and each step might have practically endless variations known to those skilled in the art. One multilevel wiring fabrication scheme often used in the art is the so-called damascene, or often dual damascene, processing method. State of the art multilevel interconnect structures typically use Cu as the metal for the wires and for the VIAs.

Semiconductor ICs may often be in need of inductors. Such may be the case for analog, or mixed analog/digital circuits. Inductors are also needed as transformers, and as energy storage elements. The use of inductors as energy storage elements came to the fore because the energy consumption of a chip may become a constraint on the performance in VLSI processors. A promising method to increase performance-per-watt of digital ICs may be the so called dynamic voltage and frequency scaling, where the supply voltage and/or clock frequency is adjusted transiently to match required workloads.

A promising way to implement dynamic voltage scaling is to generate and distribute multiple DC supply voltages for a semiconductor IC. Switched-inductor (buck) converters are good candidates for this task since they are capable of delivering high current densities in the necessary voltage ranges. Such ranges may be, without intent of limiting, between 2V and 0.35V. As it is known in the art, a buck converter is suitable for dynamic DC to DC voltage conversion. The various converted voltages may then be distributed into the power supply wiring of the IC, which power supply wiring may be part of the multilevel wiring network of the IC. For such a DC to DC voltage converter to be useful it should be able to supply the various voltages at an adequate current level.

So far in the art inductors that were able to fulfill their roles in switched-inductor converters for ICs have been too bulky for integration directly into the IC chip. Various ways around such problems have been devised, such as stacking several chips, using interposers, and more.

A detailed analysis regarding the needs and figure of merits of inductors has been recently given by N. Sturcken et al., "Design of Coupled Power Inductors with Crossed Anisotropy Magnetic Core for Integrated Power Conversion", IEEE-APEC 2012, pp. 417-423, doi: 10.1109/APEC.2012.6165853, which is incorporated herein by reference in its entirety.

Embodiments of the present invention teach inductor structures and their methods of fabrication, which inductor structures have the energy storage capability needed for modern DC to DC voltage converters, while their size and shape is such that these inductors are fully integrable into the multilevel wiring network, the BEOL, of individual VLSI semiconductor ICs.

Inductors in representative embodiments of the present disclosure are based on a planar magnetic core with a conductive winding, which conductive winding turns around the outside of the planar magnetic core in a generally spiral manner.

Figure 1:
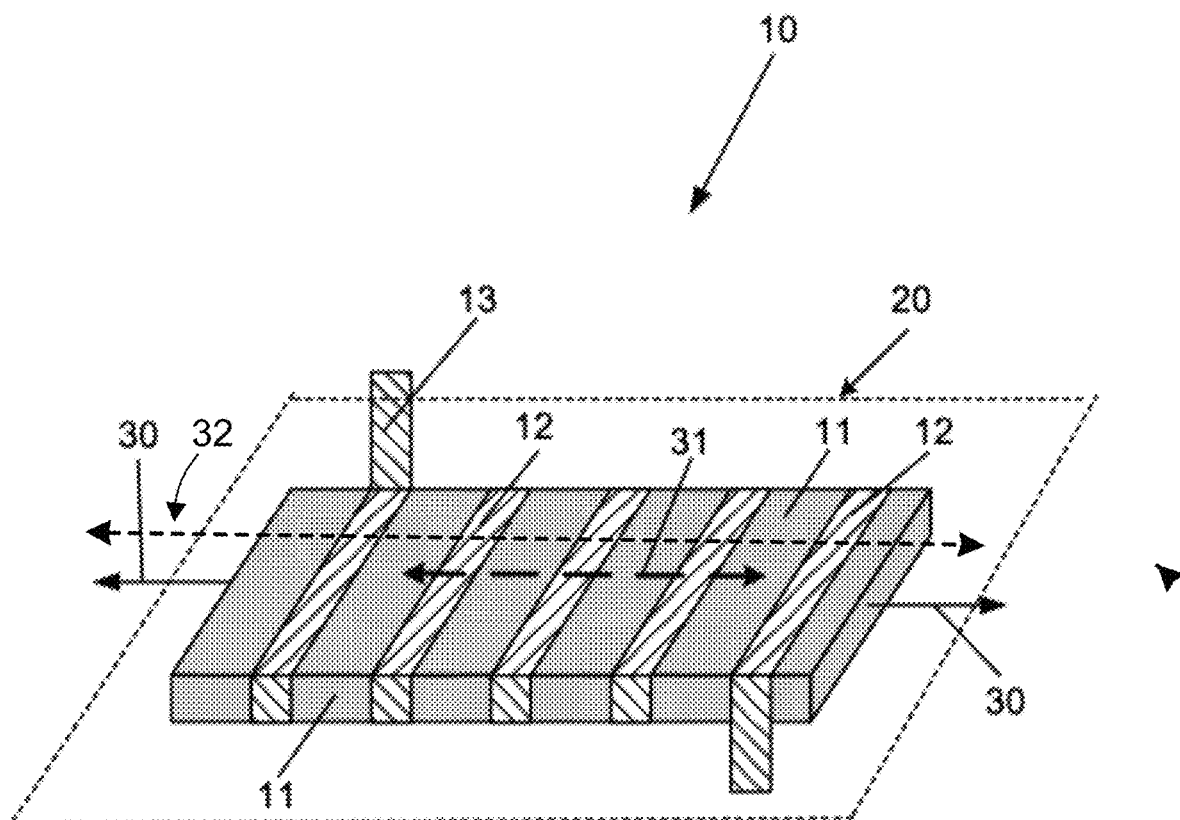
FIG. 1 shows a schematic view of a planar magnetic core inductor with windings on the outside.

FIG. 1 shows a schematic view of a planar magnetic core inductor 10 with windings on its outside. The magnetic core 11 is a planar structure having, and defining, a principal plane 20. The planar magnetic core 11 may typically be of a rectangular shape. The conductive winding 12 of the inductor is made to spiral around the outside of the planar core 11. The spiral of conductive winding 12 extends along a coil axis 32. The conductive winding 12 has leads 13 that may connect to the winding in any desirable manner without limitation. The planar magnetic core 11 includes a magnetic material, which can include any of the magnetic materials described herein. Core 11 can be the same as or substantially the same as any of the cores described herein, including cores 51 and 1611.

The direction 30 of a magnetic field that is induced when an electrical current is flowing in the conductive winding 12 is substantially in the principal plane 20 directed substantially along the winding spiral, and pointing in a direction that depends on the direction of the current in the winding. As it is known in the art, many magnetic materials are anisotropic, and possess so called hard and soft (or easy) axes of magnetization. The planar magnetic core 11 in representative embodiments of the invention is fabricated to have its hard-axis 31 of magnetization aligned substantially in parallel with the magnetic field 30 that is induced when an electrical current is flowing in the conductive windings 12. In addition or in the alternative, the planar magnetic core 11 in representative embodiments of the invention is fabricated to have its hard-axis 31 of magnetization aligned substantially in parallel with its coil axis 32. One or both of these alignments for the material of the magnetic core 11 is desirable because along the hard-axis the core magnetization exhibits less hysteresis and has a substantially linear dependence on the current in the winding 12, resulting in more energy efficient operation of the inductor.

Figure 2A:
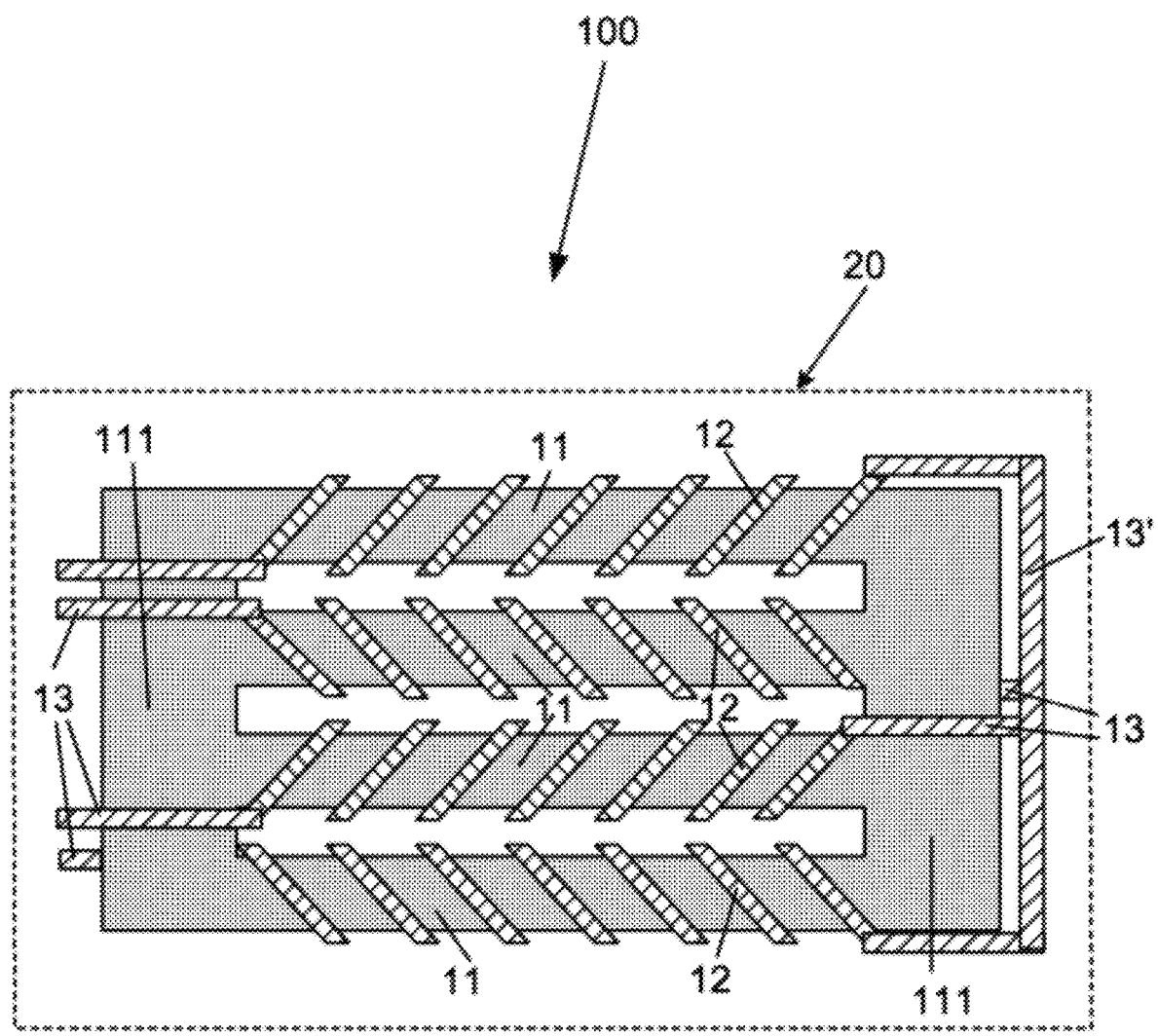
FIG. 2A shows schematic top view of a plurality of inductors of planar magnetic cores with end couplings, and with windings according to an embodiment of the disclosure.

FIG. 2A shows schematic top view of a plurality of inductors 100 of planar magnetic cores with end couplings, and with windings according to an embodiment of the disclosure. The figure shows four magnetic cores 11 in parallel, each capable for being used in an individual inductor, with planar couplers 111 at each of their ends. The planar magnetic cores 11 and the planar couplers 111 are arranged in the principal plane 20 of the magnetic cores, in the manner of a ladder. As a ladder has rungs and stringers, each of the planar magnetic cores 11 corresponds to one of the rungs of the ladder, and each of the planar couplers 111 corresponds to one of the stringers of the ladder. The conductive windings 12 each are made to spiral around the outside of each of the plurality of planar cores 11. FIGS. 1 and 2A are only schematic, and though the parts of the continuous windings underneath the core are not even visible, nonetheless they indicate that the conductive winding 12 may spiral around the magnetic core 11 in many differing ways. Any and all possible manner of winding around the outside of the magnetic core 11 is within the scope of the embodiments of the disclosure.

The number of planar magnetic cores 11 in FIG. 2A is 4. Typically the plurality of inductors 100 in the coupled cores configuration that is shown in FIG. 2A, may range between 2 and 20, but more typically between 2 and 8. The advantages of the magnetic couplers 111 and the optimal manner in what phases are the various magnetic cores 11 driven by the current in the windings 12 is detailed by N. Sturcken et al., "Design of Coupled Power Inductors with Crossed Anisotropy Magnetic Core for Integrated Power Conversion", IEEE-APEC 2012, pp. 417-423, doi: 10.1109/APEC.2012.6165853. FIG. 2A shows that the leads 13 of the windings 12 are all shorted 13' together at one side, and are independent on the other side of the inductors. Such a physical arrangement may be advantageous when the multi-core coupled inductor 100 is used in a DC to DC voltage converter. However, the displayed arrangement of the windings is meant to be understood as an example, and not in a restrictive manner.

Figure 2B:
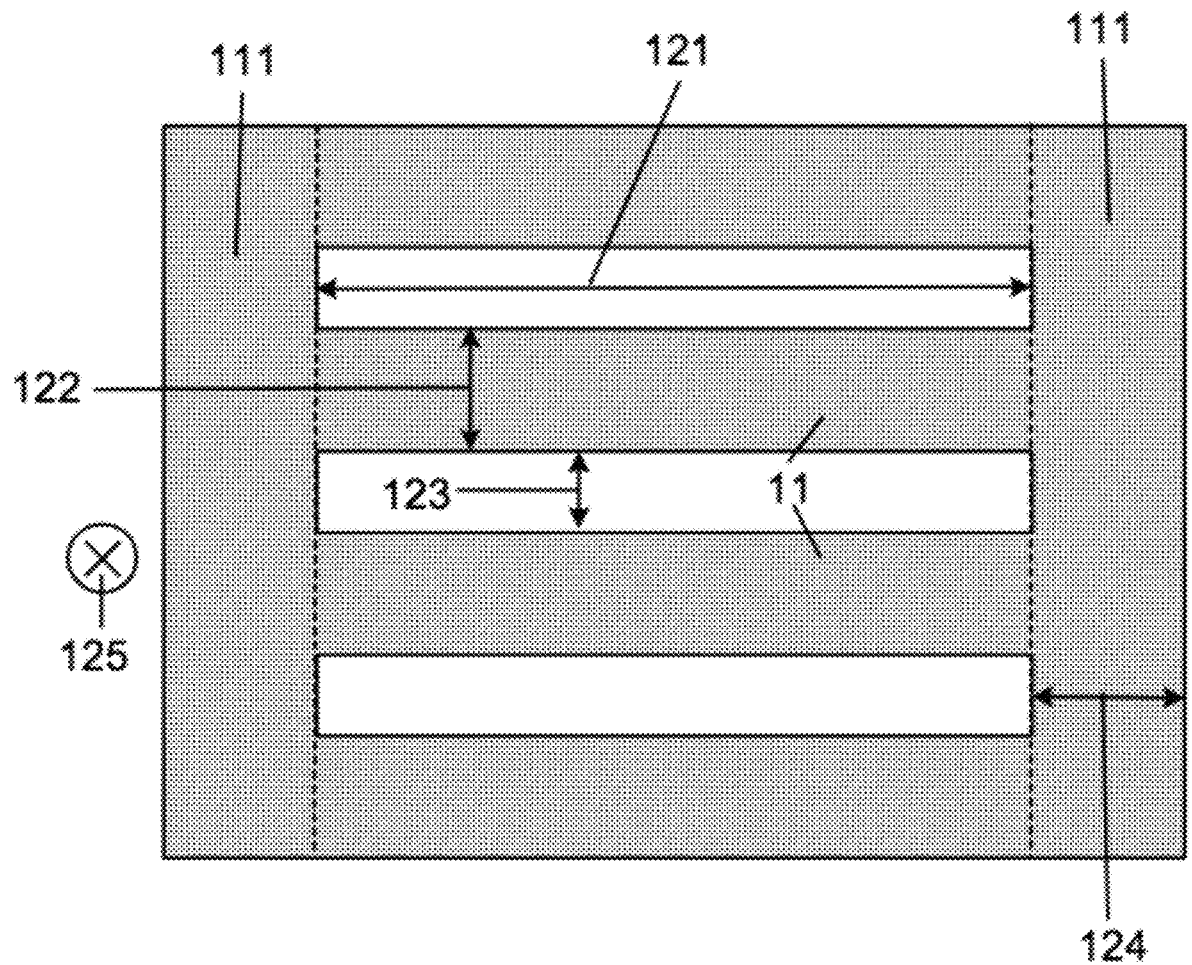
FIG. 2B shows schematic top view of a plurality of planar magnetic cores defining structural dimensions.

FIG. 2B shows schematic top view of a plurality of planar magnetic cores defining structural dimensions. The vertical dashed lines in the figure are present only to guide the eye to distinguish between the magnetic cores 11 and magnetic couplers 111. As before, the stringer/rung terminology will be used as convenient description of the structure. Five parameters may be used to characterize the planar coupled core magnetic structure; length of a core: $L_{rung}$ 121, width of a core: $W_{rung}$ 122, separation of cores $S_{rung}$ 123, width of a coupler $W_{stringer}$ 124, and thickness of the magnetic layer, $T_{core}$ 125 which is only symbolically indicated since it is perpendicular to the plane displayed in FIG. 2B.

As a way of example, and without intent of limiting, finite element numerical simulations have been carried out for the particular case of $L_{rung}$=270 µm, $W_{rung}$=120 µm, $S_{rung}$=50 µm, $W_{stringer}$=140 µm, $T_{core}$=5 µm, and assuming the planar magnetic cores and couplers contain a Co/Zr/Ta (CZT) magnetic material in a laminated configuration. According to the simulation the four coupled inductors are capable of delivering a current density of 11 A/mm². With variations on core materials the inductor may maintain its current density to at least 800 MHz. The total area of the simulated core is 0.35 mm², a size that is eminently suitable to integrate into the BEOL of a semiconductor IC. The arrangement of the planar cores and their coupling together with the outside windings scheme allow the kind of energy density performance which makes such inductors small enough to integrate into the BEOL of VLSI ICs, while delivering the necessary currents needed for the operation of the ICs at the desired voltage levels.

General trends to find optimal parameter values for the coupled magnetic cores may depend on the following. Increasing $W_{rung}$ will reduce the reluctance for magnetic flux in the core at the expense of winding length, which would increase DC resistance. $S_{rung}$ is desired to be as small as possible in order to maximize coupling between adjacent cores. However, this space must be large enough to accommodate the winding which will be placed between the rungs. Reducing $L_{rung}$ reduces the magnetic path length and increases inductance at the expense of winding wire cross section, which increases DC resistance of the winding. Increasing $W_{stringer}$ helps to improve coupling between cores, but with diminishing effect, while it consumes more total area and hence reduces current density.

FIG. 2B also indicates that it may be advantageous, and in representative embodiments of the disclosure it may be done so, to form the planar magnetic cores 11 and the planar couplers 111 with the same chemical composition. In this manner the planar magnetic cores 11 and the planar couplers 111 are becoming differing portions of a single planar structure, as the one depicted in FIG. 2B.

Embodiment of the present invention may depend on a coupled multi-core planar inductor design with windings on the outside of the cores. Such an inductor design affords high efficiency even at sufficiently high current densities that the inductor can be made small enough to offer the possibility of full integration into a semiconductor IC wiring network. The proper planar shape of the cores further aids with the integration. Any and all optimizations and final dimensions of such an inductor design are within the scope of the embodiments of the instant disclosure.

Figure 3A:
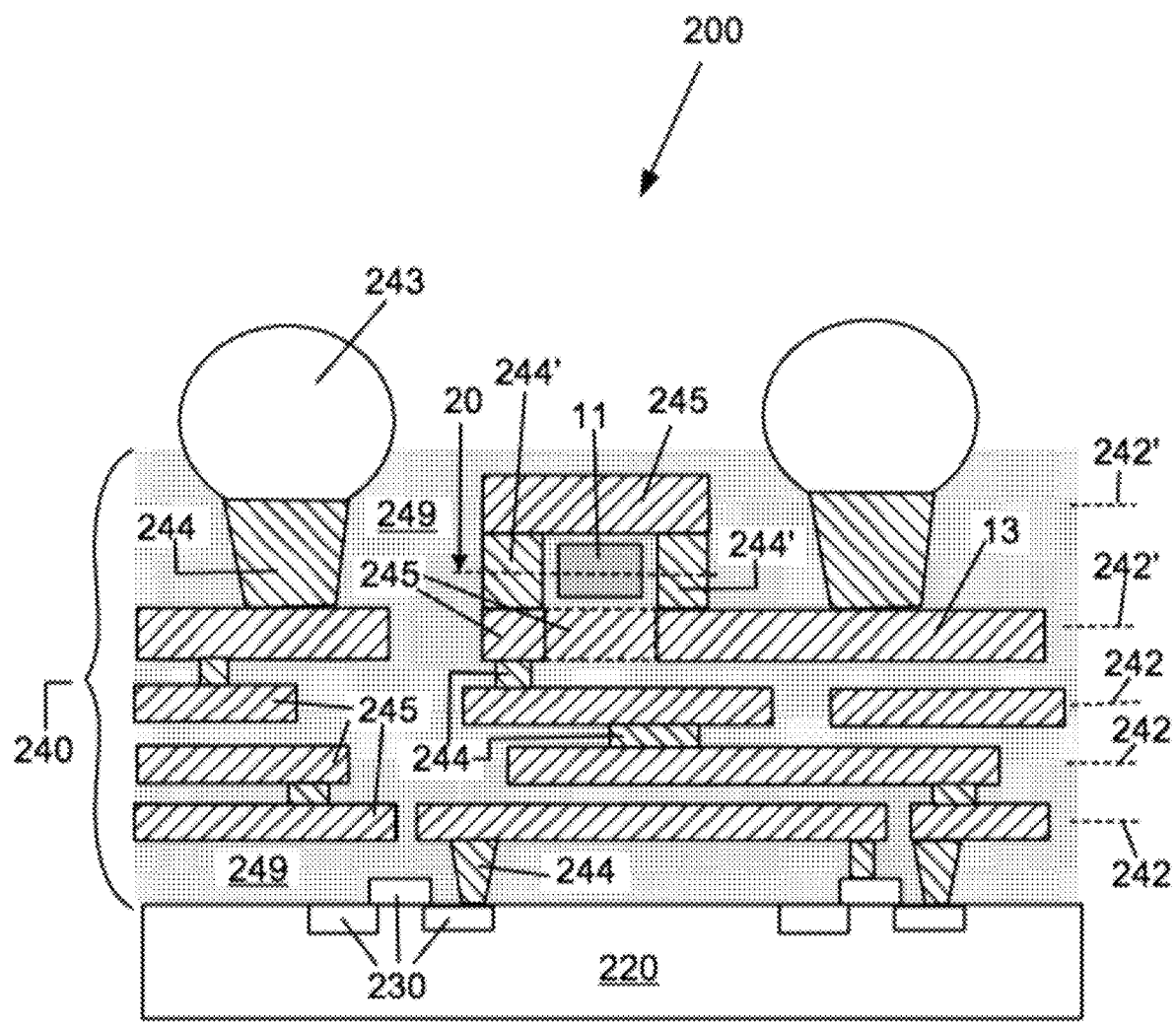

FIGS. 3A-3D show schematic cross-sectional views of planar magnetic core inductors integrated into multilevel wiring networks according to various embodiments of the disclosure. FIG. 3A is a schematic cross-sectional view of the integration 200 of an inductor into the multilevel wiring network, or back end of the line (BEOL), of a semiconductor IC. The figure shows symbolically represented circuit components 230, such as CMOS devices, have been processed on a semiconductor substrate 220. The devices may be any kind, planar or three dimensional FinFET type, and the substrate, as well, any kind, bulk, SOI, Si based, or some other semiconductor based, without limitation. Pertaining to the same die, and over the semiconductor substrate 220 and the components 230, a multilevel wiring network 240 has been fabricated. In some embodiments, the inductor and at least a portion of the multilevel wiring network 240 for a transformer, a power converter, and/or a microprocessor.

The multilevel wiring network 240 is arranged into wiring planes 242. FIG. 3A depicts 5 wiring planes 242 but without limitation on any actual number of planes. Each wiring plane 242 contains wire segments 245. Electrical connections between wiring segments 245 of differing wiring planes 242 are provided by VIAs 244. Also shown are typical IC chip contact structures 243, usually referred to in the art as C4 contacts, but any other contacts for the chip's external communication are acceptable without limitation. The spaces in the wiring network 240 are typically filled with a dielectric insulating material 249, of which quite a few are known in the art, one of them may be $SiO_2$.

The schematic depiction of FIG. 3A show an inductor with a single planar magnetic core 11 integrated 200 into the multilevel wiring network 240. The principal plane 20 of the planar magnetic core 11 is substantially parallel with the wiring planes 242. The conductive winding of the inductor, forming a general spiral on the outside of the planar magnetic core 11 is piecewise constructed of wire segments 245 and of VIAs 244. The wire segments 245 forming the winding pertain to at least two of the wiring planes 242' and the VIAs 244' that form the parts of the windings that are vertical to the principal plane 20 are interconnecting the at least two wiring planes 242'. The wire segment underneath the planar magnetic core 11 is delineated with dashed lines indicating that, depending how the winding spirals are constructed, it may not be visible in the depicted cross-sectional plane. A possible lead 13 to the windings is also shown.

Considering the discussion with reference to FIG. 2B, where in the shown example the 4 core planar magnetic inductor was only 0.35 mm², and that a semiconductor IC die is typically several square millimeters, the fitting of the inductors in the embodiments of the instant invention into the planes of a wiring network poses no difficulty.

In state of the art semiconductor ICs the multilevel wiring network 240 typically uses Cu for wire segments and VIAs, and it is fabricated with a dual damascene technique, as known in the art. Since the planar magnetic core 11 is manufacturable with usual semiconductor processing methods, for instance, sputtering, or electroplating, its integration may be seamlessly included into the BEOL processing.

Figure 3B:
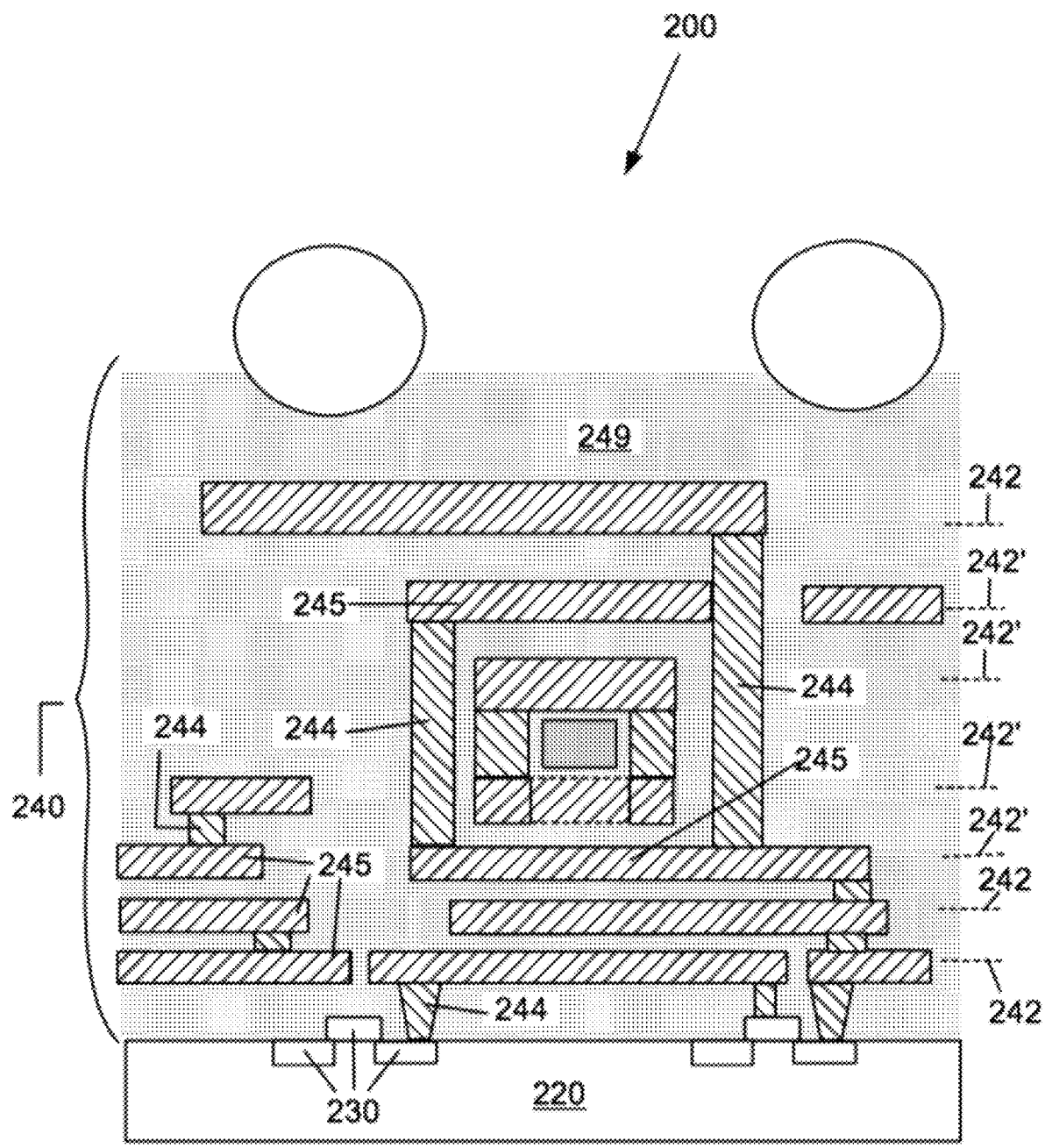

FIG. 3B is a schematic cross-sectional view of the integration 200 of an inductor into the multilevel wiring network, or BEOL, of a semiconductor IC in a variant embodiment. The difference compared to FIG. 3A is that FIG. 3B shows a wiring network with more planes, 7, and not only 2, but in the depicted case 4, wiring planes 242' are contributing wiring segments for the windings of the planar core 11. Such arrangements may be useful for some inductor applications, and pose no difficulty for the BEOL processing to achieve.

Figure 3C:
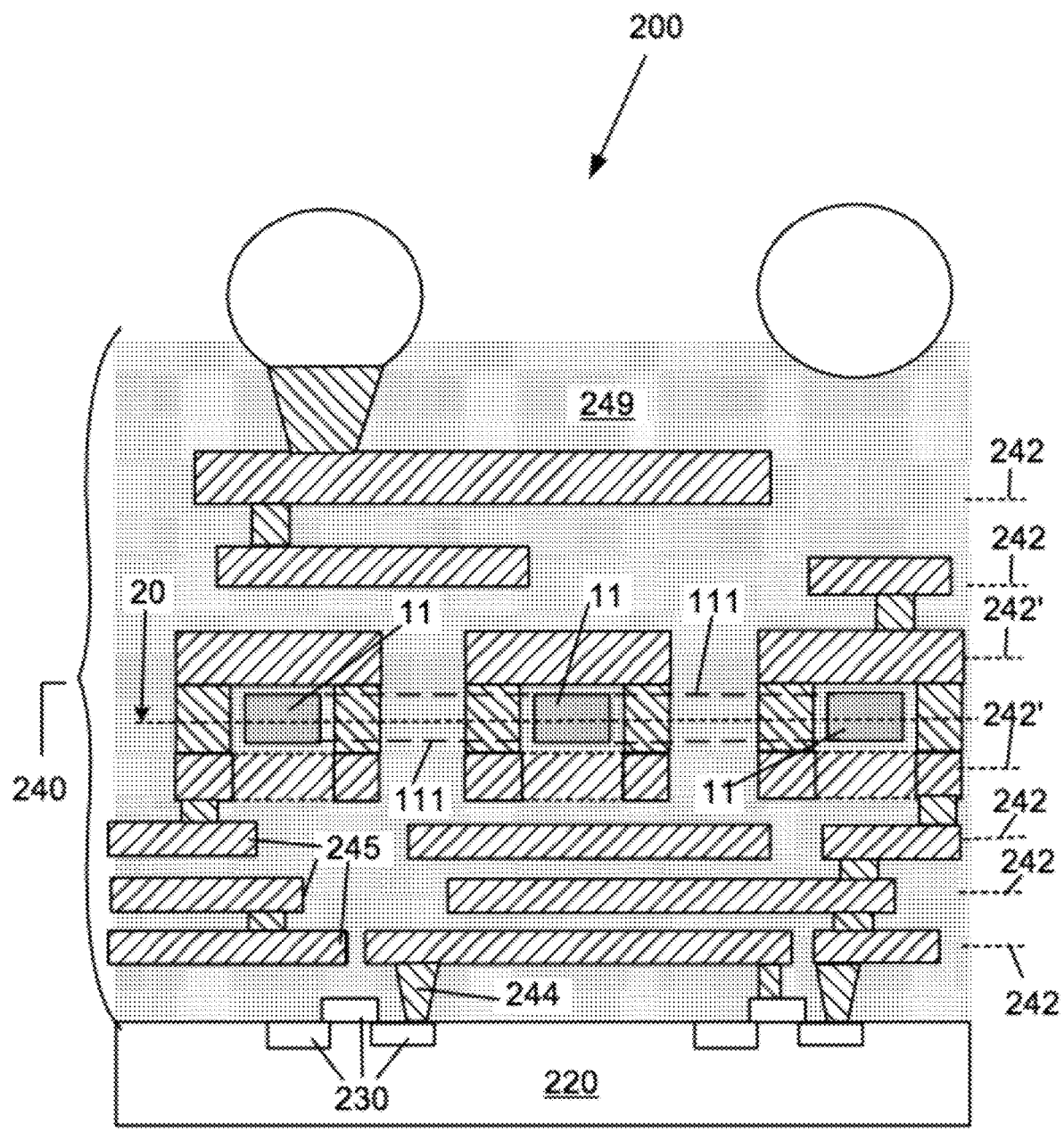

FIG. 3C is a schematic cross-sectional view of the integration 200 of a multi-core inductor into the multilevel wiring network, or BEOL, of a semiconductor IC. Considering the discussions and notations in reference to FIGS. 3A and 3B that carry over to FIG. 3C, only a brief explanation is given here. An integration of a three-core planar magnetic core 11 inductor between two wiring planes 242' is shown as another embodiment of the instant disclosure. The magnetic coupler 111 is indicated between dashed lines because obviously it would not be visible in the presented cross-sectional view.

Figure 3D:
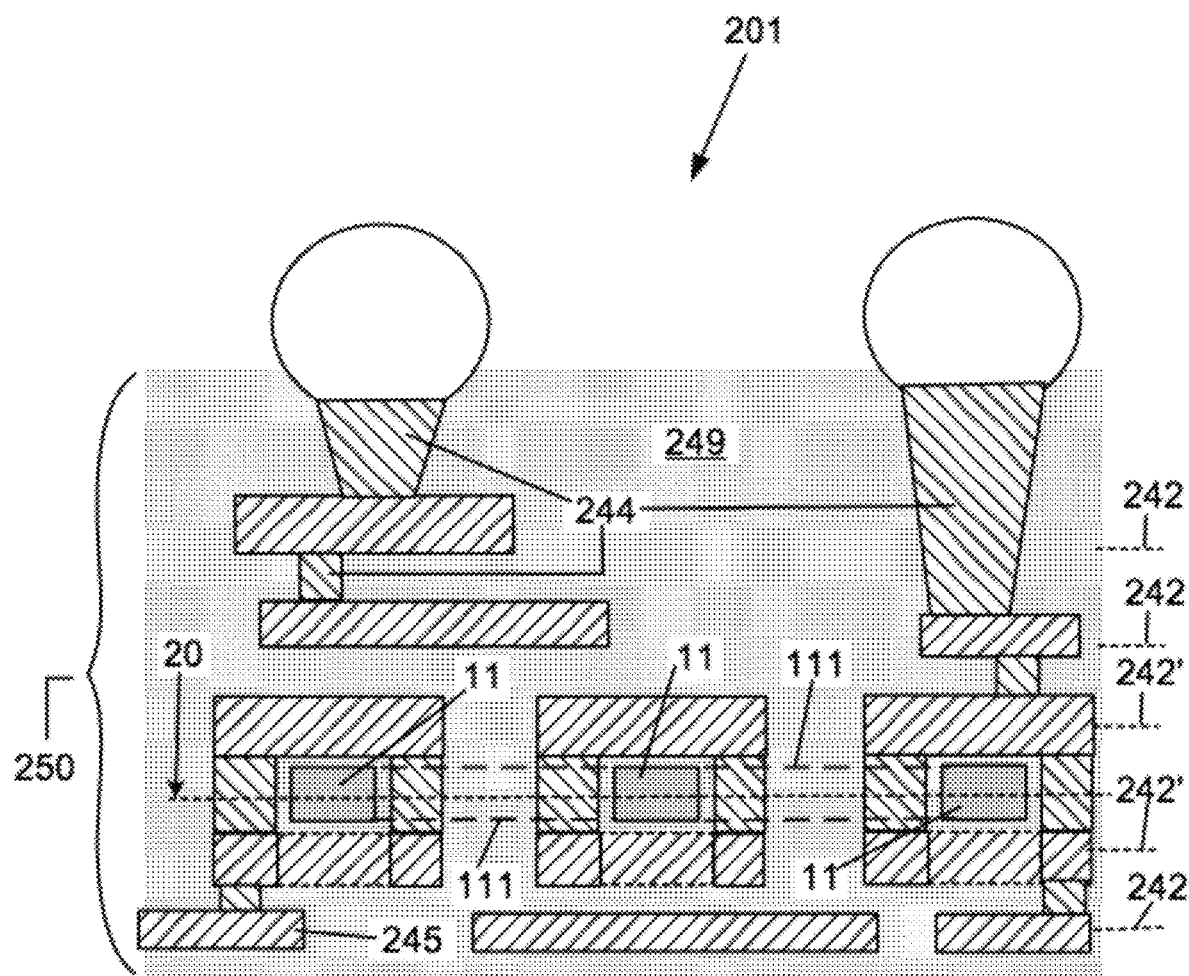

FIG. 3D is a schematic cross-sectional view of the integration 201 of a multi-core inductor into the wiring planes of a multilevel wiring network. The inductor may be integrated into the wiring planes 242, 242' of a multilevel wiring network 250 when that wiring network does not pertain to a semiconductor IC. If the need arises, the inductor in the embodiments of the instant invention may be integrated in a wiring network of some sort chip auxiliary to a semiconductor IC. Such auxiliary chip may be an interposer, between a power supply and a semiconductor IC. Or, maybe a power supply chip delivering power through contacts to a semiconductor IC. Such auxiliary chip may also be a chip containing some components for an analog circuit. Any and all such structures and their applications are within the scope of the embodiments of the present invention, where the inductor is integrated into the wiring planes 242, 242' of a multilevel wiring network 250. Here too, the integration of a three-core planar magnetic core 11 inductor between two wiring planes 242' with magnetic coupler 111 outside plane of the figure is shown. Such multilevel wiring network 250 arranged into wiring planes may be supported by any and all type of substrates, or it may be completely free standing by itself. Because of the possibility of so many variations no one particular substrate is shown in the figure. FIG. 3D shows C4 contacts, but these are optional, as well.

FIGS. 4A-4C show schematic cross-sectional views of steps in the integration of a planar magnetic core into a multilevel wiring networks according to an embodiment of the disclosure. Considering the planar configuration of the magnetic cores and couplers and that the winding is applied on the outside of the cores, there are several possible ways to integrate the inductor into a multilevel wiring network. The term "integration" is used throughout herein with its customary meaning of bringing together, incorporate into a whole, to be part of the whole, etc.

As already stated earlier, multilevel wiring networks for state of the art semiconductor ICs typically are fabricated by a dual damascene process. This process is well known in the art therefore it will not be discussed here in detail. The dual damascene process is particularly suitable for the integration of the planar magnetic cores and couplers. For representative embodiments of the disclosure the planar magnetic cores and couplers are integrated into the BEOL as part of a dual damascene process. FIGS. 4A-4C depict by way of an example the integration of one core into the multilevel wiring network of a semiconductor IC. Integration of multi-cores with couplers would follow in obvious manner from the process of the depicted example of a single core integration.

FIG. 4A shows the stage when the double damascene processing of the multilevel wiring network reached a point of having a planarized surface, with wiring segments of the last the wiring plane 242' still exposed at the top. The next step in a standard dual damascene process would be to deposit a layer of the insulating material 249 over the last wiring plane of sufficient thickness to accommodate the height of the VIAs that will connect to the next higher wiring level. For the case of integrating a magnetic core into the multilevel wiring network of the instant invention, one also deposits a layer of the insulating material 249' as shown in FIG. 4B, but one that is only a portion of the eventual full thickness. The magnetic core 11 is then fabricated on the top of this partial thickness insulator layer 249' to its proper location. FIGS. 4B-4C show only the top part of the multilevel wiring network where the integration takes place. It is understood that the bottom part is unchanging and it is the same as that of FIG. 4A.

FIG. 4C shows the state of integration progressed further. After having completed the fabrication of the magnetic core 11, the insulator layer 249 with further deposition is completed to its needed thickness to accommodate the VIAs. During this further deposition the core 11 is buried into this last layer of the insulator. Next, following now again the standard double damascene processing VIA holes 244' are patterned into the last layer of the insulator. Amongst the many VIA holes at this level, there are those 244' that will be filled with VIAs that will be part of the inductor's winding, as shown in FIG. 4C. From here on, it is standard double damascene processing, VIA filling next, followed by further levels, and so on, finally with contacts such as C4s. Having performed these steps, one arrives at the structure depicted in FIG. 3A: the completed BEOL with the planar magnetic core 11 having been integrated. It is understood that the insulator level that contains the planar magnetic core 11 is made of the right thickness to have the winding—made up of wire segments and VIAs—with the desired separation from the core.

FIGS. 4A-4C have shown, by way of example, integration of the inductor into the steps of a dual damascene process. It is understood that the planar structure of the core and the outside the core winding scheme allows integration of into the processing steps of practically any BEOL technique, such as single damascene, electroplating, and others.

FIG. 5 symbolically depicts a processor with a device that uses a planar magnetic core inductor according to an embodiment of the disclosure. The term processor is used in the broadest sense; encompassing any kind of computing device, including, but not limited to mainframes, supercomputers, servers, personal computers, mobile devices, handheld devices, battery powered computer devices, imbedded processors, and others. The processor 300, includes a semiconductor integrated circuit 270. The semiconductor integrated circuit 270 operates with a plurality of DC supply voltages. The plurality of such DC supply voltages may range between 2 to 10. The processor 300 has a DC to DC voltage converter 260, which delivers at least one of the DC supply voltages for the semiconductor integrated circuit 270. The whole of the DC to DC voltage converter 260 may, or may not, be fully integrated into the semiconductor integrated circuit 270, but an inductor 170 that is part of the DC to DC voltage converter 260 is fully integrated into the multilevel wiring network of the semiconductor integrated circuit 270. The circle symbolizing the DC to DC converter 260 in FIG. 5 would imply that the whole of the DC to DC converter 260 is not integrated into the semiconductor integrated circuit 270, but this is for example only nor for limitation.

The inductor 170 includes a planar magnetic core and a conductive winding, with the conductive winding turning around in generally spiral manner on the outside of the planar magnetic core. The multilevel wiring network may be arranged into wiring planes that are parallel with a principal plane of the planar magnetic core. The conductive winding may be piecewise constructed of wire segments and of VIAs, in a manner that the wire segments pertain to at least two of the wiring planes and the VIAs are interconnecting the at least two wiring planes. The planar magnetic core of the inductor 170 may have multiple cores coupled to each other in a ladder like manner.

FIG. 6 is a cross-sectional view of the laminated composition of planar magnetic core 11 according to an embodiment of the disclosure. The laminated configuration includes at least one layer of a magnetic material 410 and at least one non-magnetic layer 420. The purpose of the non-magnetic layer 420 is to prevent electrical current circulation in the planar magnetic core perpendicularly to the principal plane 20, which principal plane is parallel with the lamination layers. In a typical embodiment of the disclosure the magnetic core 11 may contain an alternating sequence of up to 100 layers each, more typically between 2 to 50 periods of the layers. FIG. 6 shows 3 periods of the layers, 3 magnetic ones 410 and 3 non-magnetic ones 420.

By way of example, without intent of limiting, the magnetic layer 410 may be of CZT, or $Co_xZr_yTa_{1-x-y}$, with x and y being approximately 0.915 and 0.04, respectively. In addition or in the alternative, the magnetic layer 410 can comprise a ferromagnetic alloy as described below (e.g., with respect to magnetic layer 710). The non-magnetic layer 420 itself may be composed of more than one constituent layers. Again, by way of example, these component layers may be an insulator layer 421, such as $SiO_2$ or $Co_xO_y$ (e.g., CoO), and a metal layer 422, such as Ta, Al, Cr, Ti and/or Zr. The purpose of the insulating layer 421 is to prevent electrical current circulation in the planar magnetic core perpendicularly to the principal plane 20. Such perpendicular currents are known in the art as Eddy currents, and they would lead to energy losses for the inductor. The purpose of the metal layer 422, such as Ta, may be to ease fabrication by smoothing the surface during deposition. The non-magnetic layer 420 may have structures and properties beyond those of simply having constituent layers. In some embodiments of the present invention the non-magnetic layer 420 may have current rectifying properties.

The sequential deposition of the various layers of the laminated structure may include some techniques known in the semiconductor processing arts, for instance, masking, sputtering, electroplating. The fabrication of the laminated magnetic cores may be done in the presence of an applied magnetic field to control the anisotropy and coercivity of the deposited magnetic layers 410 (or any other magnetic layer described herein). This applied magnetic field induces anisotropy of the deposited magnetic layers 410 which decreases their coercivity and thereby reduces power loss of the magnetic layers in the magnetic core 11. The orientation of the applied magnetic field may be parallel to the surface of the laminated magnetic core 11 (e.g., parallel to the principal plane 20 of the core 11). The applied magnetic field induces an "easy axis" of magnetization that aligns with the applied magnetic field, with the "hard axis" of magnetization assuming an orientation that is also parallel to the surface of the laminated magnetic core 11, and perpendicular to the "easy axis" of magnetization. The "hard axis" of magnetization exhibits a linear response, low coercivity, and high permeability, which are desirable for inductance enhancement. Therefore, the orientation of the applied magnetic field for inducing magnetic anisotropy is chosen with respect to inductor coil orientation so that the "hard axis" (e.g., hard axis 31) of magnetization is predominately (e.g., at least partially) aligned with the inductor coil axis (e.g., coil axis 32). For example, the hard axis of magnetization can be substantially parallel to (or at least partially aligned with) the inductor coil axis. In a specific example, the hard axis of magnetization and the inductor coil axis can be parallel to each other or the axes can intersect one another and form less than or equal to a 30° angle, including a 25° angle, a 20° angle, a 15° angle, a 10° angle, a 5° angle, or any angle or angle range between any two or the foregoing. Consequently, magnetic fields that are generated when an electrical current passes through the inductor coil are predominately aligned with the "hard axis," such that the inductor achieves linear response, low hysteretic loss, and large inductance enhancement.

The applied magnetic field may originate from either a permanent magnet and/or an electromagnet apparatus near the deposition substrate and this field is greater than any other magnetic fields originating from the magnet array(s) associated with magnetron sputtering or related apparatus as measured at the surface of the deposition substrate/deposited magnetic layer. The applied magnetic field originating from the permanent magnet and/or electromagnet apparatus may not quantifiably change the magnetic field originating from the magnet array(s) associated with magnetron sputtering or related apparatus. The permanent magnetic and/or the electromagnet apparatus can be in close proximity, preferably less than 1 mm and no more than 5 mm from the surface of the deposition substrate/deposited magnetic layer, such that the magnetic field originating from the permanent magnetic and/or the electromagnet apparatus is concentrated at the surface of the deposition substrate. The permanent magnet and/or electromagnet apparatus may be comprised either partially or entirely of the ferromagnetic materials iron, cobalt or nickel or some combination or alloy of any of these materials. The applied magnetic field strength may be in the range of about 20 Oe to about 20,000 Oe. As used herein, "about" means plus or minus 10% of the relevant value.

In a similar manner, magnetic anisotropy may be induced in the magnetic film after it is deposited by applying an external magnetic field ranging from about 20 Oe to about 20,000 Oe for a duration of about 30 minutes or more with the magnetic film at an elevated temperature ranging from about 200° C. to about 400° C. In such a "post deposition" magnetic anneal, the "easy axis" of magnetization will again assume the same orientation of the applied magnetic field.

Examples of methods of inducing magnetic anisotropy in a laminated magnetic core, including during deposition and post-deposition, are further described in U.S. Patent Application Publication 2015/0371756, U.S. Pat. Nos. 9,647,053, and/or 9,337,251, which are hereby incorporated by reference.

The thickness of the non-magnetic layers 420 may be in the range of about 5 nm to 100 nm, while the magnetic layer thickness 410 may be of 10 nm to 1000 nm, more typically between 50 nm to 500 nm. Of course, one may be able to apply other magnetic materials, such as Ni and Fe, and other layers, or means, to suppress Eddy currents. Embodiments of the present invention do not limit any of these choices.

Considering the nature of its materials and its structural requirements, representative embodiments of the invention may use differing general approaches for fabricating the planar laminated magnetic cores and couplers. A general approach may be centered on sputtering, another approach on electroplating.

FIG. 7 is a cross-sectional view of the laminated composition of planar magnetic core 11 according to another embodiment of the disclosure. The magnetic core 11 lies in a principal plane 770, which is parallel to the x-y plane as illustrated. The laminated configuration includes an alternating sequence of a magnetic layer 710 and a non-magnetic layer 720. The non-magnetic layer 720 includes an insulating layer 724 disposed between first and second interface layers 722, 726. The first and second interface layers 722, 726 are disposed adjacent to (e.g., in direct physical contact with) a respective magnetic layer 710. For example, in FIG. 7 the first interface layer 722 is disposed on a "lower" magnetic layer 710 and the second interface layer 726 is disposed below an "upper" magnetic layer 710. Of course, the magnetic core 11 illustrated in FIG. 7 can be disposed in other orientations where the relative terms "lower" and "upper" may not apply, but the layers would maintain the same relative positions with respect to each other.

A capping layer 730 is disposed on the last (or first or final) magnetic layer 711 on a first side 750 of the magnetic core 11, which is disposed further away from the substrate (e.g., semiconductor substrate 220) than a second side 760 of the magnetic core 11. An adhesion layer 740 is disposed below the last (or first or final) magnetic layer 712 on the second side 760 of the magnetic core 11. In FIG. 7, the first side 750 corresponds to the "top" side of the magnetic core 11 and the second side 760 corresponds to the "bottom" side of the magnetic core 11. As discussed above, the magnetic core 11 illustrated in FIG. 7 can be disposed in other orientations where the relative terms "top" and "bottom" may not apply, but the layers and sides would maintain the same relative positions with respect to each other.

The magnetic layers 710-712 can comprise the same materials as or substantially the same materials as magnetic layer 410. For example, magnetic layers 710-712 can comprise or can consist only of (or essentially of) CZT, e.g., $Co_xZr_yTa_{1-x-y}$, with x and y being approximately 0.915 and 0.04, respectively. In another example, the magnetic layers 710-712 can comprise or can consist only of (or essentially of) CoZrTa—B (or CoZrTaB), CoNiFe, NiFe, and/or CoFeB, or alloys that include any of the foregoing compounds. In yet another example, the magnetic layers 710-712 can comprise or can consist only of (or essentially of) a ferromagnetic alloy having an iron (Fe) composition of about 10 atomic % to about 90 atomic %, including about 20 atomic %, 30 atomic %, 40 atomic %, 50 atomic %, 60 atomic %, 70 atomic %, 80 atomic %, and any value or range between any two of the foregoing atomic compositions. In other words, about 10% to about 90% of the atoms in the ferromagnetic alloy are iron atoms. Examples of such a ferromagnetic alloy include CoFeB, CoFe, and combinations thereof. The atomic percentage of iron can provide a saturation magnetization of at least 1.5 T for the ferromagnetic alloy (and thus for magnetic layers 710-712), which can be useful to achieve a high saturation current for thin-film integrated power inductors. For example, an increase in the saturation magnetization (e.g., a 25% increase in saturation magnetization, such as from 1.2 T to 1.5 T) can provide a proportional or approximately equal increase (e.g., about 25%) in inductor saturation current. In addition or in the alternative, the atomic percentage of iron in the ferromagnetic alloy can provide a coercivity of less than or equal to 1.0 Oe, which can be useful to achieve low power loss when the magnetic layers 710-712 are exposed to an alternating magnetic field. For example, a coercivity of less than or equal to 1.0 Oe can achieve a power loss of less than 10 mW in a representative 5 nH inductor (e.g., in an inductor that includes magnetic layers 710-712 that comprise a ferromagnetic alloy having an atomic iron composition of about 10 atomic % to about 90 atomic %, as discussed above) driven by a 200 MHz AC current stimulus of 1 A in amplitude.

In some embodiments, the ferromagnetic alloy can include one or more ferromagnetic materials other than iron, such as cobalt or nickel, which can balance magnetostriction. For example, the materials can be combined (e.g., one or more materials or elements can have a positive magnetostriction value and/or a positive magnetostriction coefficient and one or more materials or elements can have a negative magnetostriction value and/or a negative magnetostriction coefficient) so that the ferromagnetic alloy has approximately a net 0 magnetostriction. In addition or in the alternative, the ferromagnetic alloy can include one or more non-magnetic elements such as boron, tantalum, chromium, cobalt, titanium, or zirconium to increase the electrical resistivity of the material. For example, incorporating boron into CoZrTa can increase the electrical resistivity of the material by about 15% (e.g., from about 100 μΩ to about 115 μΩ) while maintaining the same or similar (e.g., within about 10%) magnetic properties of the material.

The materials that form magnetic layers 710-712 can be anisotropic magnetic materials and/or can be manufactured as (e.g., induced to become) anisotropic magnetic materials that have hard and easy axes of magnetization that are permanent or semi-permanent. In some embodiments, the materials that form magnetic layers 710-712 can have an easy axis of magnetization that is parallel to the "x" axis and a hard axis of magnetization that is parallel to the "y" axis, as illustrated in FIG. 7, such that the hard axis of magnetization is substantially in parallel with the magnetic field 30.

The interface layers 722, 726 can comprise a metal such as tantalum, aluminum, chromium, cobalt, titanium, and/or zirconium. In addition or in the alternative, the interface layers 722, 726 can comprise a semiconducting material such as silicon. The capping layer 730 and the adhesion layer 740 can comprise any of the materials (e.g., metals and/or semiconducting materials) discussed above with respect to interface layers 722, 726. In some embodiments, the interface layers 722, 726, the capping layer 730, and/or the adhesion layer 740 comprise the same material(s). In addition, the interface layers 722, 726, the capping layer 730, and/or the adhesion layer 740 can have the same thickness or height. The thickness or height of each layer can be measured with respect to an axis that extends orthogonally from the first side 750 to the second side 760 of the magnetic core 11. For example, the interface layers 722, 726, the capping layer 730, and/or the adhesion layer 740 have a thickness or height of about 1 angstrom to about 500 angstroms, including about 100 angstroms, about 200 angstroms, about 300 angstroms, about 400 angstroms, and/or any value or range between any two of the foregoing thicknesses or heights.

The interface layers 722, 726, the capping layer 730, and/or the adhesion layer 740 can reduce the magnetic coercivity of the magnetic layers 710-712 to thereby reduce power loss in the magnetic core 11 when it is exposed to an alternating magnetic field. For example the interface layers 722, 726, the capping layer 730, and/or the adhesion layer 740 can (1) reduce roughness (e.g., to a root mean squared roughness of less than or equal to 20 angstroms) at the interface between the magnetic layers 710-712 and the non-magnetic layer 720 because roughness at this interface layer increases the coercivity of the magnetic layers 710-712; (2) prevent or inhibit diffusion of oxygen and/or nitrogen from the insulating layer 724 into the magnetic layers 710-712 (e.g., the corresponding neighboring magnetic layer(s)) because such diffusion allows for the formation of other defects and material compounds that can increase the magnetic coercivity of the magnetic layers 710-712; or (3) getter (e.g., have an affinity for, to react with for the formation of material compounds) trace impurities such as oxygen and/or nitrogen in the magnetic layers 710-712, that may be incorporated unintentionally through the fabrication process, that may increase the magnetic coercivity of the magnetic layers 710-712. In a specific example, the inclusion of the interface layers 722, 726 can reduce the magnetic coercivity of the magnetic layers 710-

712 in the magnetic core 11 by greater than 0.1 Oe relative to a magnetic core that does not include interface layers 722, 726.

The insulating layer 724 can comprise a compound of the material(s) that comprise(s) the interface layers 722, 726 and oxygen and/or nitrogen. For example, the insulating layer 724 can comprise a compound of (a) one or more metals that form the interface layers 722, 726 (e.g., tantalum, aluminum, chromium, cobalt, titanium, and/or zirconium) and (b) oxygen and/or nitrogen. In a specific example, the interface layers 722, 726 can comprise tantalum, aluminum, chromium, cobalt, and/or titanium and the insulating layer 724 can comprise, respectively, (a) tantalum nitride ($Ta_xN_y$ such as TaN) and/or tantalum oxide ($Ta_xO_y$ such as $Ta_2O_5$), (b) aluminum nitride ($Al_xN_y$ such as AlN) and/or aluminum oxide ($Al_xO_y$ such as $Al_2O_3$), (c) chromium oxide ($Cr_xO_y$ such as CrO or $Cr_2O_3$), (d) cobalt oxide ($Co_xO_y$ such as CoO, $Co_2O_3$, or $Co_3O_4$), and/or (e) titanium dioxide ($Ti_xO_y$ such as TiO, $TiO_2$, or $Ti_2O_3$), where the atomic composition of (x) tantalum, aluminum, and/or titanium and (y) nitrogen and/or oxygen (i.e. the ratio of Ta, Al, Cr, Co, and/or Ti atoms to O and/or N atoms) in the deposited material can be the energetically-favorable composition as determined by the deposition method (e.g., reactive sputtering) for fabrication of the interface layers 722, 726 and insulating layer 724.

In another example, the insulating layer 724 can comprise a compound of one or more semiconductor materials that form the interface layers 722, 726 (e.g., silicon) and oxygen and/or nitrogen. In a specific example, the interface layers 722, 726 can comprise silicon and the insulating layer 724 can comprise silicon nitride ($Si_xN_y$, such as SiN or $Si_3N_4$) and/or silicon oxide ($Si_xO_y$, such as $SiO_2$).

The insulating layer 724 has a volume or bulk resistivity of at least 1,000 μΩ-cm to block or minimize eddy currents that would form in the core 11 in the presence of an alternating magnetic field. The thickness or height of the insulating layer 724 can be measured with respect to an axis that extends orthogonally from the first side 750 to the second side 760 of the magnetic core 11. For example, the thickness or height of the insulating layer 724 can be about 10 angstroms to about 1,000 angstroms, including about 100 angstroms, about 200 angstroms, about 300 angstroms, about 400 angstroms, about 500 angstroms, about 600 angstroms, about 700 angstroms, about 800 angstroms, about 900 angstroms, and/or any value or range between any two of the foregoing thicknesses or heights. In some embodiments, the insulating layer 724 has a root mean squared roughness of less than or equal to 20 angstroms, which can reduce the coercivity of the adjacent magnetic layer (e.g., magnetic layer 710, 711, or 712) deposited above the insulating layer 724.

The sequential deposition of the various layers of the laminated structure may include some techniques known in the semiconductor processing arts, for instance, masking, sputtering, electroplating. The fabrication of the laminated magnetic cores may be done in the presence of an applied magnetic field to align the easy axis of magnetization of the deposited magnetic layers 710-712. This applied magnetic field aligns (or at least partially aligns) the easy axis of magnetization (i.e. induces anisotropy) of the deposited magnetic layers with the applied magnetic field and the hard axis of magnetization with the coil orientation on the wafer which decreases the coercivity of the magnetic layers and thereby reduces power loss of the magnetic layers in the magnetic core. The orientation of the applied magnetic field may be parallel to the surface of the laminated magnetic core. The applied magnetic field may originate from either a permanent magnet and/or an electromagnet apparatus near the deposition substrate and the applied magnetic field is greater than any other magnetic fields originating from the magnet array(s) associated with magnetron sputtering or related apparatus as measured at the surface of the deposition substrate/deposited magnetic layer. The applied magnetic field originating from the permanent magnet and/or electromagnet apparatus may not quantifiably change the magnetic field originating from the magnet array(s) associated with magnetron sputtering or related apparatus. The applied magnetic field may be generated in close proximity, preferably less than 1 mm and no more than 5 mm. from the surface of the deposition substrate/deposited magnetic layer. In some embodiments, the applied magnetic field can be generated from a permanent magnetic film that is disposed beneath the substrate (e.g., on the wafer chuck) in the magnetic material deposition chamber. The permanent magnet and/or electromagnet apparatus may be comprised either partially or entirely of the ferromagnetic materials iron, cobalt or nickel or some combination or alloy of any of these materials. The applied magnetic field strength may be in the range of 20 Oe to 20,000 Oe.

In addition or in the alternative, the laminated magnetic core 11 may be subjected to an external magnetic field, after the layers of core 11 are deposited in a "post deposition" magnetic anneal, under controlled processing conditions for temperature and time to permanently or semi-permanently align (or at least partially align) the easy axis of magnetization with the external magnetic field and the hard axis of magnetization with the coil orientation on the wafer. For example, the external magnetic field can be applied for a duration of about 30 minutes or more with the magnetic film at an elevated temperature ranging from about 200° C. to about 400° C. The orientation of this external magnetic field may be parallel to the surface of the laminated magnetic core 11 (e.g., parallel to principal plane 20). The external magnetic field strength may be in the range of 20 Oe to 20,000 Oe.

Additional details of inducing magnetic anisotropy in a laminated magnetic core are described herein and in the patents and patent publications that are incorporated by reference, including U.S. Patent Application Publication 2015/0371756, U.S. Pat. No. 9,647,053, and/or U.S. Pat. No. 9,337,251.

Considering the nature of its materials and its structural requirements, representative embodiments of the invention may use differing general approaches for fabricating the planar laminated magnetic cores and couplers. A general approach may be centered on sputtering, another approach on electroplating.

FIG. 8A illustrates a flow chart 80A of a method for sputter depositing the non-magnetic layers 720 of a planar magnetic core (e.g., core 11) according to an embodiment of the disclosure. In step 800, the semiconductor wafer or substrate is placed in a physical vapor deposition (PVD) chamber and high vacuum (HV) sputtering is started. In step 810, the first interface layer 722 is deposited via HV sputtering of an interface material that includes one or more metals and/or semiconductor materials, as discussed above. In step 820, a stream of gas (e.g., $O_2$ and/or $N_2$) that can react with the HV sputtered metal(s) and/or semiconductor material(s) is introduced into the PVD chamber.

In step 830, the insulating layer 724 is deposited via reactive sputtering where the gas the HV sputtered material form a molecular compound. For example, if the first interface layer is formed of tantalum and the gas stream includes nitrogen, reactive sputtering forms a tantalum nitride film as the insulating layer 724. Additional examples and combinations of interface layer materials and gasses are discussed above.

In step 840, the gas stream is stopped as the HV sputtering continues. As the remainder of the gas in the PVD chamber is consumed or depleted (i.e., via reactive sputtering), the second interface layer 726 is deposited in step 850. Once the second interface layer 726 is deposited, HV sputtering is stopped in step 860.

Since the same PVD chamber is used for steps 810 and 850 (in addition to the other steps in flow chart 80A), the first and second interface layers 722, 726 are formed out of the same material(s) and the insulating layer 724 is a compound (e.g., including nitrogen and/or oxygen) of the material(s) that form the first and second interface layers 722, 726. In addition, the use of the same PVD chamber for each step in flow chart 80A minimizes the total time required for deposition of non-magnetic layers 720.

FIG. 8B illustrates a flow chart 80B for a method of manufacturing an inductor according to an embodiment of the disclosure. In step 8000, a magnetic material is deposited over a semiconductor substrate (e.g., on an insulating layer) that includes at least a portion of a multilevel wiring network to form a magnetic layer (e.g., a first magnetic layer). The magnetic material can be any of the magnetic materials described herein, including the ferromagnetic alloy described above with respect to magnetic layers 710-712. The insulating layer can be disposed on one of the wiring planes of at least a portion of a multilevel wiring network, such as multilevel wiring network 240. In step 8010, a non-magnetic layer is deposited on the magnetic layer formed in step 8000. In some embodiments, step 8010 is performed according to flow chart 80A. In other embodiments, the non-magnetic layer is or comprises an electrically insulating layer (e.g., $SiO_2$), which can be deposited as known in the art. In step 8020, steps 8000 and 8010 are repeated up to 100 times each to form an alternating sequence of magnetic layers (formed in step 8000) and non-magnetic layers (formed in step 8010).

After step 8020 is complete, the flow chart 80B proceeds to step 8030 where a magnetic material is deposited on the last non-magnetic layer in the alternating sequence of magnetic layers and non-magnetic layers to form a final magnetic layer. The magnetic material that forms the final magnetic layer in step 8030 can be the same magnetic material that forms the magnetic layer in step 8000. The resulting structure following step 8030 is a magnetic member with a laminated configuration.

In some embodiments, the magnetic material deposited in steps 8000 (including repeating step 8000 in step 8020) and/or in step 8030 is deposited in the presence of an external or bias magnetic field of about 20 Oe to about 20,000 Oe to induce magnetic anisotropy in the corresponding magnetic layer, as described herein. The external magnetic field can induce an easy axis of magnetization in parallel with the external magnetic field as it passes through the substrate and a hard axis of magnetization that is orthogonal to the easy axis of magnetization. In addition, the external magnetic field can be configured so that the hard axis of magnetization is induced to be at least partially aligned with the axis of the conductive winding (formed in step 8050).

In some embodiments, the external or bias magnetic field can be generated by a permanent magnetic film that is disposed underneath the substrate. For example, the permanent magnetic film can be disposed on a wafer chuck in the magnetic film deposition chamber (e.g., in a PVD or CVD chamber) and the wafer/substrate can be placed on the permanent magnetic film. The permanent magnetic film can directly contact the underside of the wafer/substrate or a surface of the permanent magnetic film can be separated by about 1 mm to about 5 mm from a surface of the substrate/wafer.

In some embodiments, a permanent magnet can be positioned or placed proximal to the location where the substrate/wafer is deposited with magnetic material, such as proximal to the wafer chuck in the magnetic film deposition chamber. For example, a surface of the permanent magnet can be disposed about 1 mm to about 5 mm from a surface of the substrate/wafer when the substrate/wafer is disposed on the wafer chuck (or other location where the substrate/wafer is deposited with magnetic material).

Alternatively, the substrate/wafer can be exposed to an external magnetic field (e.g., of about 20 Oe to about 20,000 Oe) after the magnetic member with a laminated configuration is formed (e.g., following step 8030 or any step thereafter). While the substrate/wafer is exposed to the external magnetic field, the substrate/wafer is heated to about 200° C. to about 400° C. for at least 30 minutes. After the heating is complete, each magnetic layer in the magnetic member is induced to be permanently and/or semi-permanently anisotropic. For example, the hard axis of magnetization in each magnetic layer can be induced to be at least partially aligned with the axis of the conductive winding (formed in step 8050).

In step 8040, the magnetic member is masked and patterned to form a planar magnetic core. The masking and patterning can proceed as described herein and/or as known in the art. In step 8050, a conductive winding is formed around the planar magnetic core. The conductive winding can be piecewise constructed of wire segments and of VIAs as described herein.

In optional step 8060, a non-magnetic material is deposited below the first magnetic layer (i.e., formed in step 8000 prior to the repeating step 8020) and/or on the final magnetic layer formed in 8030. The non-magnetic material includes tantalum, aluminum, chromium, cobalt, titanium, zirconium, and/or a semiconductor material such as silicon. When the metal layer is deposited below the first magnetic layer, an adhesion layer, such as adhesion layer 740, is formed on the first magnetic layer. When the metal layer is deposited on the final magnetic layer, a capping layer, such as capping layer 730, is formed on the final magnetic layer.

FIGS. 9A-9B show schematic views of embodiments for fabricating laminated planar magnetic cores and couplers by sputtering. In general, HV sputtering is preferred. The approaches one may take differ depending on whether it is possible to etch the magnetic material and the non-magnetic layer with the same etchant. If there is no known common etchant, for instance, as in the case when the magnetic material is CZT and the non-magnetic layer comprises a $SiO_2$ layer, one may apply a negative masking resist and a liftoff process as known in the art. One stage in this process is schematically illustrated in FIG. 9A.

The planar magnetic core is to be fabricated onto the surface of a receiving platform 510. Such a receiving platform in typical embodiments of the instant invention would be the dielectric insulating material, 249' in FIG. 4B, in the multilevel wiring network of a semiconductor IC. A negative photoresist 511 has been disposed onto the receiving platform 510 patterned and opened up, preferably with an undercut, as shown in FIG. 9A. The layers of a magnetic material and the non-magnetic layer are alternatively disposed by sputtering 521, up to 100 layers each, but more typically between 2 to 50 layers each. The layers of the magnetic material may be 10 nm to 1000 nm thick, but more typically between 50 nm to 500 nm thick. The result is a magnetic member with a laminated configuration 550. After dissolving the masking material 511, which lifts off the unwanted portions of the magnetic member 550, the remaining portion of the magnetic member on the surface of the receiving platform 510 is of the proper shape to contain a planar magnetic core.

When all the layers of the laminated magnetic cores and couplers are etchable in the same process one may use HV sputtering with a positive photoresist, a stage of which is shown in FIG. 9B. The sputtering deposition and parameters of the layers of a magnetic material may proceed as discussed with reference to FIG. 9A. An insulating layer of the non-magnetic layer may be an oxide of Co, Ni, or Fe. Alternatively, the sputtering of the magnetic material may continue uninterrupted, but when an insulating layer is needed one introduces reactive oxygen sputter deposition and the insulating layer will be formed by an oxide of the magnetic material itself, such as CZT. In this embodiment, the magnetic member 550 is blanket formed over the receiving platform 510. When the sputtering deposition is finished, a masking layer is deposited and patterned 512 over the magnetic member. Next an etching step 531 is performed, which may be a wet etch or a dry etch. With the unwanted portions of the magnetic member 550 etched away, the remaining portion of the magnetic member on the surface of the receiving platform 510 is of the proper shape to contain a planar magnetic core. For the specific case of CZT magnetic layers with CoO insulating layers, a viable wet etchant may be based on hydrogen chloride (HCl) and/or nitric acid ($HNO_3$), while a dry etch process may use a plasma formed from a chlorine and/or fluorine gas.

In both approaches shown in FIGS. 9A and 9B respectively, the masking and patterning for the magnetic member is done in such a manner that a remaining portion of the magnetic member 550 includes a planar magnetic core, or a plurality of cores and possibly magnetic couplers.

Electroplating is an alternative process for fabricating the laminated magnetic cores and couplers. The advantage of electroplating is its simplicity coupled with being relatively inexpensive. The difficulty with the electroplating is that the current required for the plating should be able to flow through the already deposited material. Consequently, the insulating layers of the laminated material would stop the electrodeposition process by blocking the current needed for the deposition. Embodiment of the instant disclosure find the way around this problem by electrodepositing such non-magnetic layers that are rectifying, instead of being insulators. Current rectifying layers are also suitable to suppress Eddy currents in the core, since in order for Eddy currents to circulate they would have to cross the current rectifying layers from both direction, which the rectifying layers would prevent. On the other hand, if the direction of the plating current is chosen correctly, it may flow through the current rectifying layers.

Rectification may be included in the non-magnetic layers, for instance, based on Schottky diodes. Onto the magnetic material layer, one may electrodeposit the following sequence: a semiconducting layer—p-type with work function less than magnetic layer or n-type with work function greater than magnetic layer—; followed by an interface metal layer—with a work function less than that of p-type semiconducting material, or greater than that of n-type semiconducting material. Then, continue with the next magnetic material layer, and so on.

Alternatively, for rectification one may use a semiconductor p-n junction in the non-magnetic layer. Any semiconductor may be suitable, one would have to choose one based on several criteria, for example without limiting, the ease of contact to the magnetic material of the p and n portions, how narrow can one make the junction, and others.

FIG. 10 shows a schematic view of fabricating laminated planar magnetic cores and couplers by electroplating. The nature of the non-magnetic layers is as discussed above, and will not be repeated here. Same as with sputtering deposition, embodiments the planar magnetic core is to be fabricated onto the surface of a receiving platform 510. Such a receiving platform in typical embodiments of the instant invention would be the dielectric insulating material, 249' in FIG. 4B, in the multilevel wiring network of a semiconductor IC. Onto the receiving platform 510 one may deposit a conductive seed layer 542, for instance Al, Cu, or a magnetic alloy, such as, for instance, $Ni_xFe_{1-x}$ with x being approximately 0.45 to 0.80. A masking layer 513 is deposited over the conductive seed 542, and patterned to have an opening with the proper shape for cores and couplers. Next, the layers of a magnetic material and the non-magnetic layer are alternatively electrodeposited from the plating solution 555. Such electroplating solutions are known in the art. The electrodeposition may proceed for 100 layers each, but more typically between 2 to 50 layers each. The layers of the magnetic material may be 10 nm to 1000 nm thick, but more typically between 50 nm to 500 nm thick. All the while the conductive seed layer 542 completes a path 541 for the electrodeposition current. The layers, of course, will only deposit into the opening in the masking material since the masking material is an insulator. When the required number of layers have been deposited the masking layer 513 is removed and portion of the conductive seed layer 542 is exposed. Once the exposed portion of the conductive seed layer is removed, a planar magnetic formation 551 with a laminated configuration is left in place. Because of the masking 513 this magnetic formation 551 already includes at least one planar magnetic core, and possibly a plurality of cores, with couplers.

All of these various depositions processes are devised to serve a method which is characterized as fabricating a planar inductor suitable for integrating into a multilevel wiring network that is arranged into wiring planes.

FIG. 11 is a cross-sectional view of planar magnetic core 11 in which the thicknesses of the magnetic and non-magnetic layers are co-optimized for layer-to-layer magnetic flux closure, according to an embodiment of the disclosure. In FIG. 11, the core 11 includes an alternating sequence 1125 of magnetic layers 1110- and non-magnetic layers 1120. Magnetic layers 1110 can be the same as or substantially the same as magnetic layers 410 and/or 710-712. In addition, non-magnetic layers 1120 can be the same as or substantially the same as non-magnetic layer 420 and/or 720. As in magnetic layers 710-712, the materials that form magnetic layers 1110 can be anisotropic magnetic materials and/or can manufactured as (e.g., induced to become) anisotropic magnetic materials that have hard and easy (or soft) axes of magnetization that are permanent or semi-permanent. In some embodiments, the materials that form magnetic layers 1110 can have an easy axis of magnetization that is parallel to the "x" axis and a hard axis of magnetization that is parallel to the "z" axis, as illustrated in FIG. 11, such that the hard axis of magnetization is substantially in parallel with the magnetic field 30.

The thicknesses or heights (in general, thicknesses) of magnetic layers 1110 and non-magnetic layers 1120 are co-optimized for layer-to-layer magnetic flux closure, as indicated by magnetic flux lines 1100 in magnetic layers 1110-1113. To promote layer-to-layer magnetic flux closure, the thicknesses of magnetic layers 1110 and non-magnetic layers 1120 can be selected so that the magnetization energy for the layer-to-layer flux closure state is lower than the magnetization energy for the "in-layer" flux closure state, which can cause formation of magnetic domain walls. In addition, the thickness of magnetic layers 1110 can be selected so that the magnetic flux lines 1100 passing through the magnetic layers 1110 are parallel to and/or substantially parallel to (e.g., within 10 degrees) to the easy axes of magnetization of magnetic layers 1110.

In some embodiments, magnetic layers 1110 have a thickness of about 100 angstroms to about 10,000 angstroms, including about 1,000 angstroms, about 2,000 angstroms, about 3,000 angstroms, about 4,000 angstroms, about 5,000 angstroms, about 6,000 angstroms, about 7,000 angstroms, about 8,000 angstroms, about 9,000 angstroms, and/or any value or range between any two of the foregoing thicknesses. In addition or in the alternative, non-magnetic layers 1120 have a thickness of about 10 angstroms to about 2,000 angstroms, including about 500 angstroms, about 1,000 angstroms, about 1,500 angstroms, and/or any value or range between any two of the foregoing thicknesses. The thicknesses of magnetic layers 1110 and non-magnetic layers 1120 can be measured with respect to the "z" axis, which is orthogonal to the principal plane 1170 of the core 11. The principal plane 1170 of the core 11 is parallel to the x-y plane as illustrated in FIG. 11.

It is noted that even when layer-to-layer flux closure occurs, it is still common to have some magnetic domain walls present within magnetic layers 1110. However, the number of domain walls is reduced relative to the case where magnetic flux is primarily closed within an individual magnetic layer. When layer-to-layer flux closure occurs, there are fewer domain walls present in each individual magnetic layer 1110 in the magnetic core 11. This is advantageous because (1) domain walls can move when the core is exposed to an alternating magnetic field which causes power loss and (2) domain patterns that form when magnetic flux is closed within individual magnetic layers can reduce the total volume of magnetic material that respond to alternating magnetic fields, consequently reducing the maximum achievable inductance.

An optional capping layer 1130 is disposed on (e.g., in direct physical contact with) a final magnetic layer 1111 on a first side 1150 of the magnetic core 11, which is disposed further away from the substrate (e.g., semiconductor substrate 220) than a second side 1160 of the magnetic core 11. The final magnetic layer 1111 is disposed on a last non-magnetic layer 1121 in the alternating sequence 1125 of magnetic layers 1110 and non-magnetic layers 1120. An optional adhesion layer 1140 is disposed immediately below (e.g., in direct physical contact with) the first magnetic layer 1112 on the second side 1160 of the magnetic core 11. The first magnetic layer 1112 is the first magnetic layer 1110 in the alternating sequence 1125 of magnetic layers 1110 and non-magnetic layers 1120. The capping layer 1130 and/or the adhesion layer 1140 can be the same as or substantially the same as the capping layer 730 and the adhesion layer 740, respectively. In addition, the last and first magnetic layers 1111, 1112, respectively, can be the same as magnetic layers 1110. Further the last non-magnetic layer 1121 can be the same as non-magnetic layers 1120. The last non-magnetic layer 1121 is disposed on (e.g., in direct physical contact with) the last magnetic layer 1113. The last magnetic layer 1113 is the last magnetic layer 1110 in the alternating sequence 1125 of magnetic layers 1110 and non-magnetic layers 1120. The last non-magnetic layer 1121 1113 is the last non-magnetic layer 1120 in the alternating sequence 1125 of magnetic layers 1110 and non-magnetic layers 1120.

FIG. 12 is an exploded perspective view of the top surface 1150 of the planar magnetic core 11 illustrated in FIG. 11. FIG. 12 further illustrates the magnetic flux lines 1100 as they pass in a first direction (i.e., from right-to-left in FIG. 12) through the final magnetic layer 1111 and in a second direction (i.e., from left-to-right) through the neighboring magnetic layer 1110. The magnetic flux lines 1100 that pass through the final magnetic layer 1111 extend to the neighboring magnetic layer 1110 as indicated by magnetic flux lines 1101. Likewise, the magnetic flux lines 1100 that pass through the neighboring magnetic layer 1110 extend to the final magnetic layer 1111 as indicated by magnetic flux lines 1102. Accordingly, the magnetic flux has a closed path through the final magnetic layer 1111 and the neighboring magnetic layer 1110. The magnetic flux lines 1100 are parallel or substantially parallel to (i.e., within 10 degrees) to the easy axis of magnetization and orthogonal to or substantially orthogonal to (i.e., within 10 degrees) the hard axis of magnetization when magnetic flux lines 1100 pass through the magnetic layers 1110, 1111.

FIG. 12 also illustrates magnetic flux lines 1103 that pass through the neighboring magnetic layer 1110 in a second magnetic flux closed path that extends through the magnetic layer (not illustrated) adjacent to (below) the neighboring magnetic layer 1110. The second magnetic flux closed path is parallel to the easy axis of magnetization and orthogonal to the hard axis of magnetization. The optional capping layer 1130 and the optional adhesion layer 1140 are not illustrated in FIG. 12 for clarity.

FIG. 13 is a cross-sectional view of planar magnetic core 11 that is further co-optimized for layer-to-layer magnetic flux closure, according to another embodiment of the disclosure. In FIG. 13, layer-to-layer magnetic flux closure is further optimized by using a similar unit thickness "UT" for all magnetic layers 1110 in the core 11 except for the final magnetic layer 1311 on the first side 1150 of the magnetic core 11 and the first magnetic layer 1112 on the second side 1160 of the magnetic core 11. The respective final and first magnetic layers 1311, 1312 are the same as the final and first magnetic layers 1111, 1112, respectively except their thickness is half of UT (i.e., UT/2). In other words, the magnetic layers 1110 are twice as thick as (or twice the unit thickness of) the final and first magnetic layers 1311, 1312, respectively. The final and first magnetic layers 1311, 1312 are half as thick as the other magnetic layers 1110 because they only need to close half of the magnetic flux 1100 from the adjacent magnetic layers 1313, 1314, respectively. The other half of the magnetic flux 1100 from the adjacent magnetic layers 1313, 1314 is closed by the adjacent magnetic layers 1110 on the opposite side of magnetic layers 1313, 1314. For example, the other half of the magnetic flux 1100 from magnetic layer 1313 is closed by magnetic layer 1315. This configuration reduces the energy associated with flux closure outside of the core 11 by reducing the magnetic flux closure path length.

The planar core 11 illustrated in FIG. 13 is otherwise the same as the planar core 11 illustrated in FIGS. 11 and 12.

FIG. 14 is a cross-sectional view of planar magnetic core 11 that is further configured for layer-to-layer magnetic flux closure, according to another embodiment of the disclosure. In FIG. 14, orthogonal non-magnetic layers 1420, 1422 and orthogonal magnetic layers 1410, 1412 are disposed along the lateral sides of core 11 (i.e., next to the core 11 in the "x" direction as illustrated in FIG. 14). The orthogonal non-magnetic layers 1420, 1422 and orthogonal magnetic layers 1410, 1412 extend vertically (i.e., in the "z" direction as illustrated in FIG. 14) from the first side 1150 to the second side 1160 of the core 11. The orthogonal non-magnetic layers 1420, 1422 and orthogonal magnetic layers 1410, 1412 are orthogonal to the laminations of magnetic layers 1110 and non-magnetic layers 1120 (e.g., they are orthogonal to the sequence 1125 of magnetic layers 1110 and non-magnetic layers 1120 illustrated in FIGS. 11-13) and to the principal plane 1170 of the core 11. Magnetic layer 1410 is disposed in a hole 1450 between first and second portions 1420A, 1420B of non-magnetic layer 1420. Magnetic layer 1412 is disposed in a hole 1452 between first and second portions 1422A, 1422B of non-magnetic layer 1422. The magnetic layers 1410, 1412 are configured and arranged such that each closed magnetic flux path passes through a portion of the orthogonal magnetic layers 1410, 1412 as illustrated by magnetic flux lines 1400. Accordingly, each closed magnetic flux path passes through two or more magnetic layers 1110 and through a portion of the orthogonal magnetic layers 1410, 1412, as illustrated by magnetic flux lines 1100, 1400.

Arrows 1401 illustrate an example of a magnetic flux path 1402 that passes through the final magnetic layer 1111, orthogonal magnetic layer 1412, magnetic layer 1110, and orthogonal magnetic layer 1410. The magnetic flux path 1402 is parallel to the "x" axis, but in opposite directions, in magnetic layers 1111 and 1110. The magnetic flux path 1402 extends in orthogonal directions, parallel to the "z" axis, in orthogonal magnetic layers 1412, 1410. The magnetic flux path 1402 is in the negative "z" direction (e.g., down) in orthogonal magnetic layer 1412 and it is in the positive "z" direction (e.g., up) in orthogonal magnetic layer 1410. Thus, the magnetic flux path 1402 passes in opposite directions in magnetic layers 1110 and 1112, and in opposite directions in orthogonal magnetic layers 1410 and 1412.

The orthogonal magnetic layer(s) 1410 and/or 1412 can comprise the same material(s) as magnetic layers 1110. In addition or in the alternative, the orthogonal non-magnetic layers 1420 and/or 1422 can comprise the same material(s) as non-magnetic layers 1120. In some embodiments, the orthogonal magnetic layer(s) 1410 and/or 1412 can include anisotropic magnetic materials and/or can include materials that are manufactured as (e.g., induced to become) anisotropic magnetic materials that have hard and easy (or soft) axes of magnetization that are permanent or semi-permanent (e.g., as described herein). In some embodiments, the materials that form orthogonal magnetic layer(s) 1410 and/or 1412 have an easy axis of magnetization that is parallel to the "z" axis so that the magnetic flux lines 1400 (e.g., magnetic flux path 1402) that pass through the orthogonal magnetic layers 1410 and 1412 are parallel to and/or substantially parallel to (i.e., within 10 degrees) the easy axis of magnetization of orthogonal magnetic layer(s) 1410 and/or 1412. Likewise, the materials that form magnetic layer(s) 1110 and/or 1111 can have an easy axis of magnetization that is parallel to the "x" axis so that the magnetic flux lines 1100 (e.g., magnetic flux path 1402) that pass through the magnetic layers 1110 and 1111 are parallel to and/or substantially parallel to (i.e., within 10 degrees) the easy axis of magnetization of magnetic layer(s) 1110 and/or 1111.

It is noted that non-idealities in the manufacturing process, such as wet-etch undercut, can result in sloped "sidewalls" (i.e., the lateral sides of the core 11 that are disposed adjacent portions 1420B and 1422A of non-magnetic layers 1420, 1422) for the core 11 that may cause the "orthogonal" magnetic layers 1410 and/or 1412 to reside in a plane that is not entirely parallel to the z-axis, but rather, in-plane with the corresponding sloped sidewall.

The heights of the orthogonal magnetic layers 1410, 1412 and the non-magnetic layers 1420, 1422 can be measured with respect to the "z" axis, which is orthogonal to the principal plane 1170 of the core 11. Likewise, the thickness or height of the core 11 can be measured with respect to the "z" axis. In some embodiments, the height(s) of the orthogonal magnetic layers 1410 and/or 1412 is equal to or approximately equal to (i.e., within 10%) the height of the core 11. In addition or in the alternative, the height(s) of the non-magnetic layers 1420 and/or 1422 can be equal to or approximately equal to (i.e., within 10%) the height of the core 11. In other embodiments, height(s) of any or all of the orthogonal magnetic layers 1410, 1412 and/or non-magnetic layers 1420, 1422 can be greater than the height of the core 11.

The planar core 11 illustrated in FIG. 14 is otherwise the same as the planar core 11 illustrated in FIGS. 11 and 12.

FIG. 15 is a cross-sectional view of planar magnetic core 51 that is further configured for layer-to-layer magnetic flux closure, according to another embodiment of the disclosure. Core 51 includes a combination of the features illustrated in FIGS. 11-14 to further promote layer-to-layer magnetic flux closure. Thus, core 51 includes magnetic layers 1110 having the same or similar thickness of UT and final and first magnetic layers 1111, 1112, respectively, having a thickness of UT/2, as described above with respect to FIG. 13. In addition, core 560 includes orthogonal non-magnetic layers 1420, 1422 and orthogonal magnetic layers 1410, 1412 that are disposed along the sides (or sidewalls) of core 51, as described above with respect to FIG. 14. In some embodiments, orthogonal magnetic layers 1410, 1412 can have a cross-sectional thickness 1500 (i.e., measured with respect to the "x" axis) of UT or UT/2.

FIG. 16 is a cross-sectional view of an inductor 1600 and first and second magnetic flux closure layers 1620, 1622 according to one or more embodiments. The inductor 1600 includes a planar core 1611 and a conductive winding 1612 that spirals around the outside of the planar core 1611. The core 1611 and conductive winding 1612 can be the same as or similar to any of the cores (e.g., core 11) and conductive windings (e.g., conductive winding 12) described herein.

First and second magnetic flux closure layers 1620, 1622 are magnetically coupled to the inductor 1600. The magnetic flux closure layers 1620, 1622 are formed of a magnetic material that can comprise the same material(s) as magnetic layers 1110. In addition, the magnetic materials that form the magnetic flux closure layers 1620, 1622 can be anisotropic magnetic materials and/or can manufactured as (e.g., induced to become) anisotropic magnetic materials that have hard and easy axes of magnetization that are permanent or semi-permanent. In some embodiments, the hard axis of magnetization of the magnetic flux closure layers 1620, 1622 is parallel to the "x" axis such that AC magnetic flux 1630 from the inductor 1600 passes through each magnetic flux closure layer 1620, 1622 in a direction that is parallel to (i.e., in the same direction or in the opposite direction as) the respective hard axis of magnetization of the magnetic flux closure layer 1620, 1622.

The first and second magnetic flux closure layers 1620, 1622 are not in direct physical contact with the core 1611 such that first and second gaps 1640, 1642 across dielectric insulating material 1649 are formed between the core 1611 and the first and second magnetic flux closure layers 1620, 1622, respectively. The size of the gaps 1640, 1642 can be adjusted to control the total magnetic reluctance along the inductor magnetic flux path. For example, a smaller gap distance (and/or larger gap cross-sectional area) can lower magnetic reluctance and can consequently increase inductance for the inductor 1600. In some embodiments, each gap 1640, 1642 is 100 µm or less, such that the distance between the first and second magnetic flux closure layers 1620, 1622 and the first and second sides 1650, 1660, respectively, of the core 1611 is 100 µm or less including about 30 µm, about 40 µm, about 50 µm, about 60 µm, about 70 µm, about 80 µm, about 90 µm, and any value or range between any two of the foregoing distances. In other embodiments, only one of the gaps 1640, 1642 is 100 µm or less. The distance between the first magnetic flux closure layer 1620 and the first side 1650 of the core 1611 is measured with respect to the "inner" surface of each layer 1620, 1650 that face each other (e.g., from the "bottom" of flux closure layer 1620 to the "top" of the first side 1650). Likewise, the distance between the second magnetic flux closure layer 1622 and the second side 1660 of the core 1611 is measured with respect to the "inner" surface of each layer 1622, 1660 that face each other (e.g., from the "top" of flux closure layer 1622 to the "bottom" of the second side 1660). The first side 1650 of the magnetic core 1611 is disposed further away from the substrate (e.g., semiconductor substrate 220) than the second side 1660 of the magnetic core 1611.

In addition or in the alternative, the length (measured with respect to the "x" axis) of each magnetic layer 1620 and 1622 and the core 1611 extends at least 20 µm beyond the conductive winding 1612 to reduce fringing of magnetic flux in the conductive winding 1612 interconnect (i.e., so the magnetic flux doesn't pass through the winding 1612 which can induce larger eddy current losses). FIG. 16 also illustrates that the length of the magnetic layers 1620, 1622 extend beyond (e.g., at least 20 µm beyond) the core 1611.

The first and second magnetic flux closure layers 1620, 1622 are disposed outside of the core 1611, for example above and below the conductive winding 1612. In some embodiments, the second magnetic flux closure layer 1622 is disposed between the conductive winding 1612 and any lower interconnect and/or semiconductor layers 1710 in the integrated circuit 1700 (as illustrated in FIG. 17) in order to provide a low magnetic reluctance path for closing the inductor magnetic flux such that the magnetic flux does not pass through the lower interconnect and/or semiconductor layers.

The first and second magnetic flux closure layers 1620, 1622 function as flux closure layers for the inductor 1600 as indicated by magnetic flux lines 1630. In other words, at least one magnetic flux path passes through a first magnetic layer (e.g., which can be the same as final magnetic layer 1111 in core 11) in the core 1611 and the first magnetic flux closure layer 1620, and/or at least one magnetic flux path passes through a second magnetic layer (e.g., which can be the same as first magnetic layer 1112 in core 11) in the core 1611 and the second magnetic flux closure layer 1622. Closing the magnetic flux path of the first and second magnetic flux closure layers 1620, 1622 can increase the inductance and power handling of inductor 1600 and can decrease the radiated magnetic flux from the inductor 1600. In some embodiments, a first magnetic flux path 1631 passes through a first magnetic layer (e.g., which can be the same as final magnetic layer 1111 in core 11) in the core 1611 and the first magnetic flux closure layer 1620 in a direction that is parallel to the hard axis of magnetization of the first magnetic layer in the core 1611 and in a direction that is parallel to the hard axis of magnetization of the first magnetic flux closure layer 1620. In addition or in the alternative, a second magnetic flux path 1632 passes through a second magnetic layer (e.g., which can be the same as first magnetic layer 1112 in core 11) in the core 1611 and the second magnetic flux closure layer 1622 in a direction that is parallel to the hard axis of magnetization of the second magnetic layer in the core 1611 and in a direction that is parallel to the hard axis of magnetization of the second magnetic flux closure layer 1622.

The combined thickness of the first and second magnetic flux closure layers 1620, 1622 can be less than the total thickness of the core 1611 to control the magnetic permeability of the core 1611 by engineering the combination of process-induced anisotropy and shape-induced anisotropy thereby promoting flux closure. In addition, the thickness of each magnetic flux closure layer 1620, 1622 can be equal to, approximately equal to, or less than the thickness of one or more or all of the magnetic layers in the core 1611 to achieve similar eddy current losses at a given frequency even with higher magnetic permeability. Each of the foregoing thicknesses is measured with respect to the "z" axis or with respect to a respective reference axis that is parallel to the "z" axis. The "z" axis and the respective reference axes are orthogonal to the principal plane 1670 of the core 1611.

At least one of the dimensions of the in the "x" and/or "y" directions (e.g., the length and/or width, respectively) of each magnetic flux closure layer 1620, 1622 can be greater than the corresponding dimension(s) of the core 1611. For example, in FIG. 16 the length of each magnetic flux closure layer 1620, 1622 along the "x" dimension is greater than the length of the core 1611 along the "x" dimension. In other embodiments, the width of each magnetic flux closure layer 1620, 1622 along the "y" dimension is greater than the width of the core 1611 along the "y" dimension. In yet other embodiments, the length and width of each magnetic flux closure layer 1620, 1622 are greater than the length and width of the core 1611. In other embodiments, the length of the first magnetic flux closure layer 1620 is greater than the length of the core 1611 and the width of the second magnetic flux closure layer 1622 is greater than the width of the core 1611. In yet other embodiments, the width of the first magnetic flux closure layer 1620 is greater than the width of the core 1611 and the length of the second magnetic flux closure layer 1622 is greater than the length of the core 1611. In other embodiments, the length and/or width of the first magnetic flux closure layer 1620 is greater than the length and/or width of the core 1611 and the length and width of the second magnetic flux closure layer 1622 is less than or equal to the length and/or width of the core 1611. In yet other embodiments, the length and/or width of the second magnetic flux closure layer 1622 is greater than the length and/or width of the core 1611 and the length and width of the first magnetic flux closure layer 1620 is less than or equal to the length and/or width of the core 1611.

It is noted that although FIGS. 16 and 17 illustrate two magnetic flux closure layers 1620, 1622, in other embodiments only one magnetic flux closure layer 1620 or 1622 is present. In such embodiments, only magnetic flux closure layer 1620 or 1622 is magnetically coupled to the inductor 1600. In one example, when only the first magnetic flux closure layer 1620 is present, the first magnetic flux closure layer 1620 is disposed within about 100 µm from the first side 1650 of the core 1611, the first side 1650 of the core 1611 being further away from the substrate (e.g., semiconductor substrate 220) than the second side 1660 of the core 1611. In another example, when only the second magnetic flux closure layer 1622 is present, the second magnetic flux closure layer 1622 is disposed within about 100 μm from the second side 1660 of the core 1611, the second side 1660 of the core 1611 being closer to the substrate (e.g., semiconductor substrate 220) than the first side 1650 of the core 1611.

FIG. 18 illustrates a flow chart 18000 for a method of manufacturing an inductor according to an embodiment of the disclosure. In step 18001, a magnetic material is deposited over a semiconductor substrate (e.g., on an insulating layer) that includes at least a portion of a multilevel wiring network to form a magnetic layer (e.g., a first magnetic layer). The insulating layer can be disposed on one of the wiring planes of at least a portion of a multilevel wiring network, such as multilevel wiring network 240.

The magnetic material includes a ferromagnetic alloy, such as the ferromagnetic alloy described above with respect to magnetic layers 710-712, that has a composition of about 10 atomic percent to about 90 atomic percent iron. The magnetic material can also include at least one additional ferromagnetic material that does not include iron, such as cobalt and/or nickel. In addition or in the alternative, the magnetic material can also include boron, tantalum, chromium, cobalt, titanium, zirconium, or a combination of two or more of the foregoing. The magnetic material can be anisotropic, and/or can be induced to be permanently and/or semi-permanently anisotropic, such that its hard axis of magnetization is at least partially aligned with an axis of the conductive winding, the conductive winding extending along the axis.

In step 18010, a non-magnetic layer is deposited on the magnetic layer formed in step 18001. In some embodiments, step 18010 is performed according to flow chart 80A. In other embodiments, the non-magnetic layer comprises a current-rectifying layer, as described herein. The current-rectifying layer can comprise a p-type semiconductor having a first work function less than a second work function of the magnetic material and/or an n-type semiconductor, the n-type semiconductor having a first work function greater than a second work function of the magnetic material In step 18020, steps 18001 and 18010 are repeated up to 100 times each to form an alternating sequence of magnetic layers (formed in step 18001) and non-magnetic layers (formed in step 18010).

After step 18020 is complete, the flow chart 80B proceeds to step 18030 where a magnetic material is deposited on the last non-magnetic layer in the alternating sequence of magnetic layers and non-magnetic layers to form a final magnetic layer. The magnetic material that forms the final magnetic layer in step 18030 can be the same magnetic material that forms the magnetic layer in step 18001. The resulting structure following step 18030 is a magnetic member with a laminated configuration.

In some embodiments, the magnetic material deposited in steps 18001 (including repeating step 18001 in step 18020) and/or in step 18030 is deposited in the presence of an external or bias magnetic field of about 20 Oe to about 20,000 Oe to induce magnetic anisotropy in the corresponding magnetic layer, as described herein. The external magnetic field can induce an easy axis of magnetization in parallel with the external magnetic field as it passes through the substrate and a hard axis of magnetization that is orthogonal to the easy axis of magnetization. In addition, the external magnetic field can be configured so that the hard axis of magnetization is induced to be at least partially aligned with the axis of the conductive winding (formed in step 18050).

In some embodiments, the external or bias magnetic field can be generated by a permanent magnetic film that is disposed underneath the substrate. For example, the permanent magnetic film can be disposed on a wafer chuck in the magnetic film deposition chamber (e.g., in a PVD or CVD chamber) and the wafer/substrate can be placed on the permanent magnetic film. The permanent magnetic film can directly contact the underside of the wafer/substrate or a surface of the permanent magnetic film can be separated by about 1 mm to about 5 mm from a surface of the substrate/wafer.

In some embodiments, a permanent magnet can be positioned or placed proximal to the location where the substrate/wafer is deposited with magnetic material, such as proximal to the wafer chuck in the magnetic film deposition chamber. For example, a surface of the permanent magnet can be disposed about 1 mm to about 5 mm from a surface of the substrate/wafer when the substrate/wafer is disposed on the wafer chuck (or other location where the substrate/wafer is deposited with magnetic material). Alternatively, the substrate/wafer can be exposed to an external magnetic field (e.g., of about 20 Oe to about 20,000 Oe) after the magnetic member with a laminated configuration is formed (e.g., following step 18030 or any step thereafter).

While the substrate/wafer is exposed to the external magnetic field, the substrate/wafer is heated to about 200° C. to about 400° C. for at least 30 minutes. After the heating is complete, each magnetic layer in the magnetic member is induced to be permanently and/or semi-permanently anisotropic. For example, the hard axis of magnetization in each magnetic layer can be induced to be at least partially aligned with the axis of the conductive winding (formed in step 18050).

In step 18040, the magnetic member is masked and patterned to form a planar magnetic core. The masking and patterning can proceed as described herein and/or as known in the art. In step 18050, a conductive winding is formed around the planar magnetic core. The conductive winding can be piecewise constructed of wire segments and of VIAs as described herein.

In optional step 18060, a non-magnetic material is deposited below the first magnetic layer (i.e., formed in step 18001 prior to the repeating step 18020) and/or on the final magnetic layer formed in step 18030. The non-magnetic material includes tantalum, aluminum, chromium, cobalt, titanium, zirconium, and/or a semiconductor material such as silicon. When the metal layer is deposited below the first magnetic layer, an adhesion layer, such as adhesion layer 740, is formed on the first magnetic layer. When the metal layer is deposited on the final magnetic layer, a capping layer, such as capping layer 730, is formed on the final magnetic layer.

FIGS. 19 and 20 illustrate a flow chart 19000 for a method of manufacturing an inductor according to an embodiment of the disclosure. In step 19001, a magnetic material is deposited over a semiconductor substrate (e.g., on an insulating layer) that includes at least a portion of a multilevel wiring network to form a magnetic layer (e.g., a first magnetic layer). The insulating layer can be disposed on one of the wiring planes of at least a portion of a multilevel wiring network, such as multilevel wiring network 240.

The magnetic material can include any of the magnetic materials described herein. In one example, the magnetic material includes a ferromagnetic alloy, such as the ferromagnetic alloy described above with respect to magnetic layers 710-712, that has a composition of about 10 atomic percent to about 90 atomic percent iron. In another example, the magnetic material can also include at least one additional ferromagnetic material that does not include iron, such as cobalt and/or nickel. In addition or in the alternative, the magnetic material can also include boron, tantalum, chromium, cobalt, titanium, zirconium, or a combination of two or more of the foregoing. The magnetic material can be anisotropic, and/or can be induced to be permanently and/or semi-permanently anisotropic, such that its hard axis of magnetization is at least partially aligned with an axis of the conductive winding, the conductive winding extending along the axis. The magnetic material can be deposited to have a thickness of about 100 angstroms to about 10,000 angstroms. In some embodiments, the magnetic material is deposited to form a magnetic layer that is the same as or similar to magnetic layer 1110.

In step 19010, a non-magnetic layer is deposited on the magnetic layer formed in step 19001. In some embodiments, step 19010 is performed according to flow chart 80A. In other embodiments, the non-magnetic layer comprises an insulating material and/or a current-rectifying layer, as described herein. The non-magnetic layer can be deposited to have a thickness of about 10 angstroms to about 2,000 angstroms. In some embodiments, the non-magnetic layer is the same as or similar to non-magnetic layer 1120.

In step 19020, steps 19001 and 19010 are repeated up to 100 times each to form an alternating sequence of magnetic layers (formed in step 19001) and non-magnetic layers (formed in step 19010).

After step 19020 is complete, the flow chart 80B proceeds to step 19030 where a magnetic material is deposited on the last non-magnetic layer in the alternating sequence of magnetic layers and non-magnetic layers to form a final magnetic layer. The magnetic material that forms the final magnetic layer in step 19030 can be the same magnetic material and/or the same thickness of magnetic material that forms the magnetic layer in step 19001. The resulting structure following step 19030 is a magnetic member with a laminated configuration.

In some embodiments, the first and final magnetic layers can have a first thickness and the other magnetic layers in the alternating sequence can have a second thickness, the first thickness being one half of the second thickness, for example as illustrated in FIG. 13.

In some embodiments, the magnetic material deposited in steps 19001 (including repeating step 19001 in step 19020) and/or in step 19030 is deposited in the presence of an external or bias magnetic field of about 20 Oe to about 20,000 Oe to induce magnetic anisotropy in the corresponding magnetic layer, as described herein (e.g., as described above in flow chart 18000).

In step 19040, the magnetic member is masked and patterned to form a planar magnetic core. The masking and patterning can proceed as described herein and/or as known in the art.

In step 19050, a conductive winding is formed around the planar magnetic core. The conductive winding can be piecewise constructed of wire segments and of VIAs as described herein.

In optional step 19060, a non-magnetic material is deposited below the first magnetic layer (i.e., formed in step 19001 prior to the repeating step 19020) and/or on the final magnetic layer formed in 19030. The non-magnetic material includes tantalum, aluminum, chromium, cobalt, titanium, zirconium, and/or a semiconductor material such as silicon. When the metal layer is deposited below the first magnetic layer, an adhesion layer, such as adhesion layer 740, is formed on the first magnetic layer. When the metal layer is deposited on the final magnetic layer, a capping layer, such as capping layer 730, is formed on the final magnetic layer.

The planar magnetic core that is formed from the method illustrated in flow chart 1900, which can include optional step 19060, can be the same as or similar to planar magnetic core 11 illustrated in FIGS. 11-13.

In step 20000, a closed magnetic flux path is formed through neighboring magnetic layers (e.g., through first and second magnetic layers). The magnetic flux path can extend parallel to the easy axes of magnetization in the neighboring magnetic layers. Additional details of the closed magnetic flux path are described herein, for example with respect to FIGS. 11-15.

In step 20010, at least one orthogonal non-magnetic layer is disposed laterally from the planar magnetic core, and in step 20020 a hole is defined in each (or the) orthogonal non-magnetic layer to define first and second portions of each (or the) orthogonal non-magnetic layer. In step 20030, a respective orthogonal magnetic layer is deposited in the hole defined in the orthogonal non-magnetic layer(s).

In step 20040, a closed magnetic flux path is formed and extends through neighboring magnetic layers in the planar magnetic core and through the orthogonal magnetic layer(s). The magnetic flux path is parallel to the easy axis of magnetization of each magnetic layer (neighboring magnetic layers, such as first and second magnetic layers, in the planar magnetic core, and the orthogonal magnetic layer(s)).

Additional details of steps 20000-20040 and the structures formed therefrom illustrated in and described above with respect to FIGS. 14 and 15.

FIG. 21 illustrates a flow chart 21000 for a method of manufacturing an inductor according to an embodiment of the disclosure. In step 21010, an inductor is formed according to any of the flowcharts corresponding to FIG. 8B, FIG. 18, and/or FIGS. 19-20. In step 21020, a first magnetic flux closure layer is formed within about 100 microns of a first face of the planar magnetic core (i.e., the planar magnetic core formed according to the corresponding flowchart in FIG. 8B, FIG. 18, and/or FIGS. 19-20). The face of the planar magnetic core is parallel to the principal plane of the planar magnetic core. The first magnetic flux closure layer is at least as long and/or at least as wide as the planar magnetic core. The length and width are measured with respect to corresponding axes that are parallel to the principal plane of the planar magnetic core.

In some embodiments, a second magnetic flux closure layer is formed within about 100 microns of a second face of the planar magnetic core. The first and second faces of the planar magnetic core are on opposing faces of the planar magnetic core, and they are parallel to the principal plane of the planar magnetic core.

The conductive winding can be disposed between the planar magnetic core and the first magnetic flux closure layer. The conductive winding can also be disposed between the planar magnetic core and the second magnetic flux closure layer.

Additional details of the magnetic flux closure layers are illustrated in and described above with respect to FIGS. 16 and 17.

Various inventive aspects of the technology are described below.

An aspect of the invention is directed to a structure comprising: a semiconductor integrated circuit comprising a multilevel wiring network disposed on a substrate; an inductor integrated into said multilevel wiring network, said inductor comprising a planar laminated magnetic core and a conductive winding that turns around in a generally spiral manner on the outside of said planar laminated magnetic core, said planar laminated magnetic core comprising an alternating sequence of a magnetic layer and a non-magnetic layer; and a magnetic flux closure layer disposed within about 100 µm of a face of the planar laminated magnetic core, the face of the planar magnetic core parallel to a principal plane of the planar laminated magnetic core.

In one or more embodiments, the conductive winding is disposed between the planar laminated magnetic core and the magnetic flux closure layer. In one or more embodiments, the magnetic flux closure layer extends across a length and a width of the face of the planar laminated magnetic core, the length and the width measured with respect to the principal plane of the planar laminated magnetic core. In one or more embodiments, the magnetic flux closure layer extends beyond the length and the width of the face of the planar laminated magnetic core. In one or more embodiments, the face of the planar laminated magnetic core is further away from the substrate than an opposing face of the planar laminated magnetic core. In one or more embodiments, the face of the planar laminated magnetic core is closer to the substrate than an opposing face of the planar laminated magnetic core.

In one or more embodiments, the face of the planar laminated magnetic core is closer to the substrate than the opposing face of the planar laminated magnetic core; and wire segments in at least one wiring plane in the multilevel wiring network are disposed between the inductor and the substrate; the magnetic flux closure layer is disposed between the inductor and the wire segments in the at least one wiring plane. In one or more embodiments, the magnetic flux closure layer provides a low magnetic reluctance path for an inductor magnetic flux. In one or more embodiments, the magnetic flux closure layer prevents the inductor magnetic flux from passing through any wire segments in the at least one wiring plane.

In one or more embodiments, a thickness of the magnetic flux closure layer is less than a total thickness of the planar laminated magnetic core, the thickness and the total thickness measured with respect to an axis that is orthogonal to the principal plane of the planar laminated magnetic core. In one or more embodiments, a first thickness of the magnetic flux closure layer is less than or equal to a second thickness of each magnetic layer, the first and second thicknesses measured with respect to an axis that is orthogonal to the principal plane of the planar laminated magnetic core. In one or more embodiments, the second thickness of each magnetic layer is the same. In one or more embodiments, the magnetic flux closure layer comprises the same material as the magnetic layers.

In one or more embodiments, the planar laminated magnetic core and the magnetic flux closure layer are configured so that a magnetic flux passes through a first magnetic layer in the planar laminated magnetic core in a first direction that is parallel to a first hard axis of magnetization of the first magnetic layer and the magnetic flux passes through the magnetic flux closure layer in a second direction that is parallel to a second hard axis of magnetization of the magnetic flux closure layer. In one or more embodiments, each magnetic layer in the planar laminated magnetic core comprises a first anisotropic magnetic material and the magnetic flux closure layer comprises a second anisotropic magnetic material, the first and second anisotropic magnetic materials having a respective hard axis of magnetization that is at least partially aligned with an axis of the conductive winding, the conductive winding extending along the axis of the conductive winding. In one or more embodiments, the first anisotropic magnetic material is the same as the second anisotropic magnetic material.

Another aspect of the invention is directed to a structure comprising: a semiconductor integrated circuit comprising a multilevel wiring network disposed on a substrate; an inductor integrated into said multilevel wiring network, said inductor comprising a planar laminated magnetic core and a conductive winding that turns around in a generally spiral manner on the outside of said planar laminated magnetic core, said planar laminated magnetic core comprising an alternating sequence of a magnetic layer and a non-magnetic layer; a first magnetic flux closure layer disposed within about 100 µm of a face of the planar laminated magnetic core; and a second magnetic flux closure layer disposed within about 100 µm of an opposing face of the planar laminated magnetic core, the face and the opposing face parallel to a principal plane of the planar laminated magnetic core.

In one or more embodiments, the conductive winding is disposed between the planar laminated magnetic core and each magnetic flux closure layer. In one or more embodiments, the first magnetic flux closure layer extends across a length and a width of the face of the planar laminated magnetic core and the second magnetic flux closure layer extends across a length and a width of the opposing face of the planar laminated magnetic core, the respective length and the width measured with respect to the principal plane of the planar laminated magnetic core. In one or more embodiments, the first magnetic flux closure layer extends beyond the length and the width of the face of the planar laminated magnetic core. In one or more embodiments, the second magnetic flux closure layer extends beyond the length and the width of the opposing face of the planar laminated magnetic core.

In one or more embodiments, the face of the planar laminated magnetic core is closer to the substrate than the opposing face of the planar laminated magnetic core; wire segments in at least one wiring plane in the multilevel wiring network are disposed between the inductor and the substrate; and the first magnetic flux closure layer is disposed between the inductor and the wire segments in the at least one wiring plane. In one or more embodiments, the first magnetic flux closure layer provides a low magnetic reluctance path for an inductor magnetic flux. In one or more embodiments, the first magnetic flux closure layer prevents the inductor magnetic flux from passing through any wire segments in the at least one wiring plane.

In one or more embodiments, the first and second magnetic flux closure layers comprise the same material as the magnetic layers In one or more embodiments, the planar laminated magnetic core and the first magnetic flux closure layer are configured so that a first magnetic flux passes through a first magnetic layer in the planar laminated magnetic core in a first direction that is parallel to a first hard axis of magnetization of the first magnetic layer and the first magnetic flux passes through the first magnetic flux closure layer in a second direction that is parallel to a second hard axis of magnetization of the first magnetic flux closure layer. In one or more embodiments, the planar laminated magnetic core and the second magnetic flux closure layer are configured so that a second magnetic flux passes through a second magnetic layer in the planar laminated magnetic core in a third direction that is parallel to a third easy axis of magnetization of the second magnetic layer and the second magnetic flux passes through the second magnetic flux closure layer in a fourth direction that is parallel to a fourth easy axis of magnetization of the second magnetic flux closure layer.

In one or more embodiments, each magnetic layer in the planar laminated magnetic core comprises a first anisotropic magnetic material, the first magnetic flux closure layer comprises a second anisotropic magnetic material, and the second magnetic flux closure layer comprises a third anisotropic magnetic material, the first, second, and third anisotropic magnetic materials having a respective hard axis of magnetization that is at least partially aligned with an axis of the conductive winding, the conductive winding extending along the axis of the conductive winding. In one or more embodiments, the first, second, and third anisotropic magnetic materials are the same.

Another aspect of the invention is directed to an inductor comprising a planar laminated magnetic core comprising an alternating sequence of (a) a magnetic layer having a thickness of about 100 angstroms to about 10,000 angstroms and (b) a non-magnetic layer having a thickness of about 10 angstroms to about 2,000 angstroms, the thicknesses of the magnetic and non-magnetic layers measured along an axis that is orthogonal to a principal plane of the planar magnetic core, wherein the planar laminated magnetic core is configured so that a magnetic flux passes through a first magnetic layer in a first direction that is parallel to a first easy axis of magnetization of the first magnetic layer and the magnetic flux passes through a second magnetic layer in a second direction that is parallel to a second easy axis of magnetization of the second magnetic layer, wherein the second magnetic layer is a neighboring magnetic layer of the first magnetic layer, and the first direction is opposite to the second direction, whereby the magnetic flux has a closed path that extends through the first and second magnetic layers parallel to the first and second easy axes of magnetization, respectively; and a conductive winding that turns around in a generally spiral manner on the outside of said planar laminated magnetic core.

In one or more embodiments, the non-magnetic layer comprises an electrically insulating material. In one or more embodiments, the inductor further comprises a final magnetic layer disposed on a final non-magnetic layer, the final non-magnetic layer in the alternating sequence; and a capping layer disposed on the final magnetic layer on a first side of the planar laminated magnetic core. In one or more embodiments, the capping layer comprises silicon, tantalum, aluminum, chromium, cobalt, titanium, zirconium, or a combination of two or more of the foregoing. In one or more embodiments, the inductor further comprises an adhesion layer disposed below a final magnetic layer on a second side of the planar laminated magnetic core, wherein the adhesion layer and the capping layer comprise the same material, and the first and second sides are on opposite sides of the planar laminated magnetic core. In one or more embodiments, the adhesion and capping layers comprise silicon, tantalum, aluminum, chromium, cobalt, titanium, zirconium, or a combination of two or more of the foregoing.

In one or more embodiments, the planar laminated magnetic core is further configured so that a second magnetic flux passes through the first magnetic layer in the first direction and through a third magnetic layer in a second direction that is parallel to a third easy axis of magnetization of the third magnetic layer, wherein the third magnetic layer is a second neighboring magnetic layer of the first magnetic layer such that the first magnetic layer is disposed between the second and third magnetic layers, whereby the second magnetic flux has a closed path that passes through the first and third magnetic layers parallel to the first and third easy axes of magnetization, respectively. In one or more embodiments, the inductor further comprises a final magnetic layer disposed on a last non-magnetic layer on a first side of the planar magnetic core, the last non-magnetic layer in the alternating sequence, wherein the alternating sequence includes a first magnetic layer on a second side of the planar magnetic core, and wherein the first and final magnetic layers have a first thickness and the other magnetic layers in the alternating sequence have a second thickness, the first thickness being one half of the second thickness.

In one or more embodiments, the magnetic layer comprises an anisotropic magnetic material having a hard axis of magnetization that is at least partially aligned with an axis of the conductive winding, the conductive winding extending along the axis.

Another aspect of the invention is directed to an inductor comprising: a planar laminated magnetic core comprising an alternating sequence of (a) a magnetic layer having a thickness of about 100 angstroms to about 10,000 angstroms and (b) a non-magnetic layer having a thickness of about 10 angstroms to about 2,000 angstroms, the thicknesses of the magnetic and non-magnetic layers measured along an axis that is orthogonal to a principal plane of the planar magnetic core, wherein the planar laminated magnetic core is configured so that a magnetic flux passes through a first magnetic layer in a first direction that is parallel to a first easy axis of magnetization of the first magnetic layer and the magnetic flux passes through a second magnetic layer in a second direction that is parallel to a second easy axis of magnetization of the second magnetic layer, wherein the second magnetic layer is a neighboring magnetic layer of the first magnetic layer, and the first direction is opposite to the second direction, whereby the magnetic flux has a closed path that extends through the first and second magnetic layers parallel to the first and second easy axes of magnetization, respectively; a first orthogonal magnetic layer disposed laterally from the planar magnetic core, the first orthogonal magnetic layer orthogonal to the principal plane; and a conductive winding that turns around in a generally spiral manner on the outside of said planar laminated magnetic core.

In one or more embodiments, the closed path of the magnetic flux extends through at least a portion of the first orthogonal magnetic layer. In one or more embodiments, the first orthogonal magnetic layer is disposed in a hole between first and second portions of a first orthogonal non-magnetic layer. In one or more embodiments, a height of the first orthogonal magnetic layer is approximately equal to a height of the planar magnetic core, the respective height measured with respect to the axis. In one or more embodiments, each magnetic layer in the planar laminated magnetic core comprises an anisotropic magnetic material having a hard axis of magnetization that is at least partially aligned with an axis of the conductive winding, the conductive winding extending along the axis of the conductive winding. In one or more embodiments, the hard axis of magnetization of the first magnetic layer is orthogonal to the easy axis of magnetization of the first magnetic layer.

In one or more embodiments, the inductor further comprises a second orthogonal magnetic layer disposed laterally from the planar magnetic core such that the planar magnetic core is disposed between the first and second orthogonal magnetic layers, the second orthogonal magnetic layer orthogonal to the principal plane. In one or more embodiments, the closed path of the magnetic flux extends through at least a portion of the first and second orthogonal magnetic layers. In one or more embodiments, the magnetic flux passes through the first orthogonal magnetic layer in a first orthogonal direction that is parallel to an easy axis of magnetization of the first orthogonal magnetic layer and the magnetic flux passes through the second orthogonal magnetic layer in a second orthogonal direction that is parallel to an easy axis of magnetization of the second orthogonal magnetic layer, the first orthogonal direction opposite to the second orthogonal direction.

In one or more embodiments, the first orthogonal magnetic layer is disposed in a hole between first and second portions of a first orthogonal non-magnetic layer and the second orthogonal magnetic layer is disposed in a hole between first and second portions of a second orthogonal non-magnetic layer. In one or more embodiments, a height of the first and second orthogonal magnetic layers is approximately equal to a height of the planar magnetic core, the respective height measured with respect to the axis. In one or more embodiments, each magnetic layer in the planar laminated magnetic core comprises an anisotropic magnetic material having a hard axis of magnetization that is at least partially aligned with an axis of the conductive winding, the conductive winding extending along the axis of the conductive winding.

Another aspect of the invention is directed to a structure comprising: a semiconductor integrated circuit comprising a multilevel wiring network; and an inductor integrated into said multilevel wiring network, said inductor comprising a planar laminated magnetic core and a conductive winding that turns around in a generally spiral manner on the outside of said planar laminated magnetic core, said planar laminated magnetic core comprising an alternating sequence of a magnetic layer and a non-magnetic layer, wherein the magnetic layer comprises a ferromagnetic alloy having an iron composition of about 10 atomic percent to about 90 atomic percent.

In one or more embodiments, the inductor core has a saturation magnetization of at least 1.5 T. In one or more embodiments, the inductor has a coercivity of less than or equal to 1.0 Oe. In one or more embodiments, the ferromagnetic alloy comprises CoFeB, CoFe, or a combination thereof. In one or more embodiments, the magnetic layer further comprises at least one additional ferromagnetic material that does not include iron. In one or more embodiments, the at least one additional ferromagnetic material includes cobalt, nickel, or a combination thereof.

In one or more embodiments, the magnetic layer further comprises boron, tantalum, chromium, cobalt, titanium, zirconium, or a combination of two or more of the foregoing. In one or more embodiments, the non-magnetic layer comprises an electrical insulator layer and a first interface layer, wherein the non-magnetic layer is disposed between a first magnetic layer and a second magnetic layer. In one or more embodiments, the interface layer comprises tantalum, aluminum, chromium, cobalt, titanium, zirconium, silicon, or a combination of two or more of the foregoing. In one or more embodiments, the electrical insulator comprises silicon dioxide ($SiO_2$), aluminum oxide ($Al_xO_y$), chromium oxide ($Cr_xO_y$), cobalt oxide ($Co_xO_y$), tantalum oxide ($Ta_xO_y$), titanium oxide ($Ti_xO_y$), silicon nitride ($Si_xN_y$), aluminum nitride ($Al_xN_y$), tantalum nitride ($Ta_xN_y$), or a combination of two or more of the foregoing. In one or more embodiments, the electrical insulator comprises an oxide of at least a portion of the material that forms the magnetic layer.

In one or more embodiments, the magnetic layer comprises an anisotropic magnetic material having a hard axis of magnetization that is at least partially aligned with an axis of the conductive winding, the conductive winding extending along the axis of the conductive winding.

Another aspect of the invention is directed to a microelectronic device comprising: a semiconductor integrated circuit, wherein said semiconductor integrated circuit comprises a multilevel wiring network, wherein said semiconductor integrated circuit operates with a plurality of DC supply voltages; and a DC to DC voltage converter which delivers at least one of said DC supply voltages for said semiconductor integrated circuit, said DC to DC voltage converter comprising an inductor, and wherein said inductor is integrated thereinto said multilevel wiring network, wherein said inductor comprises a planar magnetic core and a conductive winding, wherein said conductive winding turns around in generally spiral manner on the outside of said planar magnetic core, said planar magnetic core having a laminated configuration comprising at least one magnetic layer and at least one current rectifying layer, wherein the magnetic layer comprises a ferromagnetic alloy having an iron composition of about 10 atomic percent to about 90 atomic percent.

In one or more embodiments, the current rectifying layer comprises a p-type semiconductor, the p-type semiconductor having a first work function less than a second work function of the magnetic material. In one or more embodiments, the laminated configuration further comprises an interface metal layer disposed on said p-type semiconductor, the interface layer having a work function less than said first work function of said p-type semiconductor. In one or more embodiments, the microelectronic device further comprises a second magnetic layer disposed on said interface metal layer, the second magnetic layer comprising the ferromagnetic alloy.

In one or more embodiments, the current rectifying layer comprises a n-type semiconductor, the n-type semiconductor having a first work function greater than a second work function of the magnetic material. In one or more embodiments, the laminated configuration further comprises an interface metal layer disposed on said n-type semiconductor, the interface layer having a work function greater than said first work function of said n-type semiconductor. In one or more embodiments, the microelectronic device further comprises a second magnetic layer disposed on said interface metal layer, the second magnetic layer comprising the ferromagnetic alloy.

In one or more embodiments, the magnetic layer further comprises at least one additional ferromagnetic material that does not include iron. In one or more embodiments, the at least one additional ferromagnetic material includes cobalt, nickel, or a combination thereof. In one or more embodiments, the inductor and at least a portion of the semiconductor integrated circuit form a transformer. In one or more embodiments, the inductor and at least a portion of the semiconductor integrated circuit form a power converter. In one or more embodiments, the inductor and at least a portion of the semiconductor integrated circuit form a microprocessor.

In one or more embodiments, the magnetic layer comprises an anisotropic magnetic material having a hard axis of magnetization that is at least partially aligned with an axis of the conductive winding, the conductive winding extending along the axis of the conductive winding.

Another aspect of the invention is directed to an inductor comprising: a planar laminated magnetic core comprising an alternating sequence of a magnetic layer and a non-magnetic layer, wherein the non-magnetic layer comprises an insulating layer disposed between first and second interface layers;

and a conductive winding that turns around in a generally spiral manner on the outside of said planar laminated magnetic core.

In one or more embodiments, the first and second interface layers comprise a material and the insulating layer comprises a compound of (a) the material and (b) oxygen, nitrogen, or a combination thereof. In one or more embodiments, the insulating layer has a root mean squared roughness of less than or equal to 20 angstroms. In one or more embodiments, the first and second interface layers comprise a material that includes silicon, tantalum, aluminum, chromium, cobalt, titanium, zirconium, or a combination of two or more of the foregoing. In one or more embodiments, the insulating layer comprises a compound of the material and oxygen. In one or more embodiments, the insulating layer comprises a compound of the material and nitrogen. In one or more embodiments, the insulating layer comprises a compound of the material, oxygen, and nitrogen.

In one or more embodiments, the non-magnetic layer comprises (a) silicon, tantalum, aluminum, chromium, cobalt, titanium, or zirconium and (b) oxygen, and the first and second interface layers reduce a first root mean squared roughness and a second root mean squared roughness to less than or equal to 20 angstroms, the first root mean squared roughness at an interface between a first magnetic layer and the first interface layer, the second root mean squared roughness at an interface between a second magnetic layer and the second interface layer. In one or more embodiments, the non-magnetic layer comprises (a) silicon, tantalum, aluminum, chromium, cobalt, titanium, or zirconium and (b) nitrogen, and the first and second interface layers reduce a first root mean squared roughness and a second root mean squared roughness to less than or equal to 20 angstroms, the first root mean squared roughness at an interface between a first magnetic layer and the first interface layer, the second root mean squared roughness at an interface between a second magnetic layer and the second interface layer. In one or more embodiments, the non-magnetic layer comprises (a) silicon, tantalum, aluminum, chromium, cobalt, titanium, or zirconium and (b) oxygen and nitrogen, and the first and second interface layers reduce a first root mean squared roughness and a second root mean squared roughness to less than or equal to 20 angstroms, the first root mean squared roughness at an interface between a first magnetic layer and the first interface layer, the second root mean squared roughness at an interface between a second magnetic layer and the second interface layer.

In one or more embodiments, the first and second interface layers inhibit a diffusion of oxygen, nitrogen, or a combination thereof from the insulating layer into a neighboring magnetic layer. In one or more embodiments, the magnetic layer comprises an anisotropic magnetic material having a hard axis of magnetization that is at least partially aligned with an axis of the conductive winding, the conductive winding extending along the axis of the conductive winding.

In one or more embodiments, the inductor further comprises a final magnetic layer disposed on a last non-magnetic layer, the last non-magnetic layer in the alternating sequence; and a capping layer disposed on the final magnetic layer on a first side of the planar laminated magnetic core, wherein the capping layer and the first and second interface layers comprise the same material. In one or more embodiments, the inductor further comprises an adhesion layer disposed below a final magnetic layer on a second side of the planar laminated magnetic core, wherein the adhesion layer and the first and second interface layers comprise the same material, and the first and second sides are on opposite sides of the planar laminated magnetic core.

Another aspect of the invention is directed to a microelectronic device comprising: a semiconductor integrated circuit comprising a multilevel wiring network; and an inductor integrated into said multilevel wiring network, said inductor comprising a planar laminated magnetic core and a conductive winding that turns around in a generally spiral manner on the outside of said planar laminated magnetic core, said planar laminated magnetic core comprising an alternating sequence of a magnetic layer and a non-magnetic layer, wherein the non-magnetic layer comprises an insulating layer disposed between first and second interface layers.

In one or more embodiments, the inductor and at least a portion of the semiconductor integrated circuit form a transformer. In one or more embodiments, the inductor and at least a portion of the semiconductor integrated circuit form a power converter. In one or more embodiments, the inductor and at least a portion of the semiconductor integrated circuit form a microprocessor.

In one or more embodiments, the magnetic layer comprises an anisotropic magnetic material having a hard axis of magnetization that is at least partially aligned with an axis of the conductive winding, the conductive winding extending along the axis.

In one or more embodiments, the first and second interface layers comprise a material and the insulating layer comprises a compound of (a) the material and (b) oxygen, nitrogen, or a combination thereof. In one or more embodiments, the insulating layer has a root mean squared roughness of less than or equal to 20 angstroms. In one or more embodiments, the first and second interface layers comprise a material that includes silicon, tantalum, aluminum, chromium, cobalt, titanium, zirconium, or a combination of two or more of the foregoing. In one or more embodiments, the insulating layer comprises a compound of the material and oxygen. In one or more embodiments, the insulating layer comprises a compound of the material and nitrogen. In one or more embodiments, the insulating layer comprises a compound of the material, oxygen, and nitrogen.

In one or more embodiments, the non-magnetic layer comprises (a) silicon, tantalum, aluminum, chromium, cobalt, titanium, or zirconium and (b) oxygen, and the first and second interface layers reduce a first root mean squared roughness and a second root mean squared roughness to less than or equal to 20 angstroms, the first root mean squared roughness at an interface between a first magnetic layer and the first interface layer, the second root mean squared roughness at an interface between a second magnetic layer and the second interface layer. In one or more embodiments, the non-magnetic layer comprises (a) silicon, tantalum, aluminum, chromium, cobalt, titanium, or zirconium and (b) nitrogen, and the first and second interface layers reduce a first root mean squared roughness and a second root mean squared roughness to less than or equal to 20 angstroms, the first root mean squared roughness at an interface between a first magnetic layer and the first interface layer, the second root mean squared roughness at an interface between a second magnetic layer and the second interface layer. In one or more embodiments, the non-magnetic layer comprises (a) silicon, tantalum, aluminum, chromium, cobalt, titanium, or zirconium and (b) oxygen and nitrogen, and the first and second interface layers reduce a first root mean squared roughness and a second root mean squared roughness to less than or equal to 20 angstroms, the first root mean squared roughness at an interface between a first magnetic layer and the first interface layer, the second root mean squared roughness at an interface between a second magnetic layer and the second interface layer.

In one or more embodiments, the first and second interface layers inhibit a diffusion of oxygen, nitrogen, or a combination thereof from the insulating layer into a neighboring magnetic layer. In one or more embodiments, the microelectronic device further comprises a final magnetic layer disposed on a last non-magnetic layer, the last non-magnetic layer in the alternating sequence; and a capping layer disposed on the final magnetic layer on a first side of the planar laminated magnetic core, wherein the capping layer and the first and second interface layers comprise the same material. In one or more embodiments, the microelectronic device further comprises an adhesion layer disposed on a first magnetic layer on a second side of the planar laminated magnetic core, the second side of the planar magnetic core disposed closer to a semiconductor substrate in the semiconductor integrated circuit than the first side of the planar magnetic core, the adhesion layer and the interface layers comprising the same material.

Another aspect of the invention is directed to a method of manufacturing comprising: depositing a magnetic material over a semiconductor substrate to form a magnetic layer, wherein at least a portion of a multilevel wiring network is formed on the semiconductor substrate; in a physical vapor deposition (PVD) chamber, depositing a non-magnetic layer on the magnetic layer, wherein said non-magnetic layer is formed by: depositing an interface material to form a first interface layer on the magnetic layer; flowing a reactive gas into the PVD chamber, while continuing to deposit the interface material, to form an insulating material on the first interface layer, the insulating layer comprising a compound of the interface material and the reactive gas; and stopping the reactive gas flow into the PVD chamber, while continuing to deposit the interface material, to form a second interface layer on the insulating layer; repeating in alternate fashion, up to 100 times each, (a) the depositing of the magnetic material and (b) the depositing of the non-magnetic layer to form an alternating sequence of magnetic layers and non-magnetic layers; depositing the magnetic material on the last non-magnetic layer in the sequence to form a final magnetic layer, resulting in a magnetic member with a laminated configuration; masking and patterning said magnetic member in such a manner that after said patterning a remaining portion of said magnetic member comprises a planar magnetic core; and forming a conductive winding around the planar magnetic core, the conductive winding comprising wire segments and vertical interconnect accesses (VIAs), wherein said wire segments pertain to at least two wiring planes in said multilevel wiring network and said VIAs interconnect the at least two wiring planes.

In one or more embodiments, the interface layer comprises silicon, tantalum, aluminum, chromium, cobalt, titanium, zirconium, or a combination of at least two of the foregoing. In one or more embodiments, the reactive gas comprises oxygen, nitrogen, or a combination thereof.

In one or more embodiments, the method further comprises reducing a first root mean squared roughness and a second root mean squared roughness to less than or equal to 20 angstroms, the first root mean squared roughness at an interface between a first magnetic layer and the first interface layer, the second root mean squared roughness at an interface between a second magnetic layer and the second interface layer. In one or more embodiments, the method further comprises depositing the interface material on the final magnetic layer on a first side of the planar magnetic core to form a capping layer. In one or more embodiments, the method further comprises depositing the interface material on a first magnetic layer on a second side of the planar magnetic core to form an adhesion layer.

In one or more embodiments, the method further comprises integrating the inductor into the multilevel wiring network in a semiconductor integrated circuit. In one or more embodiments, the method further comprises forming a transformer that comprises the inductor and at least a portion of the semiconductor integrated circuit. In one or more embodiments, the method further comprises forming a power converter that comprises the inductor and at least a portion of the semiconductor integrated circuit. In one or more embodiments, the method further comprises forming a microprocessor that comprises the inductor and at least a portion of the semiconductor integrated circuit.

In one or more embodiments, the method further comprises exposing the substrate to an external magnetic field during the depositing of the magnetic material to form each magnetic layer; and inducing a magnetic anisotropy in each magnetic layer. In one or more embodiments, the method further comprises placing the substrate on a permanent magnetic film; and during the depositing of the magnetic material, generating the external magnetic field from the permanent magnetic film. In one or more embodiments, the method further comprises placing a permanent magnet proximal to a substrate deposition location in a magnetic material deposition chamber, the permanent magnet generating the external magnetic field; and disposing the substrate on the substrate deposition location; wherein a surface of the permanent magnet is disposed about 1 mm to about 5 mm from a surface of the substrate, whereby the external magnetic field is concentrated at the surface of the substrate. In one or more embodiments, the method further comprises inducing a hard axis of magnetization in each magnetic layer, the hard axis at least partially aligned with an axis of the conductive winding, the conductive winding extending along the axis of the conductive winding.

In one or more embodiments, the method further comprises after forming the magnetic member with the laminated configuration: exposing the substrate to an external magnetic field; during the exposing the substrate to the external magnetic field, heating the substrate to about 200° C. to about 400° C. for at least 30 minutes; and inducing a magnetic anisotropy in each magnetic layer in the magnetic member. In one or more embodiments, the method further comprises inducing a hard axis of magnetization in each magnetic layer, the hard axis at least partially aligned with an axis of the conductive winding, the conductive winding extending along the axis of the conductive winding.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "under," "upper," "side," "over," "underneath," "parallel," "perpendicular," "vertical," "lateral," etc., as used herein refer to relative location and orientation of various portions of the structures with respect to one another, and are not intended to suggest that any particular absolute orientation with respect to external objects is necessary or required.

The foregoing specification also describes processing steps. It is understood that the sequence of such steps may vary in different embodiments from the order that they were detailed in the foregoing specification. Consequently, the ordering of processing steps in the claims, unless specifically stated, for instance, by such adjectives as "before," "ensuing," "after," etc., do not imply or necessitate a fixed order of step sequence.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

What is claimed is:

1. A microelectronic device comprising:
    a semiconductor integrated circuit, wherein said semiconductor integrated circuit comprises a multilevel wiring network, wherein said semiconductor integrated circuit operates with a plurality of DC supply voltages; and
    a DC to DC voltage converter which delivers at least one of said DC supply voltages for said semiconductor integrated circuit, said DC to DC voltage converter comprising an inductor, and wherein said inductor is integrated thereinto said multilevel wiring network, wherein said inductor comprises a planar magnetic core and a conductive winding, wherein said conductive winding turns around in generally spiral manner on the outside of said planar magnetic core, said planar magnetic core having a laminated configuration comprising at least one magnetic layer and at least one current rectifying layer, wherein the at least one magnetic layer comprises a ferromagnetic alloy having an iron composition of about 10 atomic percent to about 90 atomic percent,
    wherein:
        the at least one current rectifying layer comprises a p-type semiconductor, the p-type semiconductor having a first work function less than a second work function of the ferromagnetic alloy, and
        the laminated configuration further comprises an interface metal layer disposed on said p-type semiconductor, the interface layer having a work function less than said first work function of said p-type semiconductor.

2. The microelectronic device of claim 1, further comprising a second magnetic layer disposed on said interface metal layer, the second magnetic layer comprising the ferromagnetic alloy.

3. The microelectronic device of claim 1, wherein the at least one current rectifying layer further comprises an n-type semiconductor, the n-type semiconductor having a first work function greater than the second work function of the ferromagnetic alloy.

4. The microelectronic device of claim 3, wherein the work function of the interface layer is greater than said first work function of said n-type semiconductor.

5. The microelectronic device of claim 4, further comprising a second magnetic layer disposed on said interface metal layer, the second magnetic layer comprising the ferromagnetic alloy.

6. The microelectronic device of claim 1, wherein the at least one magnetic layer further comprises at least one additional ferromagnetic material that does not include iron.

7. The microelectronic device of claim 6, wherein the at least one additional ferromagnetic material includes cobalt, nickel, or a combination thereof.

8. The microelectronic device of claim 1, wherein the inductor and at least a portion of the semiconductor integrated circuit form a transformer.

9. The microelectronic device of claim 1, wherein the inductor and at least a portion of the semiconductor integrated circuit form a power converter.

10. The microelectronic device of claim 1, wherein the inductor and at least a portion of the semiconductor integrated circuit form a microprocessor.

11. The microelectronic device of claim 1, wherein the at least one magnetic layer comprises an anisotropic magnetic material having a hard axis of magnetization that is at least partially aligned with an axis of the conductive winding, the conductive winding extending along the axis of the conductive winding.

12. A microelectronic device comprising:
    a semiconductor integrated circuit, wherein said semiconductor integrated circuit comprises a multilevel wiring network, wherein said semiconductor integrated circuit operates with a plurality of DC supply voltages; and
    a DC to DC voltage converter which delivers at least one of said DC supply voltages for said semiconductor integrated circuit, said DC to DC voltage converter comprising an inductor, and wherein said inductor is integrated thereinto said multilevel wiring network, wherein said inductor comprises a planar magnetic core and a conductive winding, wherein said conductive winding turns around in generally spiral manner on the outside of said planar magnetic core, said planar magnetic core having a laminated configuration comprising at least one magnetic layer and at least one current rectifying layer, wherein the at least one magnetic layer comprises a ferromagnetic alloy having an iron composition of about 10 atomic percent to about 90 atomic percent,
    wherein:
        the at least one current rectifying layer comprises an n-type semiconductor, the n-type semiconductor having a first work function greater than a second work function of the ferromagnetic alloy, and
        the laminated configuration further comprises an interface metal layer disposed on said n-type semiconductor, the interface layer having a work function greater than said first work function of said n-type semiconductor.

13. The microelectronic device of claim 12, wherein the at least one current rectifying layer further comprises a p-type semiconductor, the p-type semiconductor having a first work function less than a second work function of the ferromagnetic alloy.

14. The microelectronic device of claim 13, wherein the work function of the interface layer is less than said first work function of said p-type semiconductor.

15. The microelectronic device of claim 14, further comprising a second magnetic layer disposed on said interface metal layer, the second magnetic layer comprising the ferromagnetic alloy.

16. The microelectronic device of claim 12, further comprising a second magnetic layer disposed on said interface metal layer, the second magnetic layer comprising the ferromagnetic alloy.

17. The microelectronic device of claim 12, wherein the at least one magnetic layer further comprises at least one additional ferromagnetic material that does not include iron.

18. The microelectronic device of claim 17, wherein the at least one additional ferromagnetic material includes cobalt, nickel, or a combination thereof.

19. The microelectronic device of claim 12, wherein the inductor and at least a portion of the semiconductor integrated circuit form a transformer.

20. The microelectronic device of claim 12, wherein the inductor and at least a portion of the semiconductor integrated circuit form a power converter.

21. The microelectronic device of claim 12, wherein the inductor and at least a portion of the semiconductor integrated circuit form a microprocessor.

22. The microelectronic device of claim 12, wherein the at least one magnetic layer comprises an anisotropic magnetic material having a hard axis of magnetization that is at least partially aligned with an axis of the conductive winding, the conductive winding extending along the axis of the conductive winding.

* * * * *